(12) United States Patent
Wang et al.

(10) Patent No.: US 12,744,005 B2
(45) Date of Patent: Sep. 22, 2026

(54) ARRAY SUBSTRATE AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Siyu Wang, Beijing (CN); Yi Zhang, Beijing (CN); Qian Ma, Beijing (CN); Junxiu Dai, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 247 days.

(21) Appl. No.: 18/616,392

(22) Filed: Mar. 26, 2024

(65) Prior Publication Data

US 2024/0237405 A1 Jul. 11, 2024

Related U.S. Application Data

(63) Continuation of application No. 17/428,969, filed as application No. PCT/CN2020/121752 on Oct. 19, 2020, now Pat. No. 11,974,463.

(51) Int. Cl.
*H10K 59/121* (2023.01)
*G09G 3/3241* (2016.01)
(Continued)

(52) U.S. Cl.
CPC ....... *G09G 3/3241* (2013.01); *H10K 59/1213* (2023.02); *H10K 59/1216* (2023.02);
(Continued)

(58) Field of Classification Search
CPC ............... H10K 59/353; H10K 59/122; H10K 59/1213; H10K 59/351; H10K 59/1216; H10K 59/8051
See application file for complete search history.

(56) References Cited

U.S. PATENT DOCUMENTS 11,778,862 B2 * 10/2023 Miura ...................... G09G 3/20
2005/0116232 A1 6/2005 Kim et al.
(Continued)

FOREIGN PATENT DOCUMENTS

CN 1622716 A 6/2005
CN 102244090 A 11/2011
(Continued)

OTHER PUBLICATIONS

First Office Action in the Chinese Patent Application No. 202080002798.7, dated Mar. 5, 2025; English translation attached.
(Continued)

*Primary Examiner* — Nathan W Ha
(74) *Attorney, Agent, or Firm* — Intellectual Valley Law, P.C.

(57) ABSTRACT

An array substrate is provided. The array substrate includes a plurality of light emitting elements respectively in a plurality of subpixels; and a plurality of pixel driving circuits respectively in the plurality of subpixels configured to respectively drive the plurality of light emitting elements. Multiple pixel driving circuits of the plurality of pixel driving circuits are arranged along a first direction. A respective one of the pixel driving circuits includes a third transistor. A width, along the first direction, of a third anode of a third light emitting element in a respective third subpixel is no less than a distance, along the first direction, between two adjacent third transistors in two adjacent pixel driving circuits of the multiple pixel driving circuits.

19 Claims, 45 Drawing Sheets

(51) Int. Cl.

| | |
|---|---|
| ***H10K 59/122*** | (2023.01) |
| ***H10K 59/131*** | (2023.01) |
| ***H10K 59/35*** | (2023.01) |
| ***H10K 59/80*** | (2023.01) |

(52) U.S. Cl.

CPC ......... *H10K 59/122* (2023.02); *H10K 59/131* (2023.02); *H10K 59/351* (2023.02); *H10K 59/353* (2023.02); *H10K 59/8051* (2023.02); *H10K 59/80515* (2023.02)

(56) References Cited

U.S. PATENT DOCUMENTS

| | | | | |
|---|---|---|---|---|
| 2009/0091254 | A1 | 4/2009 | Jeong et al. | |
| 2012/0298983 | A1 | 11/2012 | Chang et al. | |
| 2014/0284570 | A1* | 9/2014 | Jinta | G09G 3/3233 257/40 |
| 2015/0206930 | A1 | 7/2015 | Liu | |
| 2016/0240592 | A1* | 8/2016 | Li | H10K 59/353 |
| 2017/0062755 | A1* | 3/2017 | Im | H10K 50/824 |
| 2017/0317156 | A1 | 11/2017 | Kim et al. | |
| 2018/0183008 | A1* | 6/2018 | Song | H10K 59/122 |
| 2018/0197932 | A1 | 7/2018 | Ho | |
| 2018/0261663 | A1 | 9/2018 | Li et al. | |
| 2018/0315801 | A1 | 11/2018 | Matsueda | |
| 2019/0206955 | A1 | 7/2019 | Paek et al. | |
| 2020/0119120 | A1 | 4/2020 | Feng et al. | |
| 2020/0211473 | A1 | 7/2020 | Kim et al. | |
| 2020/0212131 | A1 | 7/2020 | Kim et al. | |
| 2021/0151470 | A1 | 5/2021 | Cho et al. | |
| 2021/0265437 | A1 | 8/2021 | Son et al. | |
| 2021/0265456 | A1 | 8/2021 | Lee et al. | |
| 2021/0280652 | A1 | 9/2021 | Kim et al. | |
| 2021/0391403 | A1 | 12/2021 | Yang et al. | |
| 2022/0012453 | A1 | 1/2022 | Choi et al. | |
| 2022/0028963 | A1 | 1/2022 | Lee et al. | |
| 2022/0115480 | A1 | 4/2022 | Park et al. | |
| 2022/0157996 | A1 | 5/2022 | Hachiya et al. | |
| 2022/0190097 | A1 | 6/2022 | Sakai et al. | |
| 2022/0209020 | A1 | 6/2022 | Aoki et al. | |
| 2022/0301504 | A1 | 9/2022 | Wang et al. | |
| 2022/0367602 | A1 | 11/2022 | Li et al. | |
| 2023/0062563 | A1 | 3/2023 | Okabe et al. | |
| 2023/0081200 | A1 | 3/2023 | Nakanishi | |
| 2023/0109516 | A1 | 4/2023 | Saitoh et al. | |
| 2023/0247868 | A1 | 8/2023 | Yamanaka | |
| 2023/0255076 | A1* | 8/2023 | Okabe | H10K 59/131 257/40 |

FOREIGN PATENT DOCUMENTS

| | | | |
|---|---|---|---|
| CN | 103762223 | A | 4/2014 |
| CN | 104078001 | A | 10/2014 |
| CN | 108010944 | A | 5/2018 |
| CN | 108133952 | A | 6/2018 |
| CN | 108155213 | A | 6/2018 |
| CN | 108305888 | A | 7/2018 |
| CN | 108461529 | A | 8/2018 |
| CN | 108933155 | A | 12/2018 |
| CN | 110335564 | A | 10/2019 |
| CN | 110610684 | A | 12/2019 |
| CN | 111463255 | A | 7/2020 |
| CN | 111724736 | A | 9/2020 |
| WO | 2020111420 | A1 | 6/2020 |

OTHER PUBLICATIONS

Non-Final Office Action in the U.S. Appl. No. 17/428,631, dated Feb. 29, 2024.

International Search Report & Written Opinion mailed Jul. 19, 2021, regarding PCT/CN2020/121752.

Non-Final Office Action in the U.S. Appl. No. 17/428,969, dated Nov. 3, 2023.

Response to Non-Final Office Action in the U.S. Appl. No. 17/428,969, dated Dec. 26, 2023.

Notice of Allowance in the U.S. Appl. No. 17/428,969, dated Feb. 8, 2024.

* cited by examiner

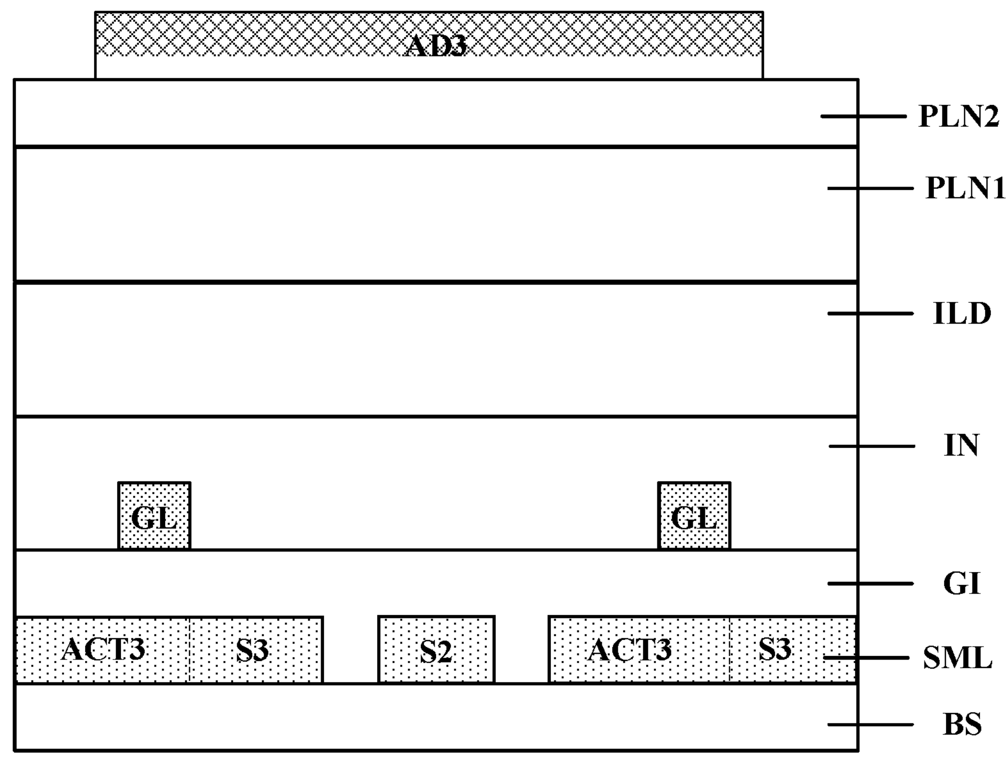
FIG. 8B
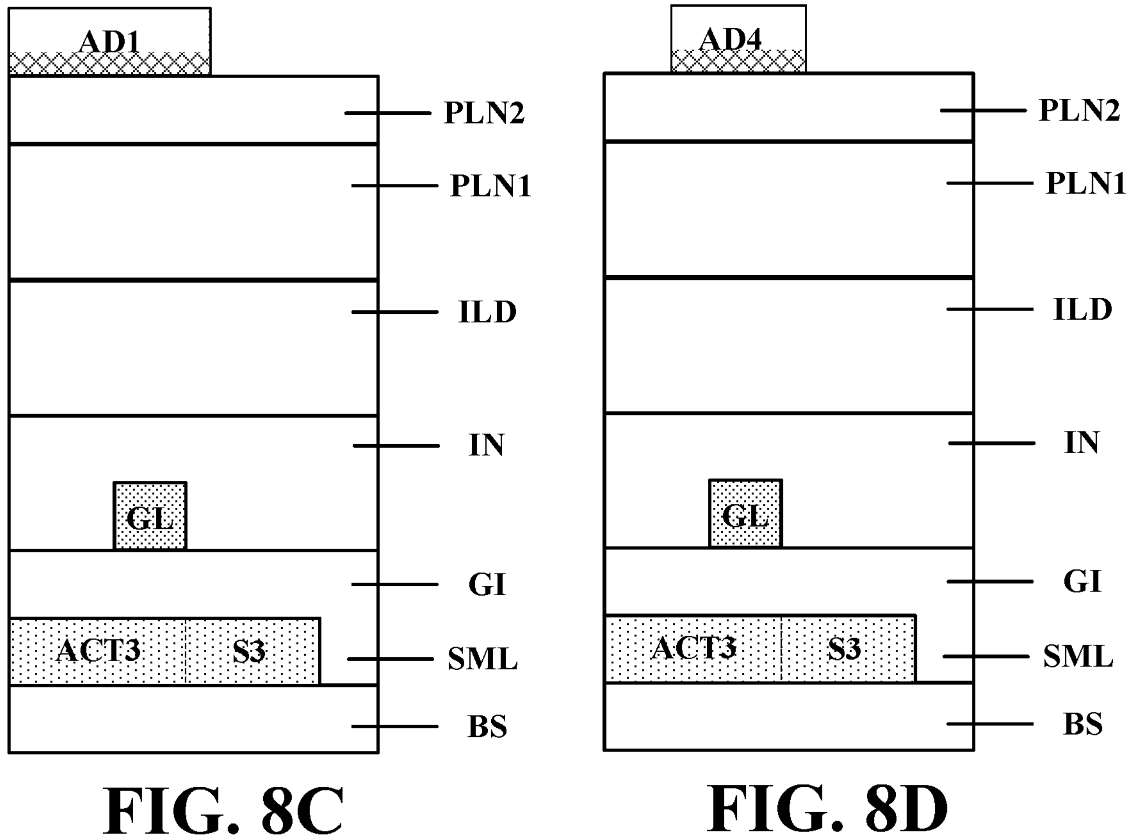
FIG. 8C
FIG. 8D

ARRAY SUBSTRATE AND DISPLAY APPARATUS

CROSS-REFERENCE TO RELATED APPLICATION

This application is a continuation of U.S. application Ser. No. 17/428,969, filed Oct. 19, 2020, which is a national stage application under 35 U.S.C. § 371 of International Application No. PCT/CN2020/121752, filed Oct. 19, 2020. Each of the forgoing applications is herein incorporated by reference in its entirety for all purposes.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of light emitting elements respectively in a plurality of subpixels; and a plurality of pixel driving circuits respectively in the plurality of subpixels configured to respectively drive the plurality of light emitting elements; wherein multiple pixel driving circuits of the plurality of pixel driving circuits are arranged along a first direction; a respective one of the pixel driving circuits comprises a third transistor; a width, along the first direction, of a third anode of a third light emitting element in a respective third subpixel is no less than a distance, along the first direction, between two adjacent third transistors in two adjacent pixel driving circuits of the multiple pixel driving circuits.

Optionally, the width, along the first direction of the third anode of the third light emitting element in the respective third subpixel is no less than a minimum distance, along the first direction, between gate electrodes of the two adjacent third transistors in the two adjacent pixel driving circuits.

Optionally, a width, along the first direction, of a first anode of a first light emitting element in a respective first subpixel is less than the distance, along the first direction, between the two adjacent third transistors in the two adjacent pixel driving circuits; and a width, along the first direction, of a second anode of a second light emitting element in a respective second subpixel is less than the distance, along the first direction, between the two adjacent third transistors in the two adjacent pixel driving circuits.

Optionally, the third anode comprises a main portion, a first protrusion portion, and a second protrusion portion; wherein the first protrusion portion and the second protrusion portion can be intersected by a virtual straight line extending along the first direction.

Optionally, the virtual straight line intersects a main portion of a first anode of a first light emitting element in a respective first subpixel, and intersects a protrusion portion of a fourth anode of a fourth light emitting element in a respective fourth subpixel.

Optionally, third transistors respectively in subpixels in a same row are controlled by a same gate line, and having gate electrodes of a substantially same shape; and an orthographic projection of the third anode of the third light emitting element in the respective third subpixel on a base substrate at least partially overlaps with orthographic projections of two third transistors respectively in two adjacent subpixels on the base substrate.

Optionally, the orthographic projection of the third anode on the base substrate at least partially overlaps with orthographic projections of active layers or gate electrodes of the two third transistors respectively in two adjacent subpixels on the base substrate.

Optionally, shortest distances between a subpixel aperture and edges of an anode other than an edge wherein the anode connects to an anode contact pad are non-uniform; and wherein a light emitting layer connects to the anode through the subpixel aperture extending through a pixel definition layer.

Optionally, the array substrate further comprises a first anode of a first light emitting element adjacent to the third anode in a first direction, the first anode comprising a main portion, and a protrusion portion protruding along the first direction from a side of the main portion toward one side away from an adjacent third anode in the first direction.

Optionally, a ratio of a dimension along the first direction of a portion of the first anode having the protrusion portion and a maximum dimension along the first direction of a portion of the first anode not having the protrusion portion and other than a portion wherein the first anode connects to an anode contact pad is in a range of 1.1 to 1.8.

Optionally, an orthographic projection of the protrusion portion on a base substrate at least partially overlap with an orthographic projection of a node connecting line on the base substrate, the node connecting line connected to a gate electrode of a driving transistor through a via.

Optionally, the array substrate further comprises a fourth anode of a fourth light emitting element adjacent to the third anode in a first direction, the fourth anode comprising a main portion, and a protrusion portion protruding along a second direction from a side of the main portion away from a portion wherein the fourth anode connects to an anode contact pad.

Optionally, a ratio of a dimension along the second direction of the protrusion portion and the maximum dimension along the second direction of the main portion other than the portion wherein the fourth anode connects to an anode contact pad is in a range of 0.2 to 0.9.

Optionally, an orthographic projection of the protrusion portion on a base substrate at least partially overlaps with an orthographic projection of a gate electrode of a third transistor on the base substrate.

Optionally, the third anode comprises a main portion, a first protrusion portion protruding along a first direction from a side of the main portion toward an adjacent fourth anode, and a second protrusion portion protruding along a first direction from a side of the main portion toward an adjacent first anode.

Optionally, a ratio of a dimension along the first direction of a portion of the third anode having the first protrusion portion or the second protrusion portion and a maximum dimension along the first direction of a portion of the third anode not having the first protrusion portion or the second protrusion portion, and other than a portion wherein the third anode connects to an anode contact pad is in a range of 1.2 to 1.8.

Optionally, the first protrusion portion and the second protrusion portion are on a same side of a gate line controlling a third transistor.

Optionally, an orthographic projection of the first protrusion portion on a base substrate at least partially overlap with an orthographic projection of a gate electrode of one third transistor of the two third transistors on the base substrate, and an orthographic projection of the second protrusion portion on the base substrate at least partially overlap with an orthographic projection of a gate electrode of the other third transistor of the two third transistors on the base substrate.

Optionally, the plurality of light emitting elements comprise a first light emitting element in a respective first subpixel, a second light emitting element in a respective second subpixel, a third light emitting element in a respective third subpixel, and a fourth light emitting element in a respective fourth subpixel; wherein a respective one of the plurality of pixel driving circuits comprises a plurality of transistors, and a storage capacitor comprising a first capacitor electrode, a second capacitor electrode electrically connected to a respective voltage supply line, and an insulating layer between the first capacitor electrode and the second capacitor electrode; wherein the array substrate comprises a base substrate; a semiconductor material layer on the base substrate; and a node connecting line in a same layer as the respective voltage supply line, connected to the first capacitor electrode through a first main via, and connected to the semiconductor material layer through a second main via; wherein an orthographic projection of a first anode of the first light emitting element in the respective first subpixel on the base substrate at least partially overlaps with an orthographic projection of a node connecting line in the respective first subpixel on the base substrate; an orthographic projection of a second anode of the second light emitting element in the respective second subpixel on the base substrate at least partially overlaps with an orthographic projection of the node connecting line in the respective second subpixel on the base substrate; an orthographic projection of a third anode of the third light emitting element in the respective third subpixel on the base substrate at least partially overlaps with an orthographic projection of the node connecting line in the respective third subpixel on the base substrate; and an orthographic projection of a fourth anode of the fourth light emitting element in the respective fourth subpixel on the base substrate at least partially overlaps with an orthographic projection of the node connecting line in the respective fourth subpixel on the base substrate.

Optionally, the plurality of transistors comprises a driving transistor; the orthographic projection of the first anode in the respective first subpixel on the base substrate covers an orthographic projection of a portion of the node connecting line at a position connecting to a first capacitor electrode in the respective first subpixel on the base substrate; the orthographic projection of the second anode in the respective second subpixel on the base substrate covers an orthographic projection of a portion of the node connecting line at a position connecting to a first capacitor electrode in the respective second subpixel on the base substrate; the orthographic projection of the third anode in the respective third subpixel on the base substrate covers an orthographic projection of a portion of the node connecting line at a position connecting to a first capacitor electrode in the respective third subpixel on the base substrate; and the orthographic projection of the fourth anode in the respective fourth subpixel on the base substrate covers an orthographic projection of a portion of the node connecting line at a position connecting to a first capacitor electrode in the respective fourth subpixel on the base substrate.

Optionally, the orthographic projection of the third anode on the base substrate at least partially overlaps with an orthographic projection of a third transistor in the respective third subpixel on the base substrate and at least partially overlaps with an orthographic projection of a third transistor in the respective fourth subpixel adjacent to the respective third subpixel on the base substrate.

Optionally, the orthographic projection of the third anode on the base substrate covers an orthographic projection of a source electrode of a third transistor in the respective third subpixel on the base substrate, partially overlaps with an orthographic projection of an active layer of the third transistor in the respective third subpixel on the base substrate, and partially overlaps with an orthographic projection of an active layer of the third transistor in the respective fourth subpixel on the base substrate.

Optionally, the orthographic projection of the first anode on the base substrate at least partially overlaps with an orthographic projection of a third transistor in the respective first subpixel on the base substrate.

Optionally, the orthographic projection of the first anode on the base substrate partially overlaps with an orthographic projection of a source electrode of the third transistor in the respective first subpixel on the base substrate, and partially overlaps with an orthographic projection of an active layer of the third transistor in the respective first subpixel on the base substrate.

In another aspect, the present disclosure provides a display apparatus, comprising the array substrate described herein or fabricated by a method described herein, and an integrated circuit connected to the array substrate.

BRIEF DESCRIPTION OF THE FIGURES

The following drawings are merely examples for illustrative purposes according to various disclosed embodiments and are not intended to limit the scope of the present invention.

FIG. 8B is a cross-sectional view along an E-E' line in FIG. 8A.

FIG. 8C is a cross-sectional view along an F-F' line in FIG. 8A.

FIG. 8D is a cross-sectional view along a G-G' line in FIG. 8A.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a base substrate; a pixel definition layer on the base substrate, the pixel definition layer defining subpixel apertures; a spacer layer on a side of the pixel definition layer away from the base substrate; and a plurality of light emitting elements respectively in a plurality of subpixels. Optionally, the plurality of light emitting elements include a first light emitting element in a respective first subpixel, a second light emitting element in a respective second subpixel, a third light emitting element in a respective third subpixel, and a fourth light emitting element in a respective fourth subpixel. Optionally, the spacer layer includes first spacers arranged in a first array and second spacers arranged in a second array; the first array and the second array interlace with each other. Optionally, a respective row of second spacers in the second array is between two respective rows of first spacers in the first array; a respective column of second spacers in the second array is between two respective columns of first spacers in the first array; a respective row of first spacers in the first array is between two respective rows of second spacers in the second array; a respective column of first spacers in the first array is between two respective columns of second spacers in the second array; a respective one of the first spacers is between a second anode of the second light emitting element and a third anode of the third light emitting element; and a respective one of the second spacers is between the third anode and a fourth anode of the fourth light emitting element.

Figure 1:
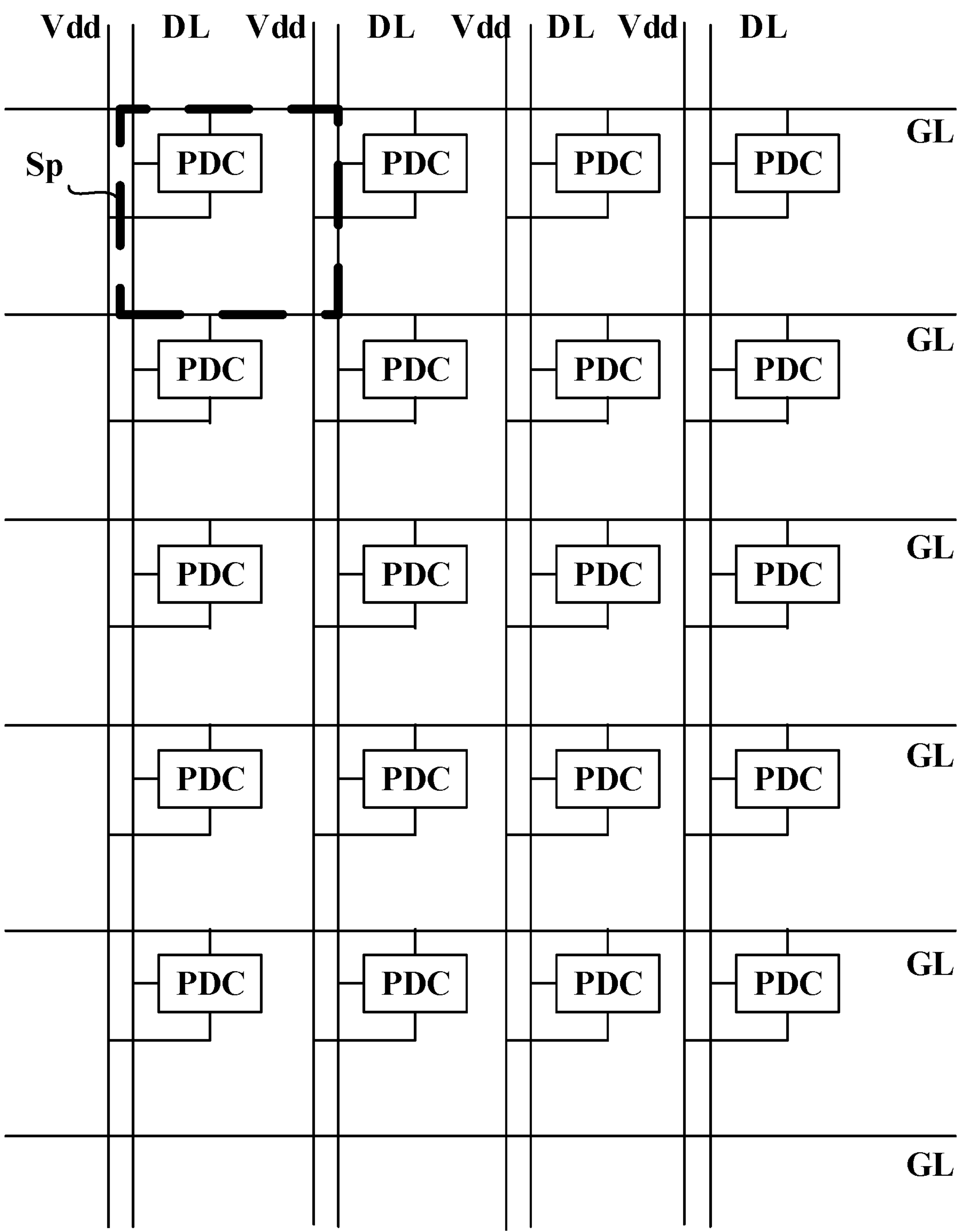
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a pixel driving circuit PDC. The array substrate includes a plurality of gate lines GL, a plurality of data lines DL, a plurality of voltage supply lines Vdd (e.g., high voltage supply lines), and a plurality of second voltage supply lines (e.g., low voltage supply lines $V_{SS}$). Light emission in a respective one of the subpixels Sp is driven by a pixel driving circuit PDC. In one example, a high voltage signal (e.g., a VDD signal) is input, through a respective one of the plurality of voltage supply lines Vdd, to the pixel driving circuit PDC connected to an anode of the light emitting element; a low voltage signal (e.g., a VSS signal) is input, through a respective one of the plurality of second voltage supply lines (e.g., a low voltage supply line Vss), to a cathode of the light emitting element. A voltage difference between the high voltage signal (e.g., the VDD signal) and the low voltage signal (e.g., the VSS signal) is a driving voltage ΔV that drives light emission in the light emitting element.

Various appropriate pixel driving circuits may be used in the present array substrate. Examples of appropriate driving circuits include 3T1C, 2T1C, 4T1C, 4T2C, 5T2C, 6T1C, 7T1C, 7T2C and 8T2C. In some embodiments, the respective one of the plurality of pixel driving circuits is a 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 2B:
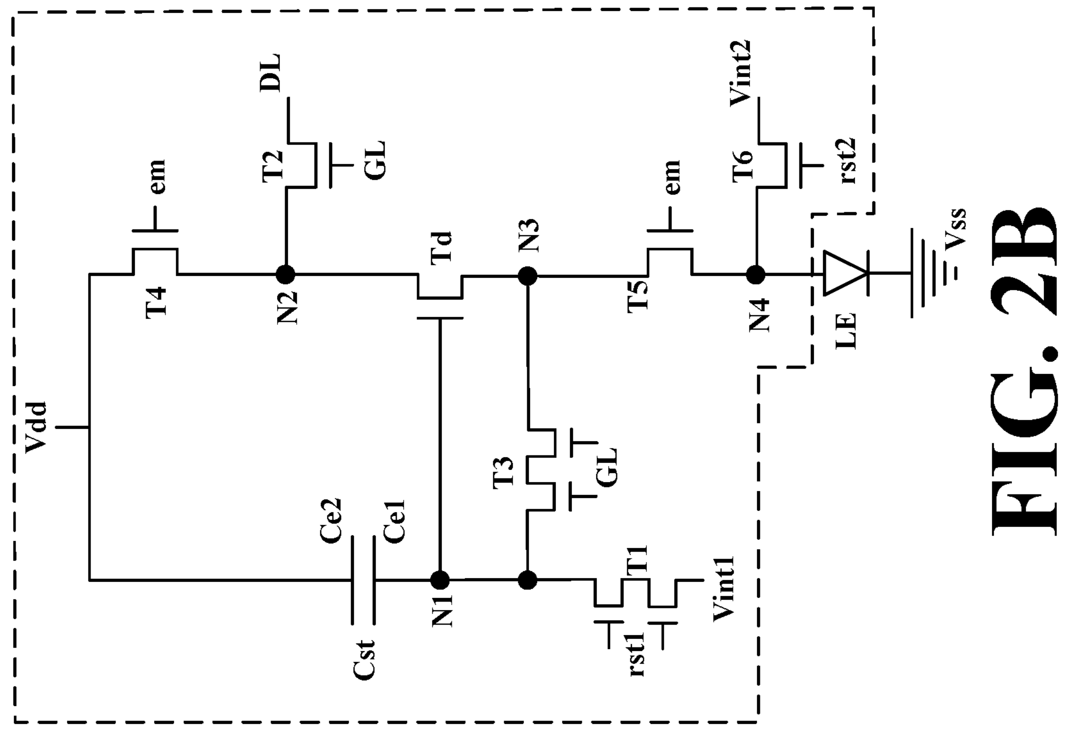
FIG. 2B is a circuit diagram illustrating the structure of a pixel driving circuit in some embodiments according to the present disclosure.
Figure 2A:
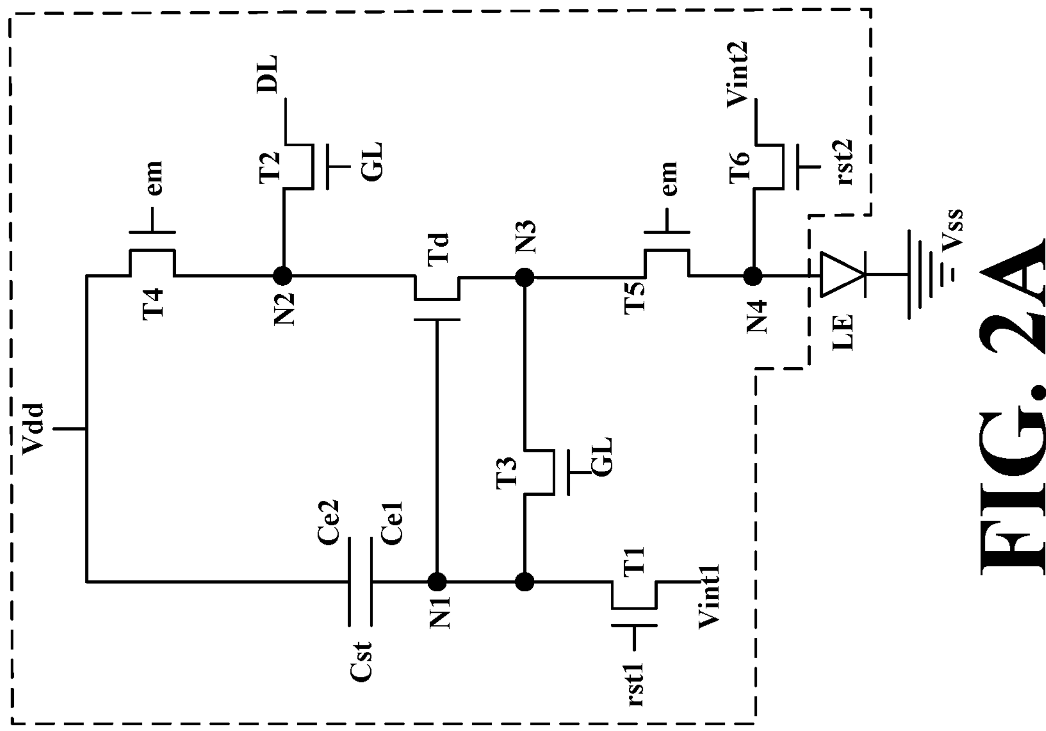
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2, in some embodiments, the pixel driving circuit includes a driving transistor Td; a storage capacitor Cst having a first capacitor electrode Ce1 and a second capacitor electrode Ce2; a first transistor T1 having a gate electrode connected to a respective one of the plurality of first reset control signal lines rst1, a source electrode connected to a respective one of the plurality of first reset signal lines Vint1, and a drain electrode connected to a first capacitor electrode Ce1 of the storage capacitor Cst and a gate electrode of the driving transistor Td; a second transistor T2 having a gate electrode connected to a gate line GL, a source electrode connected to the data line DL, and a drain electrode connected to a source electrode of the driving transistor Td; a third transistor T3 having a gate electrode connected to the gate line GL, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective one of the plurality of light emitting control signal lines em, a source electrode connected to the voltage supply line Vdd, and a drain electrode connected to the source electrode of the driving transistor Td and the drain electrode of the second transistor T2; a fifth transistor T5 having a gate electrode connected to the respective one of the plurality of light emitting control signal lines em, a source electrode connected to drain electrodes of the driving transistor Td and the third transistor T3, and a drain electrode connected to an anode of a light emitting element LE; and a sixth transistor T6 having a gate electrode connected to a respective one of the plurality of second reset control signal lines rst2, a source electrode connected to a respective one of the plurality of second reset signal lines Vint2, and a drain electrode connected to the drain electrode of the fifth transistor and the anode of the light emitting element LE. The second capacitor electrode Ce2 is connected to the voltage supply line Vdd and the source electrode of the fourth transistor T4.

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, and the source electrode of the fifth transistor T5.

The fourth node N4 is connected to the drain electrode of the fifth transistor T5, the drain electrode of the sixth transistor T6, and the anode of the light emitting element LE.

Figure 3A:
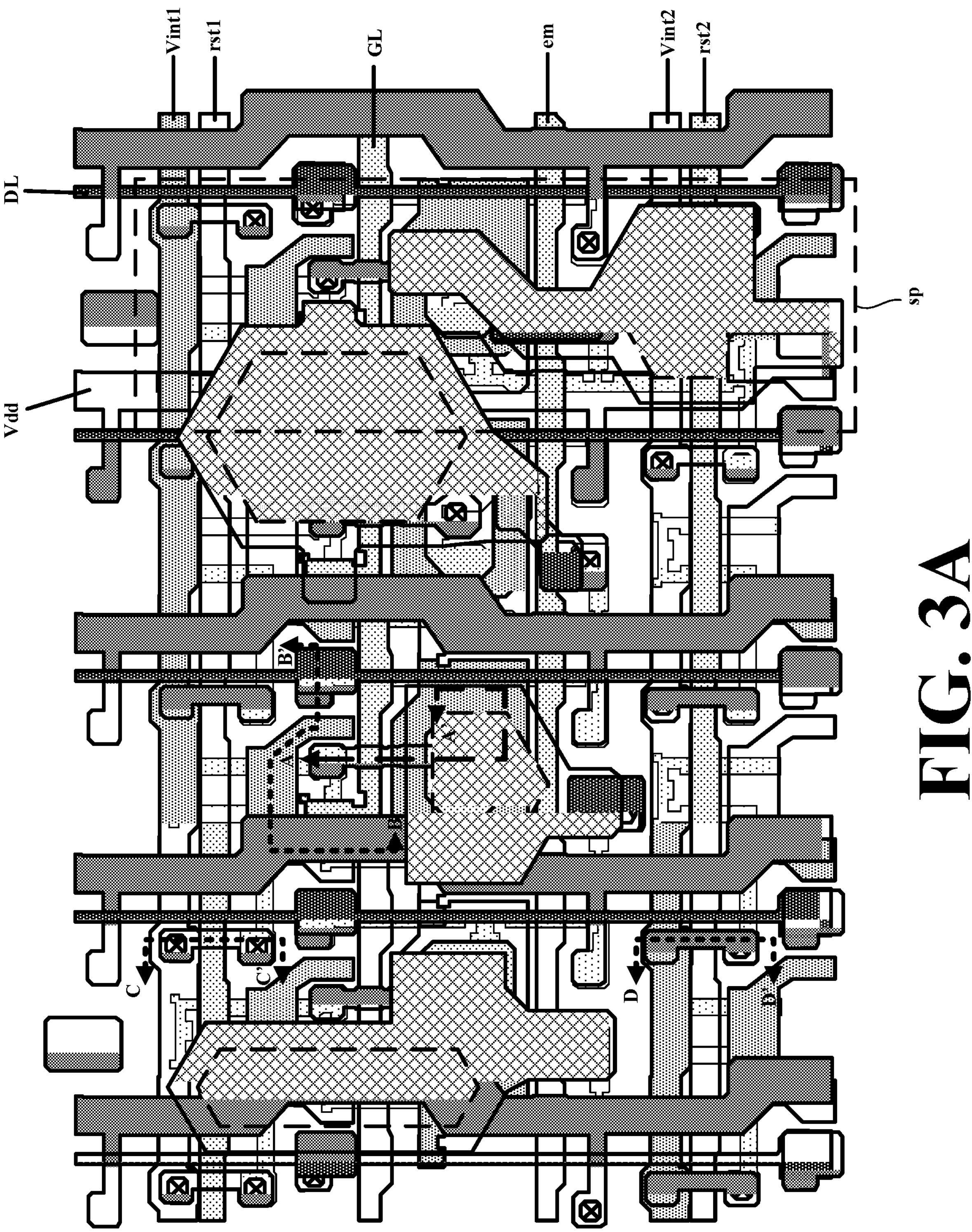
FIG. 3A is a diagram illustrating the structure of a plurality of subpixels of an array substrate in some embodiments according to the present disclosure.
Figure 3B:
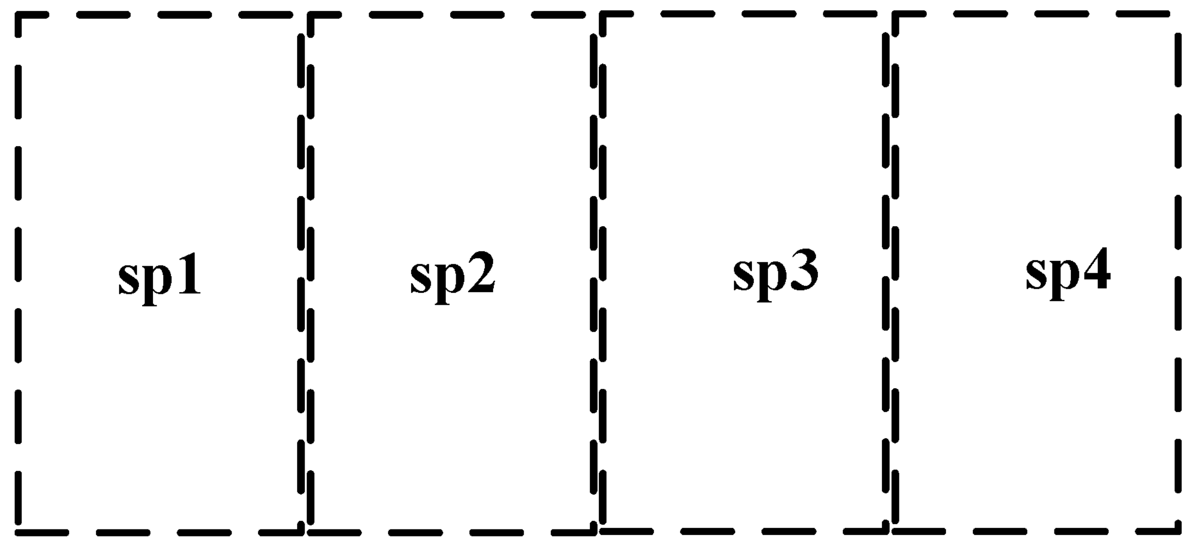
FIG. 3B is a schematic diagram illustrating a subpixel arrangement of a plurality of subpixels of an array substrate in an array substrate in some embodiments according to the present disclosure.

FIG. 3A is a diagram illustrating the structure of a plurality of subpixels of an array substrate in some embodiments according to the present disclosure. FIG. 3B is a schematic diagram illustrating a subpixel arrangement of a plurality of subpixels of an array substrate in an array substrate in some embodiments according to the present disclosure. Referring to FIG. 3A and FIG. 3B, the array substrate in some embodiments includes a plurality of subpixels. In some embodiments, the plurality of subpixels includes a respective first subpixel sp1, a respective second subpixel sp2, a respective third subpixel sp3, and a respective fourth subpixel sp4. Optionally, a respective pixel of the array substrate includes the respective first subpixel sp1, the respective second subpixel sp2, the respective third subpixel sp3, and the respective fourth subpixel sp4. The plurality of subpixels in the array substrate are arranged in an array. In one example, the array of the plurality of subpixels includes a S1-S2-S3-S4 format repeating array, in which S1 stands for the respective first subpixel sp1, S2 stands for the respective second subpixel sp2, S3 stands for the respective third subpixel sp3, and S4 stands for the respective fourth subpixel sp4. In another example, the S1-S2-S3-S4 format is a C1-C2-C3-C4 format, in which C1 stands for the respective first subpixel sp1 of a first color, C2 stands for the respective second subpixel sp2 of a second color, C3 stands for the respective third subpixel sp3 of a third color, and C4 stands for the respective fourth subpixel sp4 of a fourth color. In another example, the S1-S2-S3-S4 format is a C1-C2-C3-C2' format, in which C1 stands for the respective first subpixel sp1 of a first color, C2 stands for the respective second subpixel sp2 of a second color, C3 stands for the respective third subpixel sp3 of a third color, and C2' stands for the respective fourth subpixel sp4 of the second color. In another example, the C1-C2-C3-C2' format is a R-G-B-G format, in which the respective first subpixel sp1 is a red subpixel, the respective second subpixel sp2 is a green subpixel, the respective third subpixel sp3 is a blue subpixel, and the respective fourth subpixel sp4 is a green subpixel.

As depicted in FIG. 3A and FIG. 3B, in some embodiments, a minimum repeating unit of the plurality of subpixels of the array substrate includes the respective first subpixel sp1, the respective second subpixel sp2, the respective third subpixel sp3, and the respective fourth subpixel sp4. FIG. 3A shows a total of four subpixels of the plurality of subpixels sp arranged adjacent to each other. Each of the respective first subpixel sp1, the respective second subpixel sp2, the respective third subpixel sp3, and the respective fourth subpixel sp4, includes the first transistor T1, the second transistor T2, the third transistor T3, the fourth transistor T4, the fifth transistor T5, the sixth transistor T6, and the driving transistor Td.

Figure 3C:
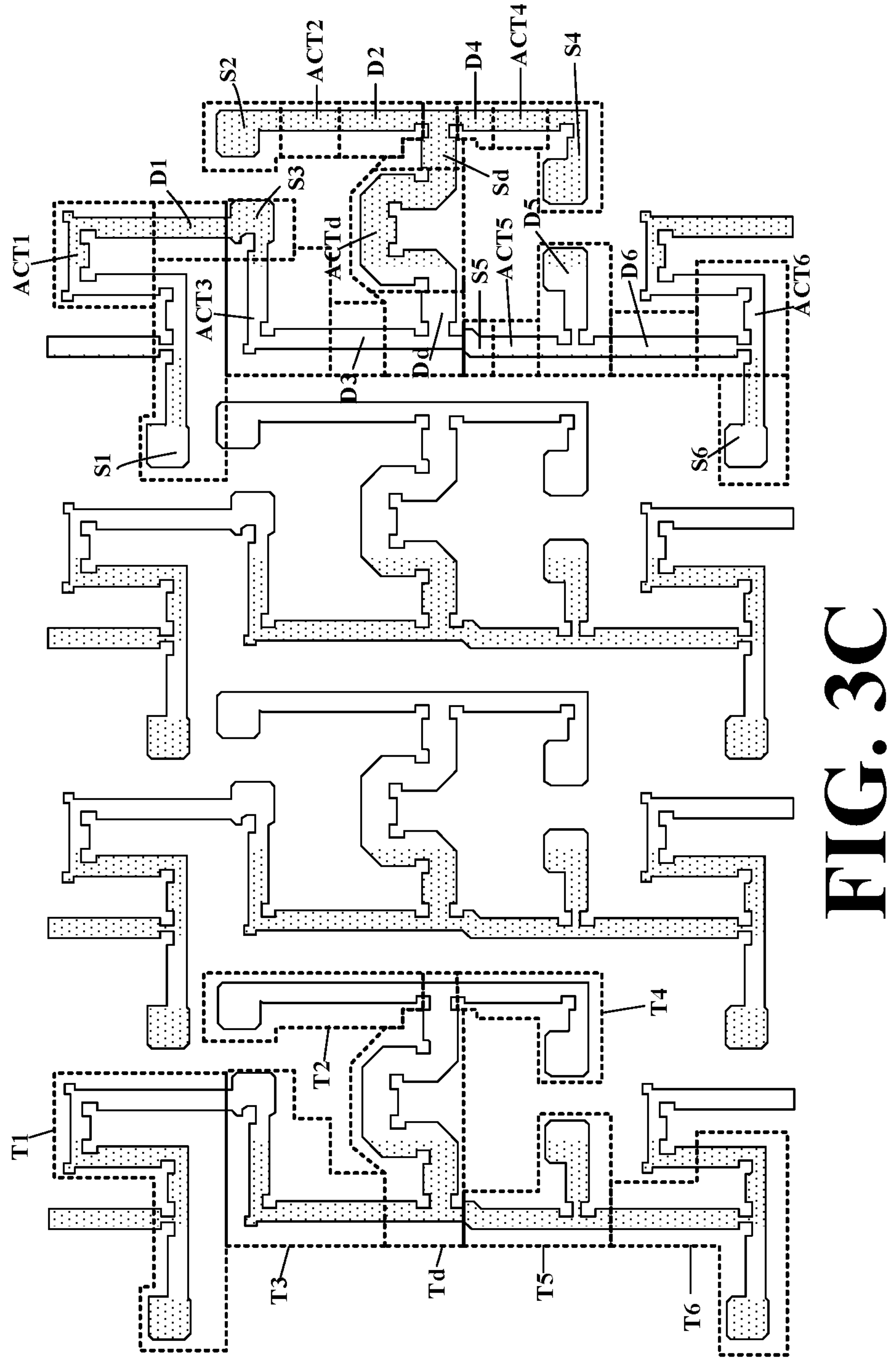
FIG. 3C is a diagram illustrating the structure of a semiconductor material layer in a plurality of subpixels of an array substrate depicted in FIG. 3A.
Figure 3D:
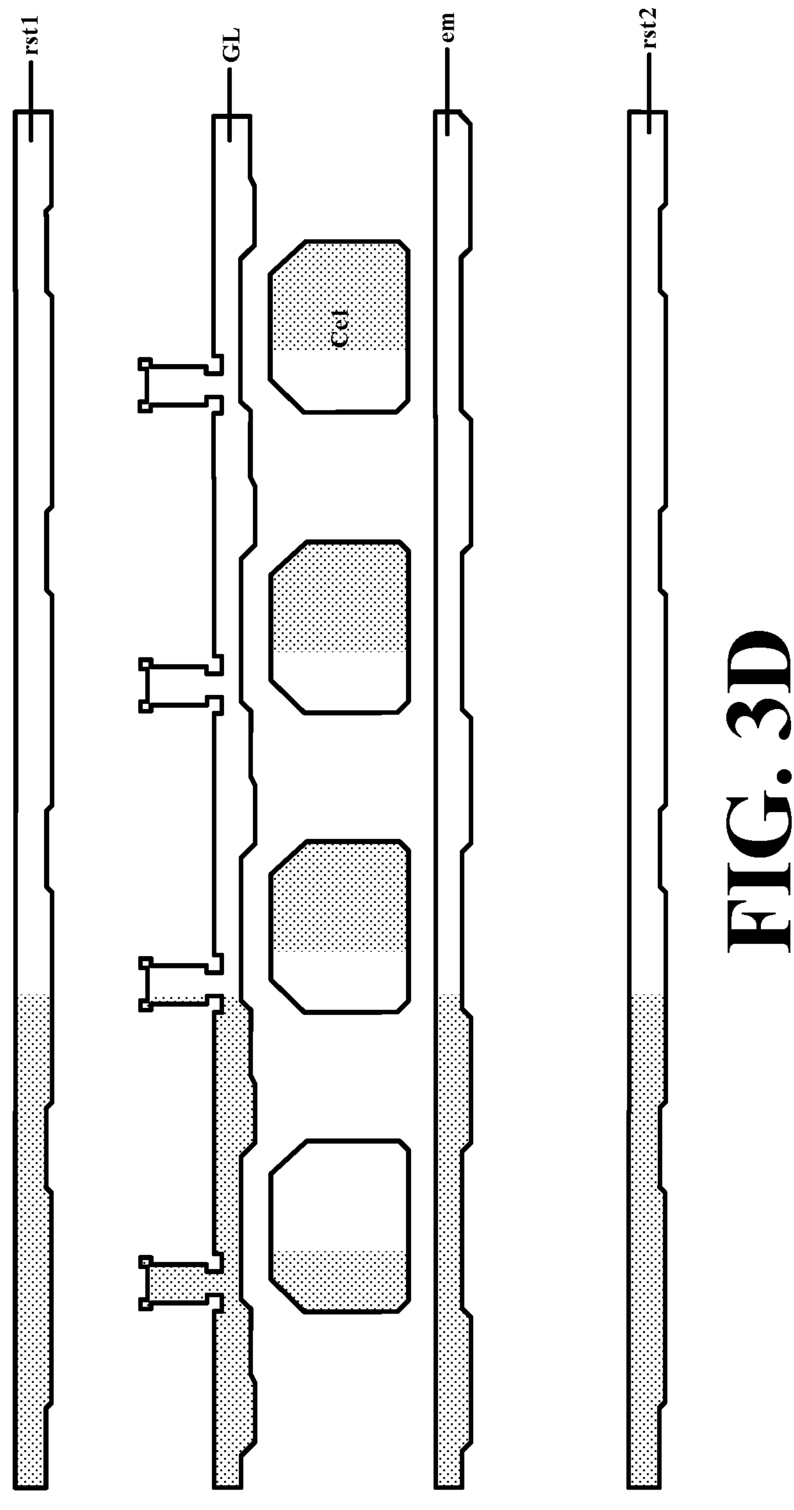
FIG. 3D is a diagram illustrating the structure of a first conductive layer in a plurality of subpixels of an array substrate depicted in FIG. 3A.
Figure 3E:
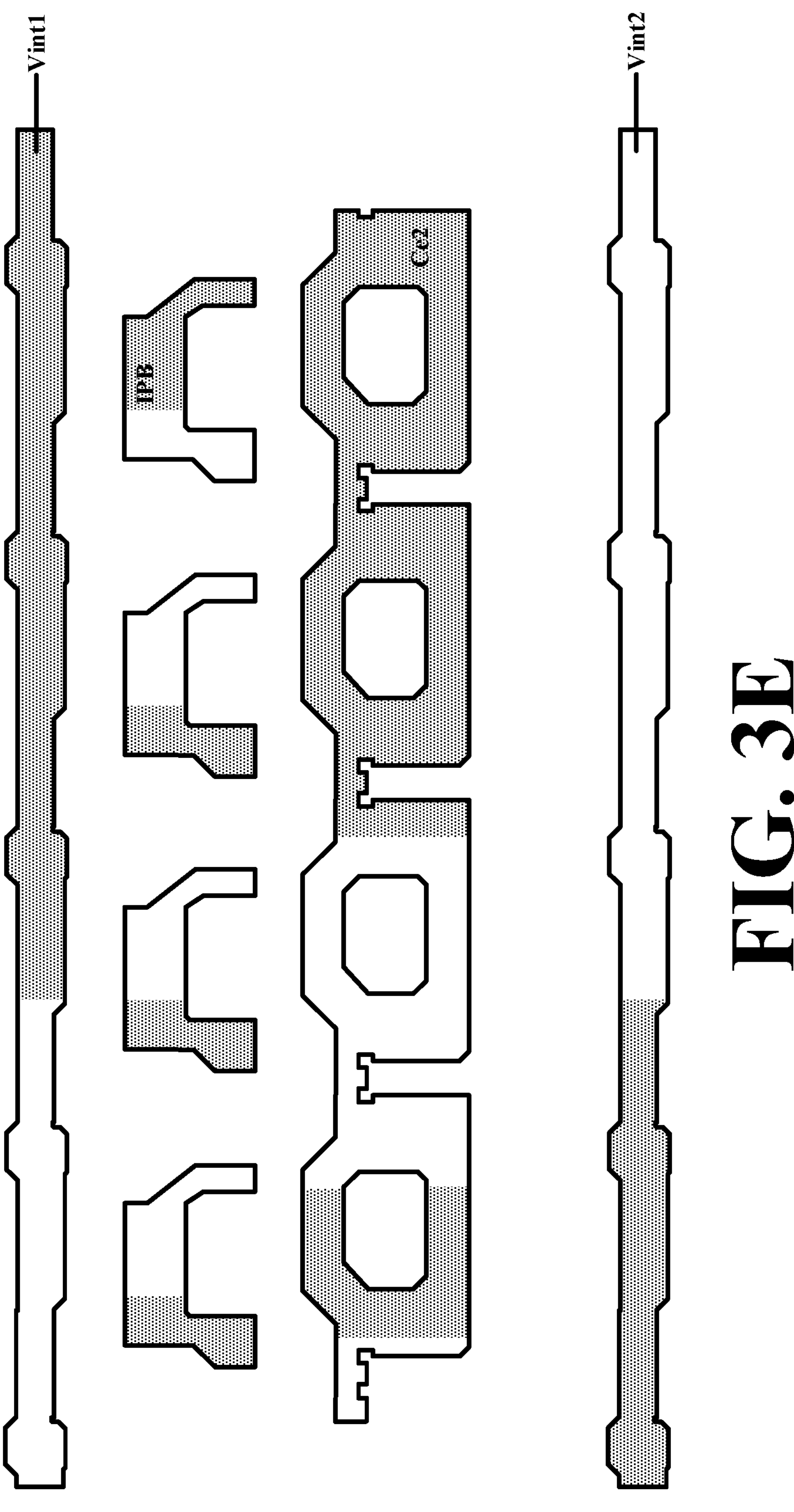
FIG. 3E is a diagram illustrating the structure of a second conductive layer in a plurality of subpixels of an array substrate depicted in FIG. 3A.
Figure 3F:
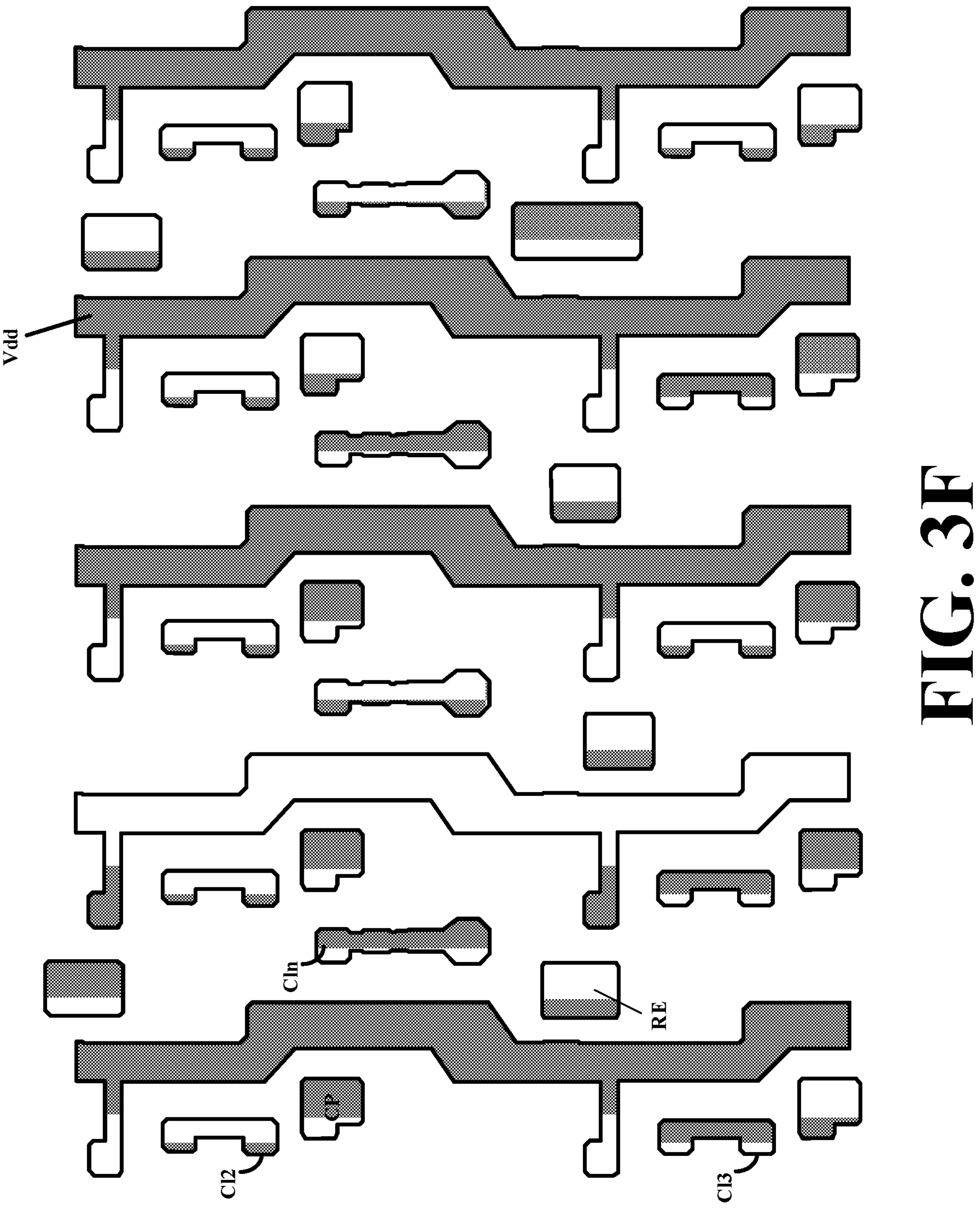
FIG. 3F is a diagram illustrating the structure of a first signal line layer in a plurality of subpixels of an array substrate depicted in FIG. 3A.
Figure 3G:
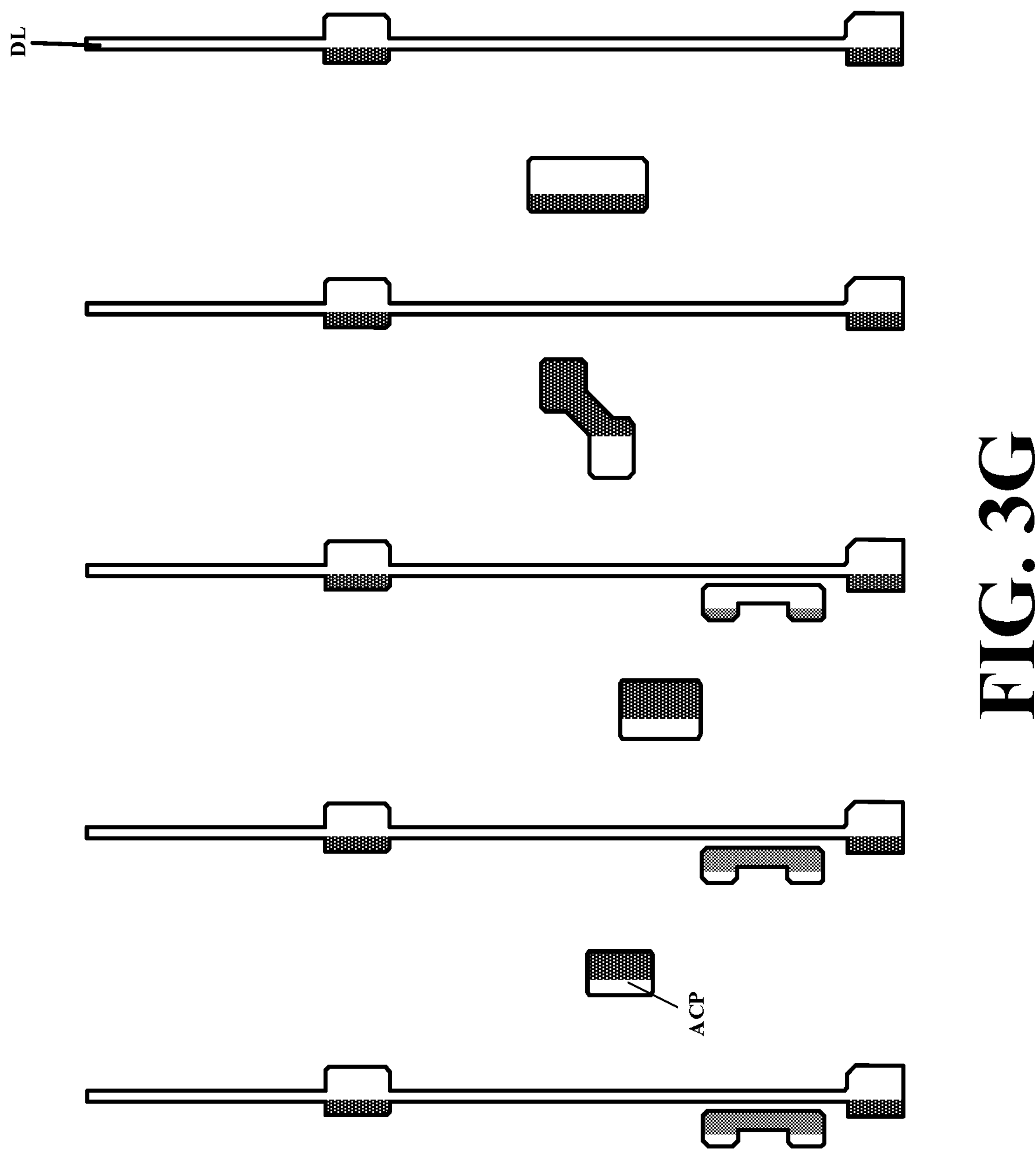
FIG. 3G is a diagram illustrating the structure of a second signal line layer in a plurality of subpixels of an array substrate depicted in FIG. 3A.
Figure 3H:
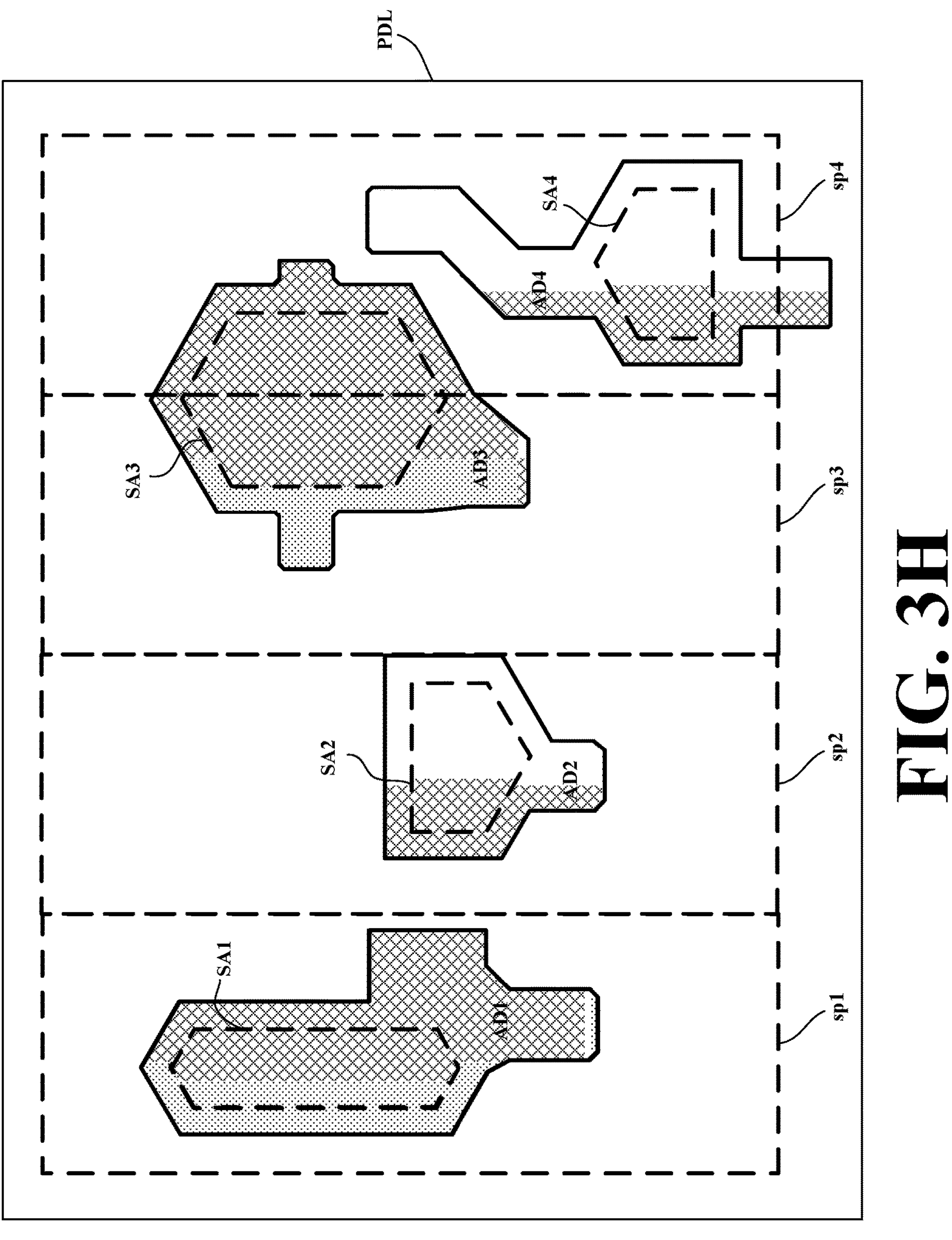
FIG. 3H is a diagram illustrating the structure of anodes in a plurality of subpixels of an array substrate depicted in FIG. 3A.
Figure 4A:
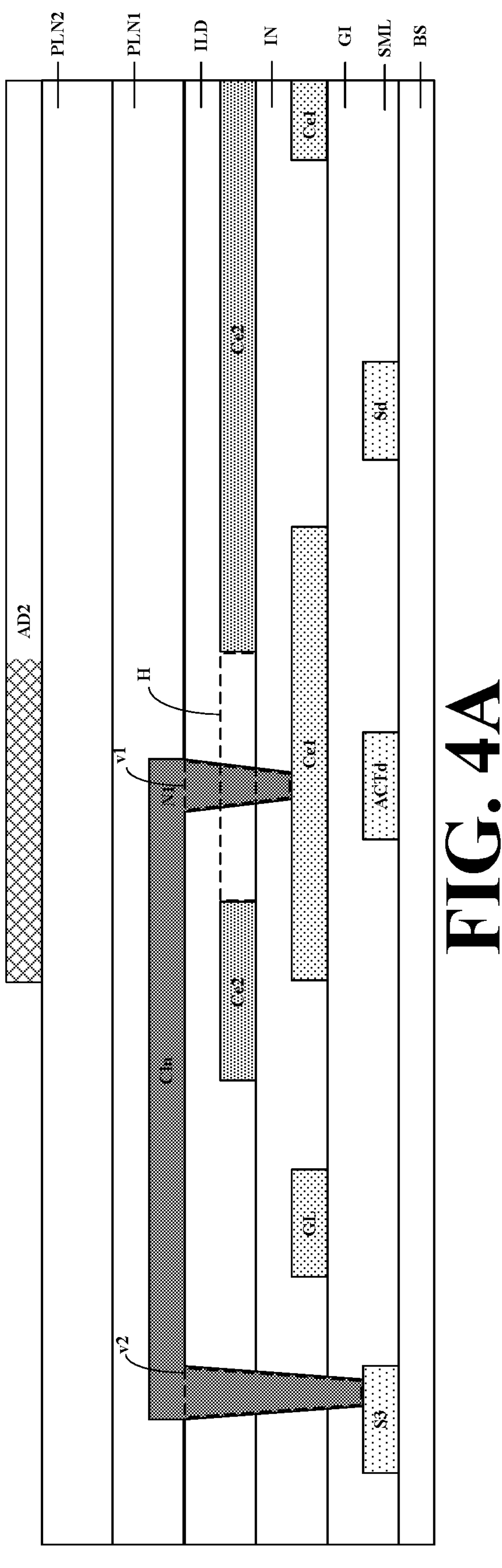
FIG. 4A is a cross-sectional view along an A-A' line in FIG. 3A.
Figure 4B:
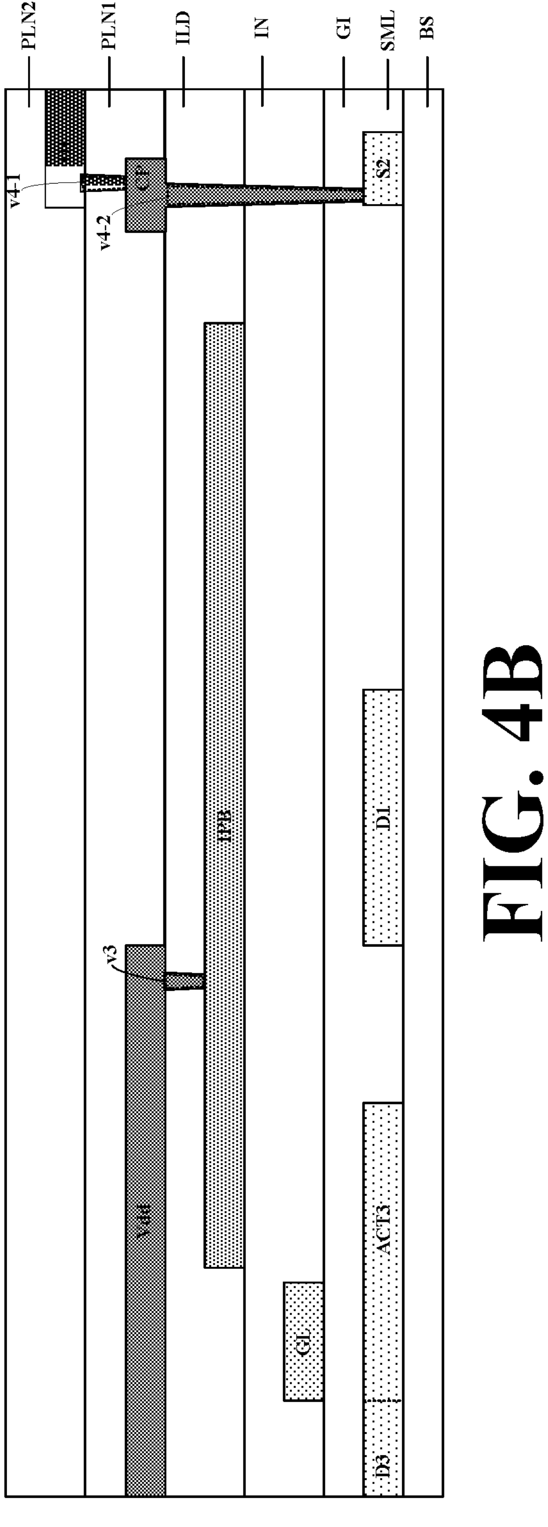
FIG. 4B is a cross-sectional view along a B-B' line in FIG. 3A.
Figure 4C:
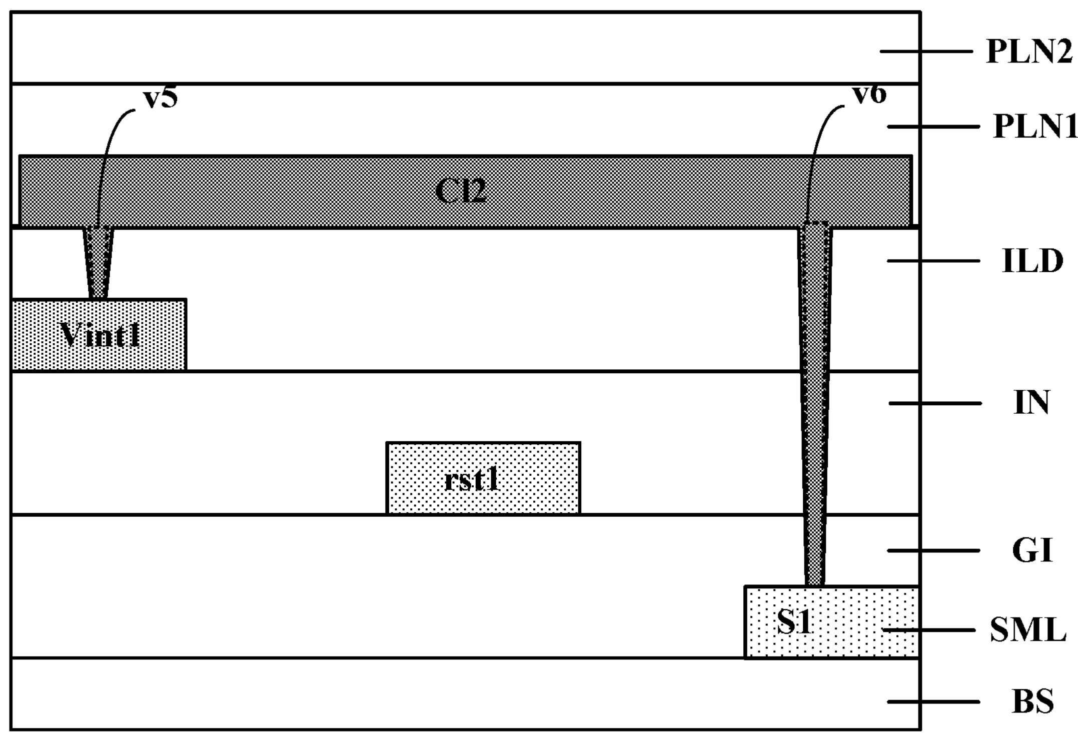
FIG. 4C is a cross-sectional view along a C-C' line in FIG. 3A.
Figure 4D:
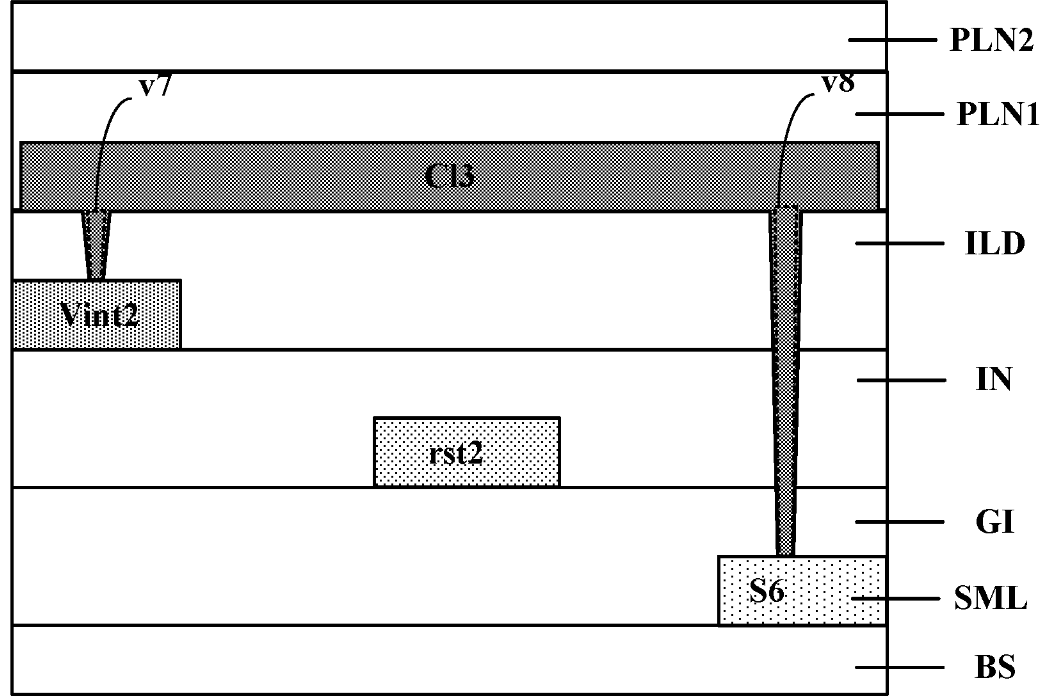
FIG. 4D is a cross-sectional view along a D-D' line in FIG. 3A.

FIG. 3C is a diagram illustrating the structure of a semiconductor material layer in a plurality of subpixels of an array substrate depicted in FIG. 3A. FIG. 3D is a diagram illustrating the structure of a first conductive layer in a plurality of subpixels of an array substrate depicted in FIG. 3A. FIG. 3E is a diagram illustrating the structure of a second conductive layer in a plurality of subpixels of an array substrate depicted in FIG. 3A. FIG. 3F is a diagram illustrating the structure of a first signal line layer in a plurality of subpixels of an array substrate depicted in FIG. 3A. FIG. 3G is a diagram illustrating the structure of a second signal line layer in a plurality of subpixels of an array substrate depicted in FIG. 3A. FIG. 3H is a diagram illustrating the structure of anodes in a plurality of subpixels of an array substrate depicted in FIG. 3A. FIG. 4A is a cross-sectional view along an A-A' line in FIG. 3A. FIG. 4B is a cross-sectional view along a B-B' line in FIG. 3A. FIG. 4C is a cross-sectional view along a C-C' line in FIG. 3A. FIG. 4D is a cross-sectional view along a D-D' line in FIG. 3A. Referring to FIG. 3A to FIG. 3H, and FIG. 4A to FIG. 4D, in some embodiments, the array substrate includes a base substrate BS, a semiconductor material layer SML on the base substrate BS, a gate insulating layer GI on a side of the semiconductor material layer SML away from the base substrate BS, a first conductive layer on a side of the gate insulating layer GI away from the semiconductor material layer SML, an insulating layer IN on a side of the first conductive layer away from the gate insulating layer GI, a second conductive layer on a side of the insulating layer IN away from the first conductive layer, an inter-layer dielectric layer ILD on a side of the second conductive layer away from the insulating layer IN, a first signal line layer on a side of the inter-layer dielectric layer ILD away from the second conductive layer, a first planarization layer PLN1 on a side of the signal line layer away from the inter-layer dielectric layer ILD, a second signal line layer on a side of the first planarization layer PLN1 away from the first signal line layer, a second planarization layer PLN2 on a side of the second signal line layer away from the first planarization layer PLN1, and an anode layer on a side of the second planarization layer PLN2 away from the second signal line layer.

Referring to FIG. 2A, FIG. 3A, and FIG. 3C, in some embodiments, in each subpixel, the semiconductor material layer has a unitary structure. In FIG. 3C, the first subpixel on the left is annotated with labels indicating regions corresponding to the plurality of transistors in the pixel driving circuit, including the first transistor T1, the second transistor T2, the third transistor T3, the fourth transistor T4, the fifth transistor T5, the sixth transistor T6, and the driving transistor Td. In FIG. 3B, the subpixel on the right is annotated with labels indicating components of each of the plurality of transistors in the pixel driving circuit. For example, the first transistor T1 includes an active layer ACT1, a source electrode S1, and a drain electrode D1. The second transistor T2 includes an active layer ACT2, a source electrode S2, and a drain electrode D2. The third transistor T3 includes an active layer ACT3, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The driving transistor Td includes an active layer ACTd, a source electrode Sd, and a drain electrode Dd. In one example, the active layers (ACT1, ACT2, ACT3, ACT4, ACT5, ACT6 and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) in a respective subpixel are parts of a unitary structure in the respective subpixel. In another example, the active layers (ACT1, ACT2, ACT3, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) are in a same layer.

Referring to FIG. 2A, FIG. 3A, FIG. 3D, FIG. 4A, and FIG. 4B, the first conductive layer in some embodiments includes a plurality of gate lines GL, a plurality of first reset control signal lines rst1, a plurality of light emitting control signal lines em, a plurality of second reset control signal lines rst2, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of gate lines GL, the plurality of first reset control signal lines rst1, the plurality of light emitting control signal lines em, the plurality of second reset control signal lines rst2, and the first capacitor electrode Ce1 are in a same layer.

As used herein, the term "same layer" refers to the relationship between the layers simultaneously formed in the same step. In one example, the plurality of gate lines GL and the first capacitor electrode Ce1 are in a same layer when they are formed as a result of one or more steps of a same patterning process performed in a same layer of material. In another example, the plurality of gate lines GL and the first capacitor electrode Ce1 can be formed in a same layer by simultaneously performing the step of forming the plurality of gate lines GL, and the step of forming the first capacitor electrode Ce1. The term "same layer" does not always mean that the thickness of the layer or the height of the layer in a cross-sectional view is the same.

Referring to FIG. 2A, FIG. 3A, and FIG. 3E, the second conductive layer in some embodiments includes a plurality of first reset signal lines Vint1, a second capacitor electrode Ce2 of the storage capacitor Cst, an interference preventing block IPB, and a plurality of second reset signal lines Vint2. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first reset signal lines Vint1, the plurality of second reset signal lines Vint2, the interference preventing block IPB, and the second capacitor electrode Ce2 are in a same layer. Referring to Referring to FIG. 2A, FIG. 3A, FIG. 3D, and FIG. 4B, in some embodiments, the interference preventing block IPB is in a same layer as the second capacitor electrode Ce2. The respective one of the plurality of voltage supply lines Vdd is connected to the interference preventing block IPB through a third main via v3. Optionally, the third main via v3 extends through the inter-layer dielectric layer ILD.

Referring to FIG. 2A, FIG. 3A, FIG. 3C, and FIG. 3F, the first signal line layer in some embodiments includes a plurality of voltage supply lines Vdd, a node connecting line Cln, a second connecting line Cl2, and a third connecting line Cl3. The node connecting line Cln connects the first capacitor electrode Ce1 and the source electrode of the third transistor T3 in a respective subpixel together. The second connecting line Cl2 connects a respective one of the plurality of first reset signal lines Vint1 and the source electrode of the first transistor T1 in a respective subpixel together. The third connecting line Cl3 connects a respective one of the plurality of second reset signal lines Vint2 and the source electrode of the sixth transistor T6 in a respective subpixel together. The first signal line layer in some embodiments further includes a relay electrode RE in a respective one of the plurality of subpixels sp. The relay electrode connects a source electrode of the fifth transistor T5 in the respective one of the plurality of subpixels sp to an anode contact pad in the respective one of the plurality of subpixels sp. Various appropriate conductive materials and various appropriate fabricating methods may be used to make the signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of voltage supply lines Vdd, the plurality of data lines DL, the node connecting line Cln, the second connecting line Cl2, and the third connecting line Cl3, and the relay electrode RE, are in a same layer.

FIG. 4C is a cross-sectional view along a C-C' line in FIG. 3A. Referring to FIG. 2A, FIG. 3A, FIG. 3F, and FIG. 4C, in some embodiments, the second connecting line Cl2 connects the respective one of the plurality of first reset signal lines Vint1 and the source electrode S1 of the first transistor T1 in a respective subpixel together. The respective one of the plurality of first reset signal lines Vint1 is configured to provide a reset signal to the source electrode S1 of the first transistor T1 in the respective subpixel, through the second connecting line Cl2. Optionally, the second connecting line Cl2 is connected to the respective one of the plurality of first reset signal lines Vint1 through a fifth main via v5 extending through the inter-layer dielectric layer ILD. Optionally, the second connecting line Cl2 is connected to the source electrode S1 of the first transistor T1 in the respective subpixel through a sixth main via v6 extending through the inter-layer dielectric layer ILD, the insulating layer IN, and the gate insulating layer GI.

FIG. 4D is a cross-sectional view along a D-D' line in FIG. 3A. Referring to FIG. 2A, FIG. 3A, FIG. 3F, and FIG. 4D, in some embodiments, the third connecting line Cl3 connects the respective one of the plurality of second reset signal lines Vint2 and the source electrode S6 of the sixth transistor T6 in a respective subpixel together. The respective one of the plurality of second reset signal lines Vint2 is configured to provide a reset signal to the source electrode S6 of the sixth transistor T6 in the respective subpixel, through the second connecting line Cl2. Optionally, the third connecting line Cl3 is connected to the respective one of the plurality of second reset signal lines Vint2 through a seventh main via v7 extending through the inter-layer dielectric layer ILD. Optionally, the third connecting line Cl3 is connected to the source electrode S6 of the sixth transistor T6 in the respective subpixel through an eighth main via v8 extending through the inter-layer dielectric layer ILD, the insulating layer IN, and the gate insulating layer GI.

Referring to FIG. 2A, FIG. 3A, and FIG. 3G, the second signal line layer in some embodiments includes a plurality of data line DL. Optionally, the second signal line layer further includes an anode contact pad ACP in a respective one of the plurality of subpixels sp. The anode contact pad ACP is electrically connected to a source electrode of the fifth transistor T5 in the respective one of the plurality of subpixels sp through a relay electrode in the respective one of the plurality of subpixels sp. Referring to Referring to FIG. 2A, FIG. 3A, FIG. 3F, FIG. 3G, and FIG. 4B, in some embodiments, a respective one of the plurality of data lines DL is connected to a connecting portion CP through a via v4-1 extending through the first planarization layer PLN-1, and the connecting portion CP is connected to a source electrode S2 of the second transistor through a via v4-2 extending through the inter-layer dielectric layer ILD, the insulating layer IN, and the gate insulating layer GI.

Referring to FIG. 2A, FIG. 3A, FIG. 3D, FIG. 3E, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the signal line layer includes a node connecting line Cln on a side of the inter-layer dielectric layer ILD away from the second capacitor electrode Ce2. The node connecting line Cln is in a same layer as the plurality of voltage supply lines Vdd and the plurality of data lines DL. Optionally, the array substrate further includes a first main via v1 in the hole region H and extending through the inter-layer dielectric layer ILD and the insulating layer IN. Optionally, the node connecting line Cln is connected to the first capacitor electrode Ce1 through the first main via v1. In some embodiments, the first capacitor electrode Ce1 is on a side of the gate insulating layer IN away from the base substrate BS. Optionally, the array substrate further includes a first main via v1 and a second main via v2. The first main via v1 is in the hole region H and extends through the inter-layer dielectric layer ILD and the insulating layer IN. The second main via v2 extends through the inter-layer dielectric layer ILD, the insulating layer IN, and the gate insulating layer GI. Optionally, the node connecting line Cln is connected to the first capacitor electrode Ce1 through the first main via v1, and is connected node connecting line Cln is connected the semiconductor material layer SML through the second main via v2. Optionally, the node connecting line Cln is connected to the source electrode S3 of third transistor, as depicted in FIG. 4A.

Referring to Referring to FIG. 2A, FIG. 3A, FIG. 3E, and FIG. 4B, in some embodiments, the interference preventing block IPB is in a same layer as the second capacitor electrode Ce2. The respective one of the plurality of voltage supply lines Vdd is connected to the interference preventing block IPB through a third main via v3. Optionally, the third main via v3 extends through the inter-layer dielectric layer ILD. Optionally, an orthographic projection of the interference preventing block IPB on the base substrate BS partially overlaps with an orthographic projection of the respective one of the plurality of voltage supply lines Vdd on the base substrate BS. Optionally, the orthographic projection of the interference preventing block IPB on the base substrate BS at least partially overlaps with an orthographic projection of an active layer ACT3 of the third transistor T3 on the base substrate BS. Optionally, the orthographic projection of the interference preventing block IPB on the base substrate BS at least partially overlaps with an orthographic projection of a drain electrode D1 of the first transistor T1 on the base substrate BS. Optionally, orthographic projections of a portion of the interference preventing block IPB and a portion of the respective one of the plurality of voltage supply lines Vdd on the base substrate BS commonly overlaps with an orthographic projection of a portion of the active layer ACT3 of the third transistor T3 on the base substrate BS.

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

Referring to FIG. 2A, FIG. 3A, and FIG. 3H, the array substrate in some embodiments includes a first anode AD1 in the respective first subpixel sp1, a second anode AD2 in the respective second subpixel sp2, a third anode AD3 in the respective third subpixel sp3, and a fourth anode AD4 in the respective fourth subpixel sp4. The first anode AD1, the second anode AD2, the third anode AD3, and the fourth anode AD4, are respectively anodes of a first light emitting element, a second light emitting element, a third light emitting element, and a fourth light emitting element, respectively in the respective first subpixel sp1, the respective second subpixel sp2, the respective third subpixel sp3, and the respective fourth subpixel sp4. The array substrate in some embodiments further includes a pixel definition layer PDL on a side of the first anode AD1, the second anode AD2, the third anode AD3, and the fourth anode AD4 away from the second planarization layer PLN2. The array substrate further includes a first subpixel aperture SA1, a second subpixel aperture SA2, a third subpixel aperture SA3, a fourth subpixel aperture SA4 respectively extending through the pixel definition layer PDL. In some embodiments, the respective first subpixel sp1 is a red subpixel, and the first anode AD1 is an anode of the red subpixel; the respective second subpixel sp2 is a first green subpixel, and the second anode AD2 is an anode of the first green subpixel; the respective third subpixel sp3 is a blue subpixel, and the third anode AD3 is an anode of the blue subpixel; the respective fourth subpixel sp4 is a second green subpixel, and the fourth anode AD4 is an anode of the second green subpixel.

Figure 5A:
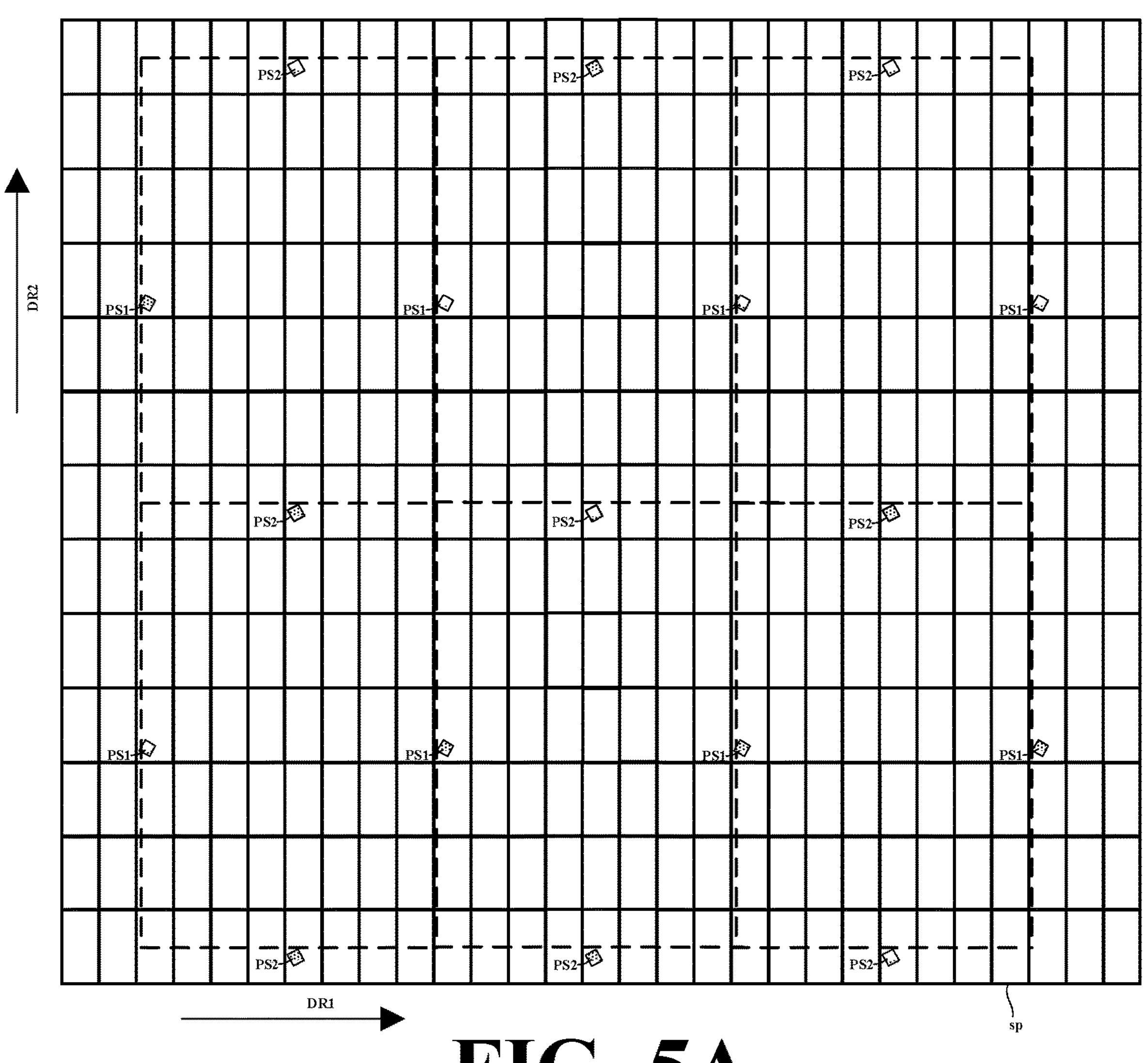
FIG. 5A is a diagram illustrating an arrangement of spacers in an array substrate in some embodiments according to the present disclosure.

In some embodiments, the array substrate further includes a plurality of spacers on a side of the second planarization layer away from the base substrate. The spacers are configured to space apart a fine metal mask from the array substrate during the process of depositing light emitting materials onto the array substrate. By having the spacers, damages to the pixel driving circuit caused by the fine metal mask during the deposition process can be effectively avoided. FIG. 5A is a schematic diagram illustrating an arrangement of spacers in a plurality of subpixels in an array substrate in some embodiments according to the present disclosure. Referring to FIG. 5A, the plurality of spacers in some embodiments includes first spacers PS1 arranged in a first array and second spacers PS2 arranged in a second array. The first array and the second array interlace with each other. A respective row of second spacers PS2 in the second array is between two respective rows of first spacers PS1 in the first array. A respective column of second spacers PS2 in the second array is between two respective columns of first spacers PS1 in the first array. A respective row of first spacers PS1 in the first array is between two respective rows of second spacers PS2 in the second array. A respective column of first spacers PS1 in the first array is between two respective columns of second spacers PS2 in the second array.

As shown in FIG. 5A, two adjacent first spacers in the respective row of first spacers PS1 are spaced apart by eight subpixels; two adjacent second spacers in the respective row of second spacers PS2 are spaced apart by eight subpixels; two adjacent first spacers in the respective column of first spacers PS1 are spaced apart by six subpixels; and two adjacent second spacers in the respective column of second spacers PS2 are spaced apart by six subpixels. Optionally, a ratio of a number of subpixels to a number of spacers is in a range of 48:1 to 15:1, e.g., 48:1 to 40:1, 40:1 to 35:1, 35:1 to 30:1, 30:1 to 25:1, 25:1 to 20:1, or 20:1 to 15:1. Optionally, a ratio of a number of subpixels to a number of spacers is in a range of 28:1 to 20:1, e.g., 27:1 to 21:1, 26:1 to 22:1, or 25:1 to 23:1. Optionally, a ratio of a number of subpixels to a number of spacers is 24:1, as shown in FIG. 5A.

Figure 5B:
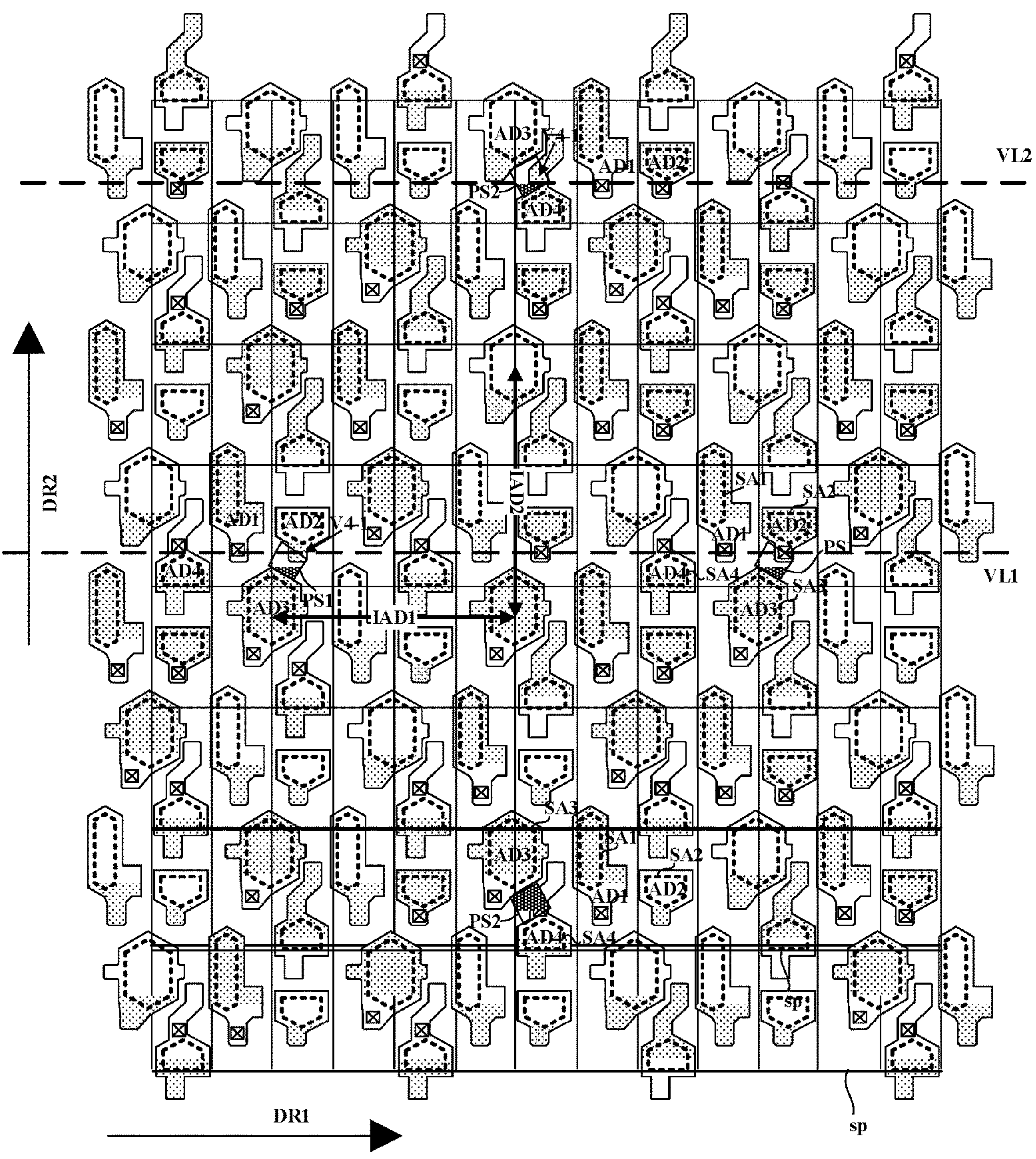
FIG. 5B is a schematic diagram illustrating an arrangement of spacers in a plurality of subpixels in an array substrate in some embodiments according to the present disclosure.

FIG. 5B is a diagram illustrating an arrangement of spacers in an array substrate in some embodiments according to the present disclosure. FIG. 5B illustrates positions of a plurality of spacers relative to anodes in the array substrate. Referring to FIG. 5B, in some embodiments, a respective one of the first spacers PS1 is between the second anode AD2 and the third anode AD3; and a respective one of the second spacers PS2 is between the third anode AD3 and the fourth anode AD4. Optionally, the respective one of the first spacers PS1 is between the second subpixel aperture SA2 and the third subpixel aperture SA3; and the respective one of the second spacers PS2 is between the third subpixel aperture SA3 and the fourth subpixel aperture SA4. In one example, the respective first subpixel sp1 is a red subpixel, and the first anode AD1 is an anode of the red subpixel; the respective second subpixel sp2 is a first green subpixel, and the second anode AD2 is an anode of the first green subpixel; the third subpixel sp3 is a blue subpixel, and the respective third anode AD3 is an anode of the blue subpixel; the respective fourth subpixel sp4 is a second green subpixel, and the fourth anode AD4 is an anode of the second green subpixel. In another example, the respective one of the first spacers PS1 is between the second anode AD2 of the first green subpixel and the third anode AD3 of the blue subpixel; and the respective one of the second spacers PS2 is between the third anode AD3 of the blue subpixel and the fourth anode AD4 of the second green subpixel. In another example, the respective one of the first spacers PS1 is between the second subpixel aperture SA2 of the first green subpixel and the third subpixel aperture SA3 of the blue subpixel; and the respective one of the second spacers PS2 is between the third subpixel aperture SA3 of the blue subpixel and the fourth subpixel aperture SA4 of the second green subpixel.

In some embodiments, an average occupied area of the respective one of the first spacers PS1 is in a range of 10 $\mu m^2$ to 500 $\mu m^2$, e.g., 10 $\mu m^2$ to 50 $\mu m^2$, 50 $\mu m^2$ to 100 $\mu m^2$, 100 $\mu m^2$ to 150 $\mu m^2$, 150 $\mu m^2$ to 200 $\mu m^2$, 200 $\mu m^2$ to 250 $\mu m^2$, 250 $\mu m^2$ to 300 $\mu m^2$, 300 $\mu m^2$ to 350 $\mu m^2$, 350 $\mu m^2$ to 400 $\mu m^2$, 400 $\mu m^2$ to 450 $\mu m^2$, or 450 $\mu m^2$ to 500 $\mu m^2$; and an average occupied area of the respective one of the second spacers PS2 is in a range of 10 $\mu m^2$ to 500 $\mu m^2$, e.g., 10 $\mu m^2$ to 50 $\mu m^2$, 50 $\mu m^2$ to 100 $\mu m^2$, 100 $\mu m^2$ to 150 $\mu m^2$, 150 $\mu m^2$ to 200 $\mu m^2$, 200 $\mu m^2$ to 250 $\mu m^2$, 250 $\mu m^2$ to 300 $\mu m^2$, 300 $\mu m^2$ to 350 $\mu m^2$, 350 $\mu m^2$ to 400 $\mu m^2$, 400 $\mu m^2$ to 450 $\mu m^2$, or 450 $\mu m^2$ to 500 $\mu m^2$. Optionally, an average occupied area of the respective one of the first spacers PS1 is in a range of 80 $\mu m^2$ to 120 $\mu m^2$, e.g., 80 $\mu m^2$ to 90 $\mu m^2$, 90 $\mu m^2$ to 100 $\mu m^2$, 100 $\mu m^2$ to 110 $\mu m^2$, or 110 $\mu m^2$ to 120 $\mu m^2$; and an average occupied area of the respective one of the second spacers PS2 is in a range of 80 $\mu m^2$ to 120 $\mu m^2$, e.g., 80 $\mu m^2$ to 90 $\mu m^2$, 90 $\mu m^2$ to 100 $\mu m^2$, 100 $\mu m^2$ to 110 $\mu m^2$, or 110 $\mu m^2$ to 120 $\mu m^2$. Optionally, the average occupied area of the respective one of the first spacers PS1 is 100 $\mu m^2$; and the average occupied area of the respective one of the second spacers PS2 is 100 $\mu m^2$. Optionally, an average occupied area of a respective one of the plurality of subpixels is in a range of 1400 $\mu m^2$ to 2000 $\mu m^2$, e.g., 1400 $\mu m^2$ to 1500 $\mu m^2$, 1500 $\mu m^2$ to 1600 $\mu m^2$, 1600 $\mu m^2$ to 1700 $\mu m^2$, 1700 $\mu m^2$ to 1800 $\mu m^2$, 1800 $\mu m^2$ to 1900 $\mu m^2$, or 1900 $\mu m^2$ to 2000 $\mu m^2$. Optionally, the average occupied area of the respective one of the plurality of subpixels is 1676 $\mu m^2$. Optionally, a percentage of a total occupied area of the first spacers PS1 and the second spacers PS2 relative to a total occupied area of the plurality of subpixels is in a range of 0.01% to 1%, e.g., 0.01% to 0.05%, 0.05% to 0.1%, 0.1% to 0.15%, 0.15% to 0.20%, 0.20% to 0.25%, 0.25% to 0.30%, 0.30% to 0.35%, 0.35% to 0.40%, 0.40% to 0.45%, 0.45% to 0.50%, 0.50% to 0.55%, 0.55% to 0.60%, 0.60% to 0.65%, 0.65% to 0.70%, 0.70% to 0.75%, 0.75% to 0.80%, 0.80% to 0.85%, 0.85% to 0.90%, 0.90% to 0.95%, or 0.95% to 1.0%. Optionally, a percentage of a total occupied area of the first spacers PS1 and the second spacers PS2 relative to a total occupied area of the plurality of subpixels is in a range of 0.15% to 0.35%, e.g., 0.15% to 0.20%, 0.20% to 0.25%, 0.25% to 0.30%, or 0.30% to 0.35%. Optionally, the percentage of the total occupied area of the first spacers PS1 and the second spacers PS2 relative to the total occupied area of the plurality of subpixels is 0.25%.

The inventors of the present disclosure discover that, unexpected and surprisingly, the arrangement and distribution of the spacers in the present array substrate can effectively minimize or prevent contamination of spacer residues during the process of light emitting material deposition, at the same time still effectively preventing damages to the pixel driving circuit. Moreover, a ratio of a number of subpixels to a number of spacers in a typical array substrate can be reduced from, e.g., a typical value of 8:1 to a value equal to or greater than 20:1. Further, the percentage of the total occupied area of the spacers relative to the total occupied area of the plurality of subpixels can be reduced from, e.g., a typical value of 2% to equal to or less than 0.35%.

Referring to FIG. 5A and FIG. 5B, in some embodiments, the plurality of subpixels sp are arranged in an array of a plurality of rows along a first direction DR1 and a plurality of columns along a second direction DR2. The respective row of the first spacers PS1 is along the first direction DR1. The respective row of the second spacers PS2 is along the first direction DR1. The respective column of the first spacers PS1 is along the second direction DR2. The respective column of the second spacers PS2 is along the second direction DR2.

Referring to FIG. 5A and FIG. 5B, in some embodiments, two adjacent first spacers in the respective row of first spacers are spaced apart by twice of a first inter-anode distance IAD1, the first inter-anode distance IAD1 being a distance along the first direction DR1 and between centers of two most adjacent third anodes respectively from two most adjacent third light emitting elements along the first direction DR1. Optionally, two adjacent second spacers in the respective row of second spacers are spaced apart by twice of the first inter-anode distance IAD1. In some embodiments, two adjacent first spacers in the respective column of first spacers are spaced apart by three times of a second inter-anode distance IAD2, the second inter-anode distance IAD2 being a distance along the second direction DR2 and between centers of two most adjacent third anodes respectively from two most adjacent third light emitting elements along the second direction DR2. Optionally, two adjacent second spacers in the respective column of second spacers are spaced apart by three times of the second inter-anode distance IAD2.

Referring to FIG. 5A and FIG. 5B, in some embodiments, an orthographic projection of the respective one of the first spacers PS1 on the base substrate at least partially overlaps with an orthographic projection of the second anode AD2 on the base substrate. Optionally, an orthographic projection of the respective one of the second spacers PS2 on the base substrate at least partially overlaps with an orthographic projection of the fourth anode AD4 on the base substrate.

Referring to FIG. 5A and FIG. 5B, in some embodiments, a first virtual line along the first direction crosses DR1 crosses over the respective one of the first spacers PS1 and the fourth via V2-1. Optionally, a second virtual line VL2 along the first direction DR1 crosses over the respective one of the second spacers PS2 and the tenth via V4-1.

Figure 6A:
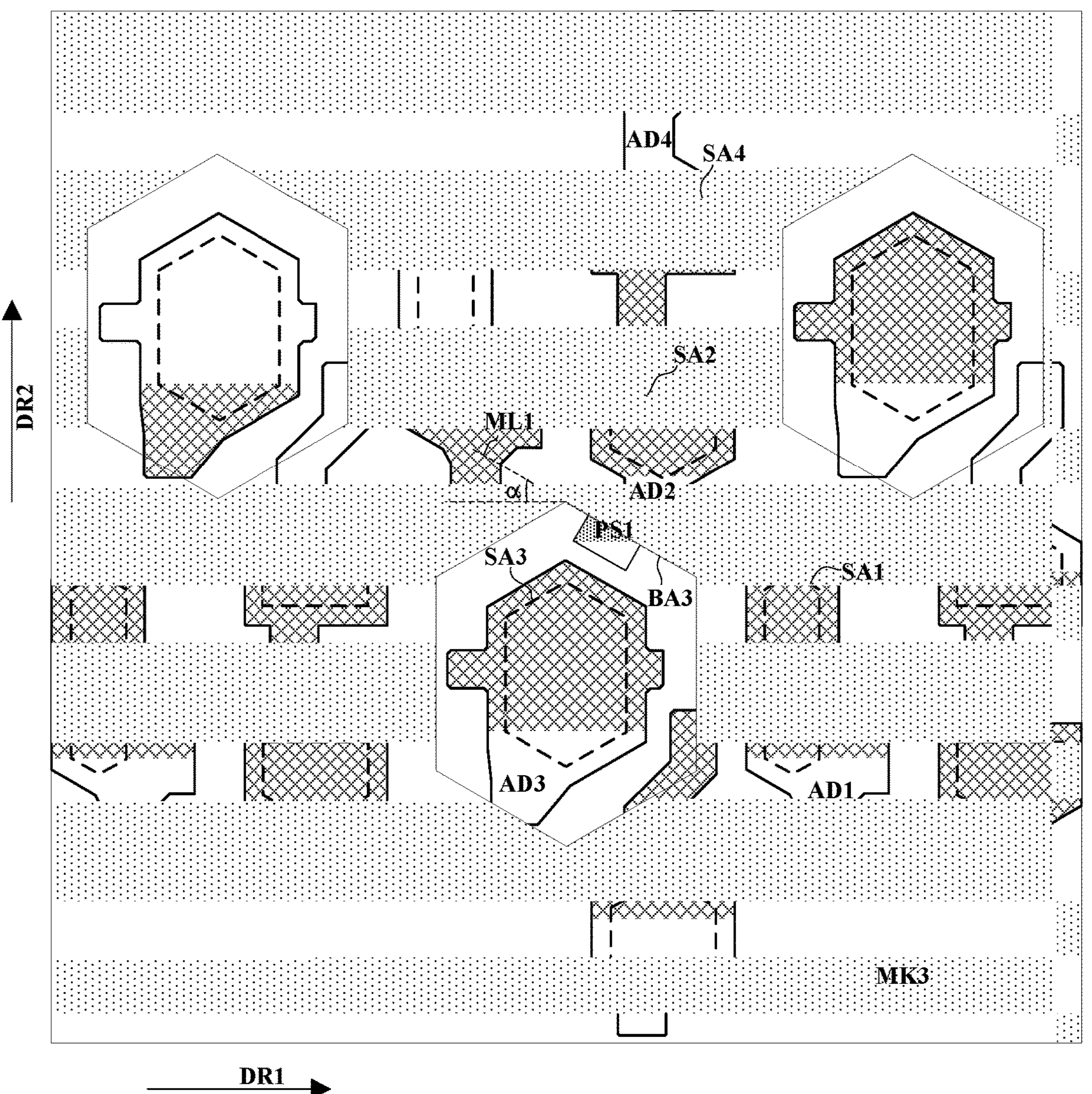
FIG. 6A illustrate formation of a third light emitting layer in an array substrate using a third mask plate in some embodiments according to the present disclosure.
Figure 6B:
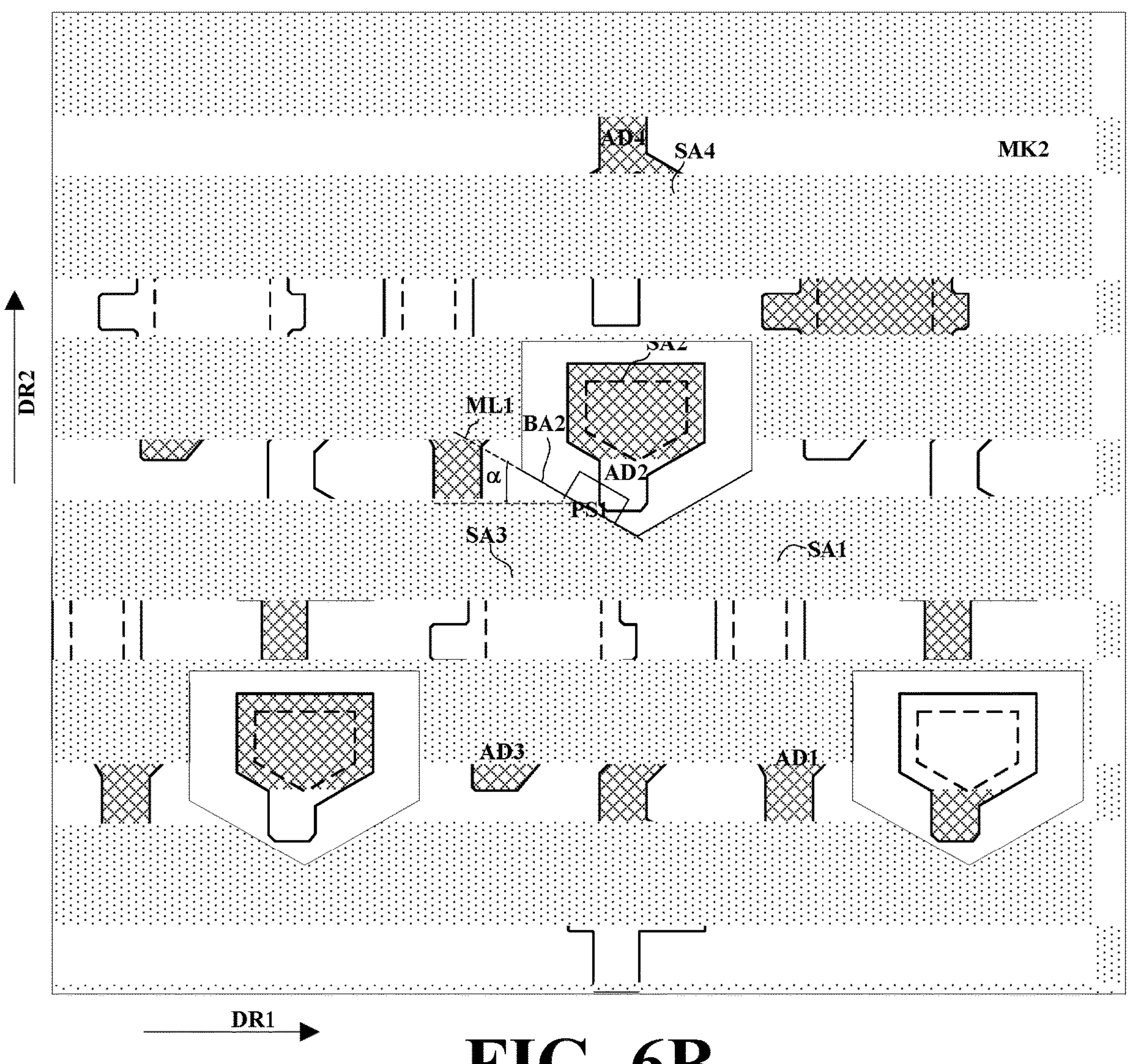
FIG. 6B illustrate formation of a second light emitting layer in an array substrate using a second mask plate in some embodiments according to the present disclosure.
Figure 6C:
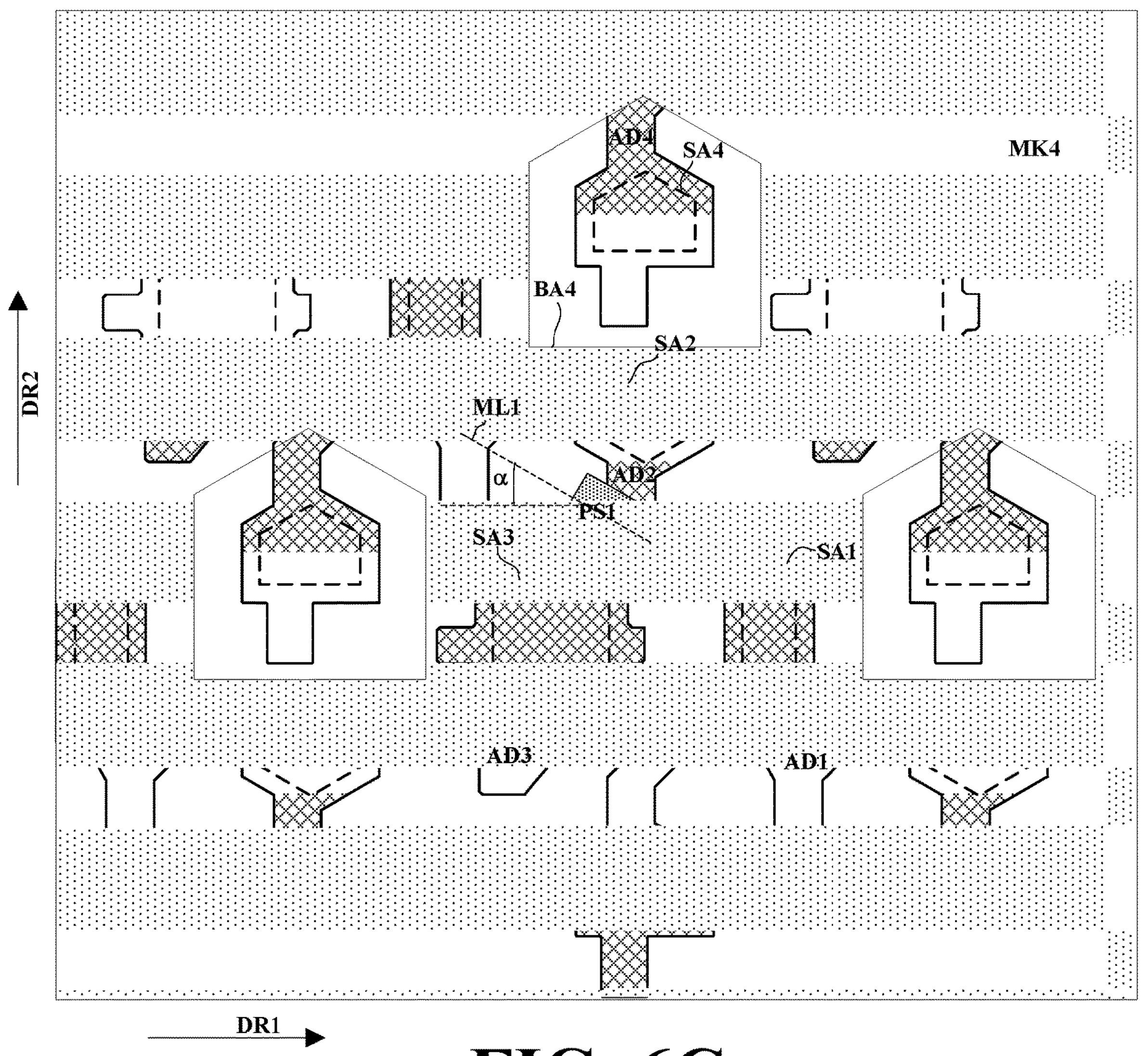
FIG. 6C illustrate formation of a fourth light emitting layer in an array substrate using a fourth mask plate in some embodiments according to the present disclosure.
Figure 6D:
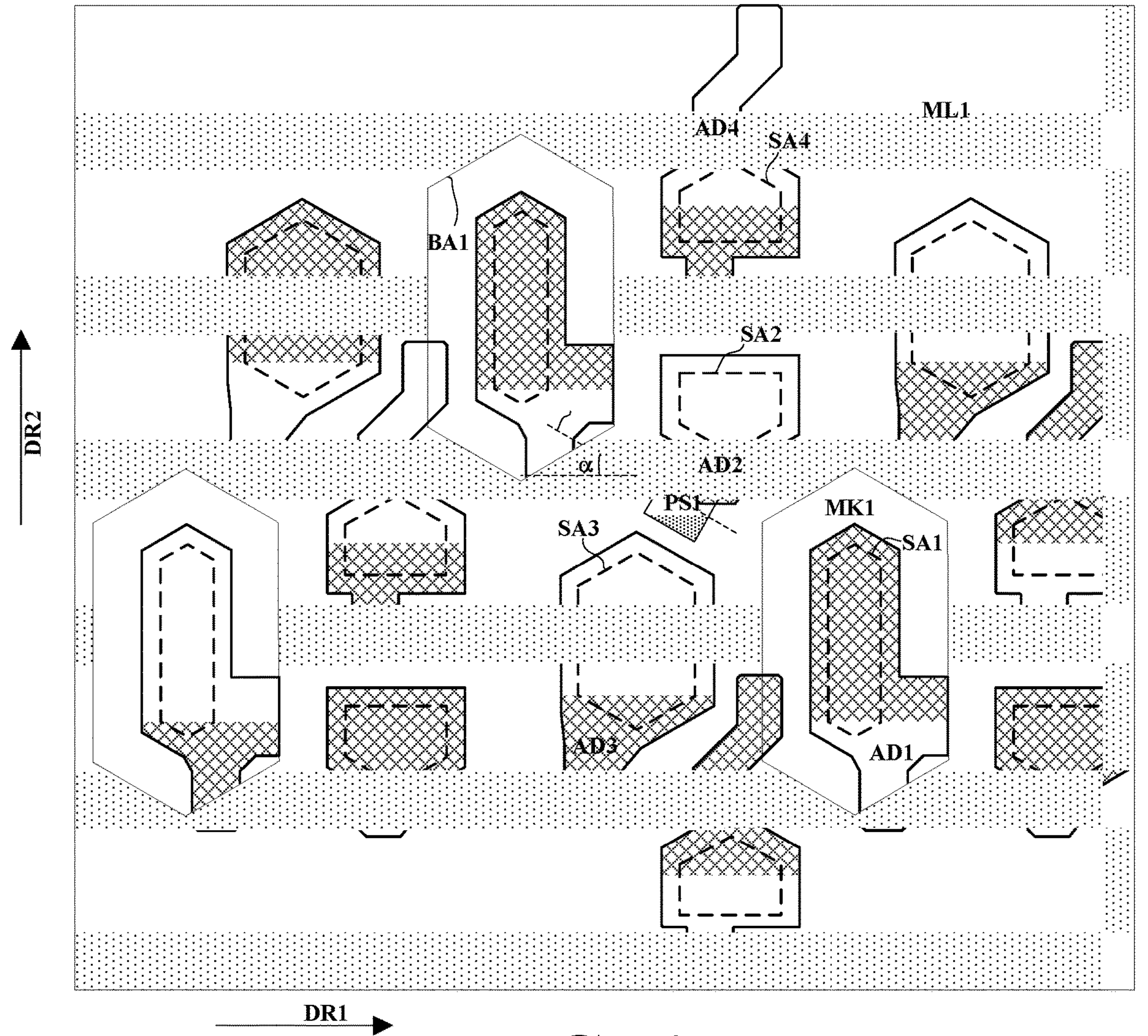
FIG. 6D illustrate formation of a first light emitting layer in an array substrate using a first mask plate in some embodiments according to the present disclosure.
Figure 6E:
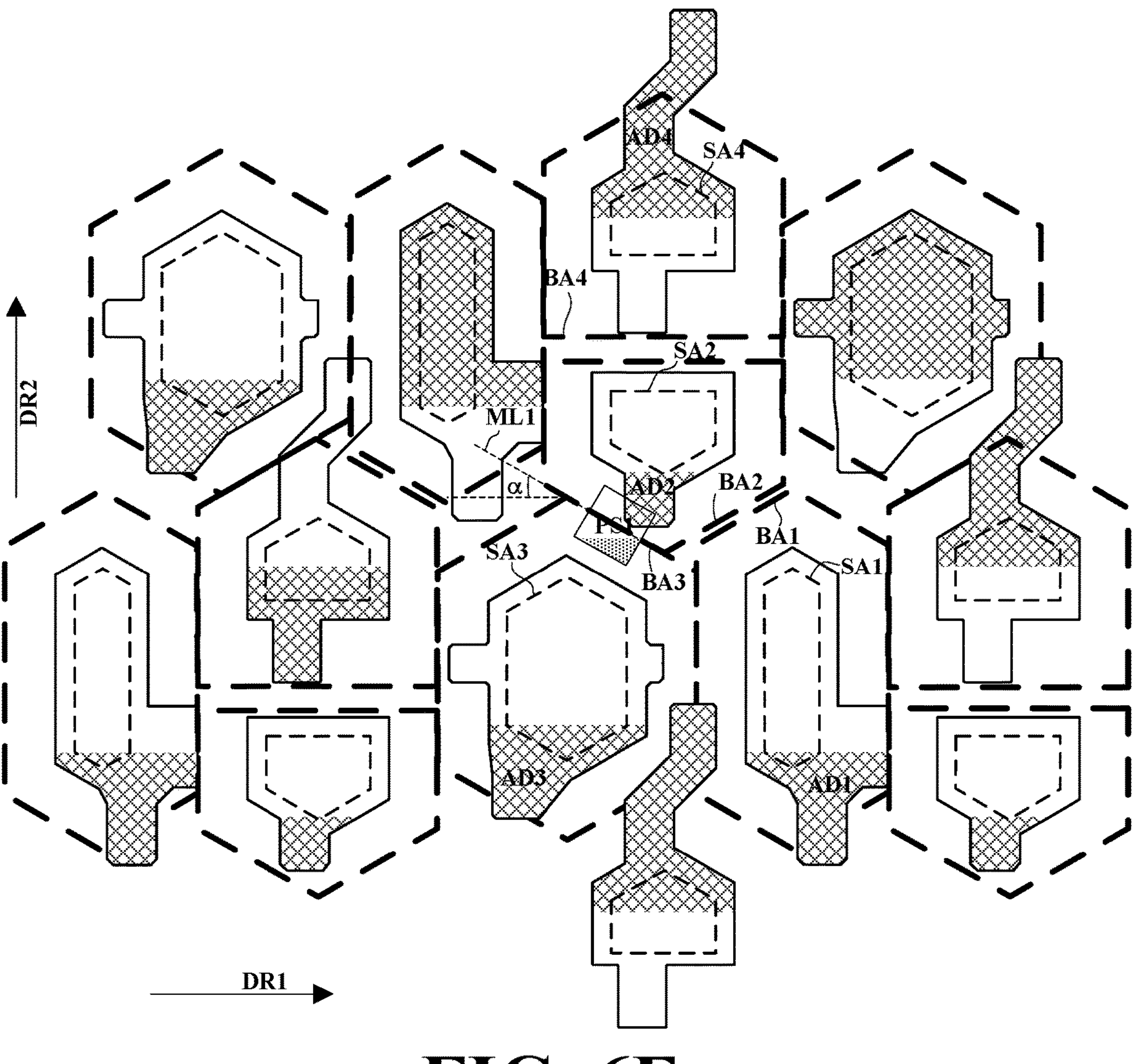
FIG. 6E illustrates relative positions of boundaries of apertures of a first mask plate, a second mask plate, a third mask plate, and a fourth mask plate, relative to a respective first spacer in an array substrate in some embodiments according to the present disclosure.

FIG. 6A illustrate formation of a third light emitting layer in an array substrate using a third mask plate in some embodiments according to the present disclosure. FIG. 6B illustrate formation of a second light emitting layer in an array substrate using a second mask plate in some embodiments according to the present disclosure. FIG. 6C illustrate formation of a fourth light emitting layer in an array substrate using a fourth mask plate in some embodiments according to the present disclosure. FIG. 6D illustrate formation of a first light emitting layer in an array substrate using a first mask plate in some embodiments according to the present disclosure. FIG. 6E illustrates relative positions of boundaries of apertures of a first mask plate, a second mask plate, a third mask plate, and a fourth mask plate, relative to a respective first spacer in an array substrate in some embodiments according to the present disclosure. Referring to FIG. 6A to FIG. 6E, subsequent to forming the spacers (first spacers PS1 and second spacers PS2), a mask plate (e.g., a fine metal mask plate) is placed on the spacers for deposition of light emitting materials on top of the anodes. In one example, a first mask plate MK1 is used for forming a first light emitting layer on the first anode AD1 of the first subpixel (FIG. 6D), a second mask plate MK2 is used for forming a second light emitting layer on the second anode AD2 of the second subpixel (FIG. 6B), a fourth mask plate MK4 is used for forming a fourth light emitting layer on the fourth anode AD2 of the fourth subpixel (FIG. 6C), a third mask plate MK3 is used for forming a third light emitting layer on the third anode AD3 of the third subpixel (FIG. 6A). A first boundary of an aperture BA1 of the first mask plate MK1 is shown in FIG. 6D and FIG. 6E. A second boundary of an aperture BA2 of the second mask plate MK2 is shown in FIG. 6B and FIG. 6E. A fourth boundary of an aperture BA4 of the fourth mask plate MK4 is shown in FIG. 6C and FIG. 6E. A third boundary of an aperture BA3 of the third mask plate MK3 is shown in FIG. 6D and FIG. 6E.

As shown in FIG. 6A, an orthographic projection of a portion of the third boundary of an aperture BA3 of the third mask plate MK3 on a base substrate substantially overlaps with an orthographic projection of a first central line ML1 of a respective first spacer PS1. The first central line ML1 has a first inclined angle $\alpha$ with respect to the first direction DR1. As used herein, the term "substantially overlap" refers to two orthographic projections at least 50 percent, e.g., at least 60 percent, at least 70 percent, at least 80 percent, at least 90 percent, at least 95 percent, at least 99 percent, or 100 percent overlapping with each other.

As shown in FIG. 6B, an orthographic projection of a portion of the second boundary of an aperture BA2 of the second mask plate MK2 on a base substrate substantially overlaps with an orthographic projection of a first central line ML1 of a respective first spacer PS1. The first central line ML1 has a first inclined angle $\alpha$ with respect to the first direction DR1.

Referring to FIG. 6A, FIG. 6B, and FIG. 6E, in some embodiments, an orthographic projection of a portion of the third boundary of an aperture BA3 of the third mask plate MK3 on a base substrate substantially overlaps with an orthographic projection of a first central line ML1 of a respective first spacer PS1, and an orthographic projection of a portion of the second boundary of an aperture BA2 of the second mask plate MK2 on a base substrate substantially overlaps with an orthographic projection of a first central line ML1 of the respective first spacer PS1. The first central line ML1 has a first inclined angle $\alpha$ with respect to the first direction DR1. Optionally, the first inclined angle $\alpha$ is in a range of 40 degrees to 80 degrees, e.g., 40 degrees to 50 degrees, 50 degrees to 60 degrees, 60 degrees to 70 degrees, or 70 degrees to 80 degrees. Optionally, the first inclined angle $\alpha$ is 60 degrees.

Figure 6F:
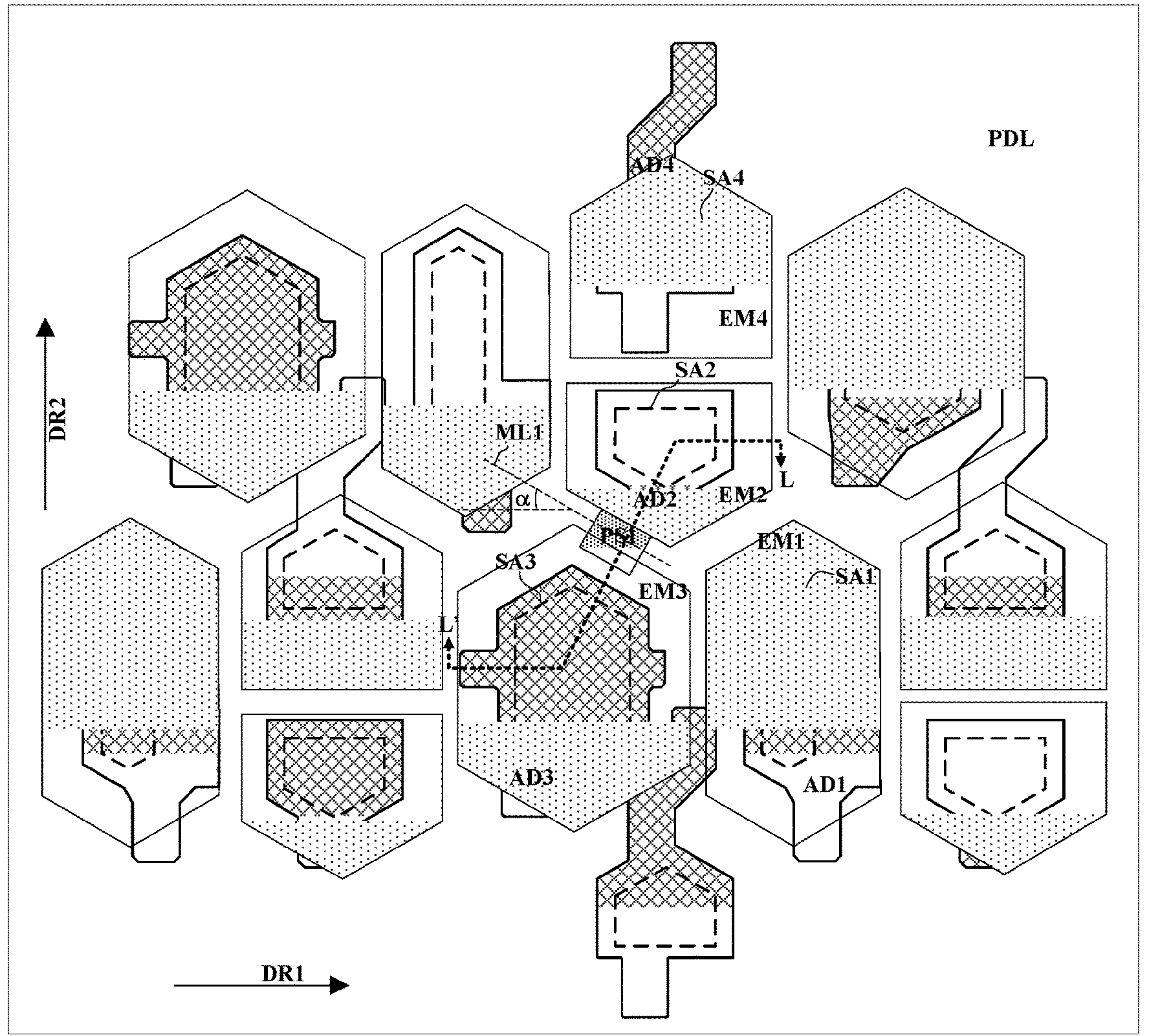
FIG. 6F illustrates relative positions of light emitting layers relative to a respective first spacer in an array substrate in some embodiments according to the present disclosure.

FIG. 6F illustrates relative positions of light emitting layers relative to a respective first spacer in an array substrate in some embodiments according to the present disclosure. Referring to FIG. 6F, the array substrate in some embodiments further includes a first light emitting layer EM1 on a side of the first anode AD1 away from a base substrate, a second light emitting layer EM2 on a side of the second anode AD2 away from the base substrate, a third light emitting layer EM3 on a side of the third anode AD3 away from the base substrate, and a fourth light emitting layer EM4 on a side of the fourth anode AD4 away from the base substrate. In one example, the first subpixel is a red subpixel, the first anode AD1 is an anode of the red subpixel, and the first light emitting layer EM1 is a red light emitting layer; the second subpixel is a first green subpixel, the second anode AD2 is an anode of the first green subpixel, and the second light emitting layer EM2 is a green light emitting layer; the third subpixel is a blue subpixel, the third anode AD3 is an anode of the blue subpixel, and the third light emitting layer EM3 is a blue light emitting layer; the fourth subpixel is a second green subpixel, the fourth anode AD4 is an anode of the second green subpixel, and the fourth light emitting layer EM4 is also a green light emitting layer.

Figure 6G:
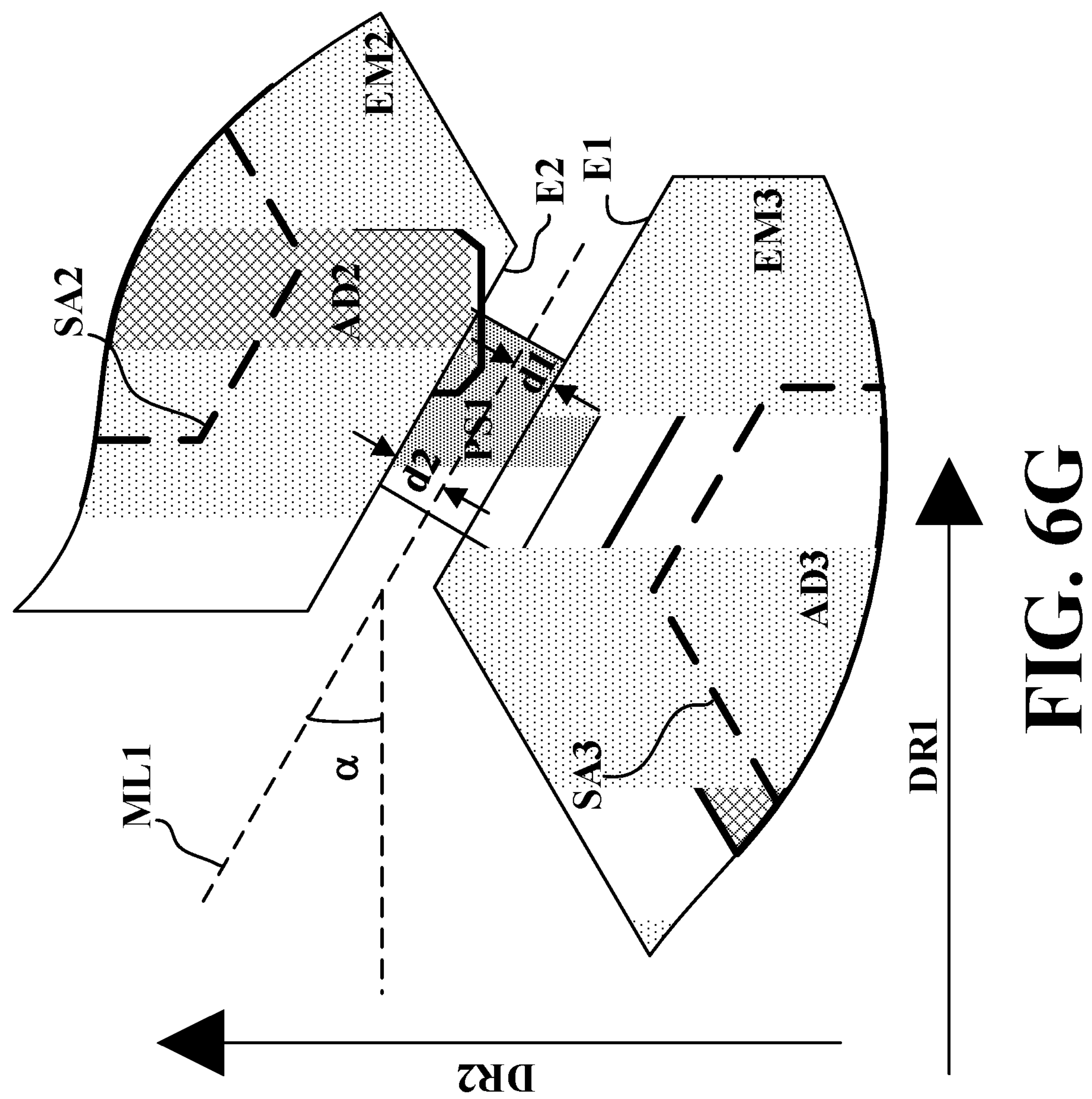
FIG. 6G is a zoom-in view of a region surrounding a respective first spacer in FIG. 6F.

FIG. 6G is a zoom-in view of a region surrounding a respective first spacer in FIG. 6F. Referring to FIG. 6F and FIG. 6G, in some embodiments, an orthographic projection of the third light emitting layer EM3 on a base substrate partially overlaps with an orthographic projection of the respective first spacer PS1 on the base substrate; and an orthographic projection of the second light emitting layer EM2 on the base substrate partially overlaps with the orthographic projection of the respective first spacer PS1 on the base substrate. A first edge E1 of the third light emitting layer EM3 crossing over the respective first spacer PS1 is substantially parallel to a first central line ML1 of the respective first spacer PS1; and a second edge E2 of the second light emitting layer EM2 crossing over the respective first spacer PS1 is substantially parallel to the first central line ML1 of the respective first spacer PS1. As used herein, the term "substantially parallel" means that an angle between two lines is in the range of 0 degree to approximately 15 degrees, e.g., 0 degree to approximately 5 degrees, 5 degree to approximately 10 degrees, or 10 degree to approximately 15 degrees.

Optionally, the first edge E1 is spaced apart from the first central line ML1 by a first distance d1 along a direction perpendicular to the first central line ML1; and the second edge E2 is spaced apart from the first central line ML1 by a second distance d2 along the direction perpendicular to the first central line ML1. Optionally, an average value of the first distance d1 along the first edge E1 is substantially same as an average value of the second distance d2 along the second edge E2. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value. Optionally, the first edge E1 substantially overlaps with the first central line ML1. Optionally, the second edge E2 substantially overlaps with the first central line ML1.

Figure 6H:
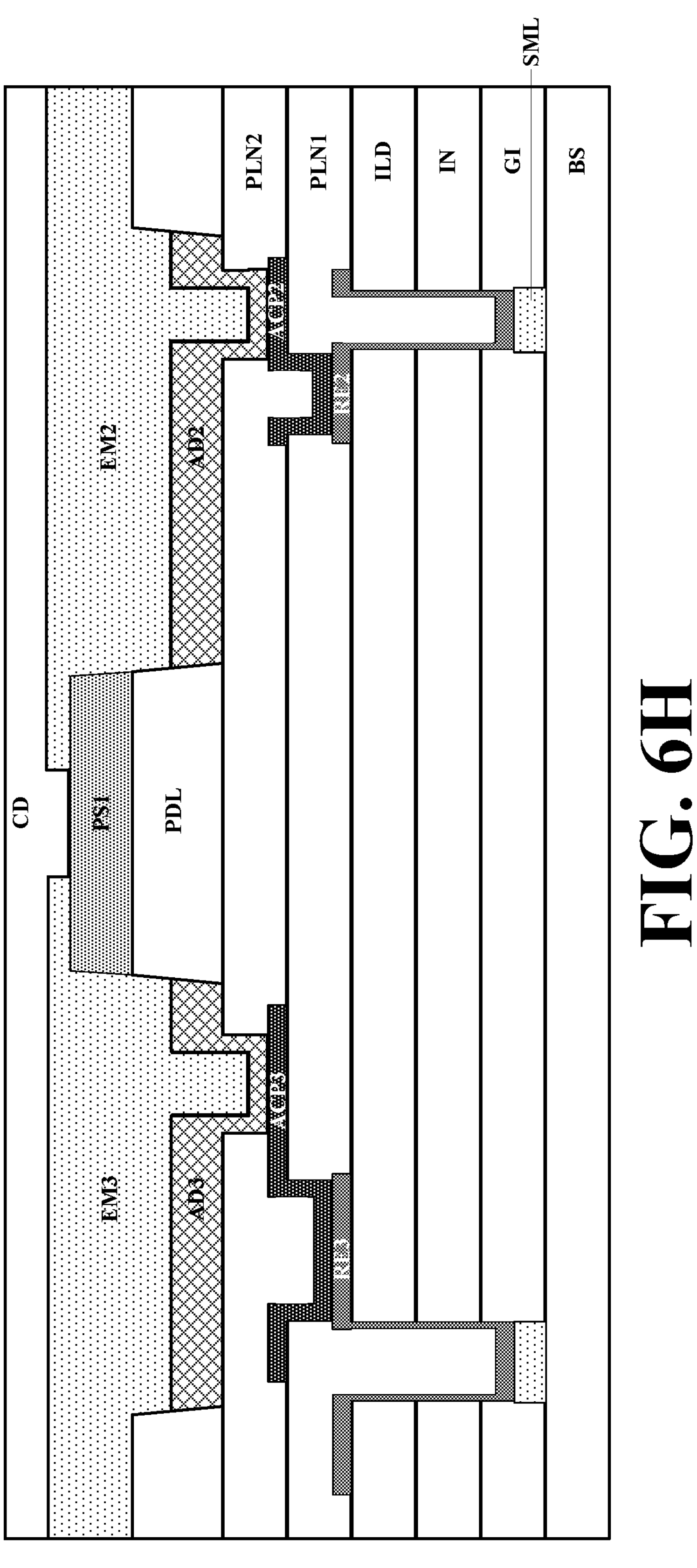
FIG. 6H is a cross-sectional view along an L-L' line in FIG. 6F.

FIG. 6H is a cross-sectional view along an L-L' line in FIG. 6F. Referring to FIG. 6H, the display panel in the display region in some embodiments includes a base substrate BS (e.g., a flexible base substrate); a semiconductor material layer SML (see, also, FIG. 3C) on the base substrate BS; a gate insulating layer GI on a side of the semiconductor material layer SML away from the base substrate BS; an insulating layer IN on a side of the gate insulating layer GI away from the base substrate BS; an inter-layer dielectric layer ILD on a side of the insulating layer IN away from the gate insulating layer GI; a relay electrode layer (e.g., a respective second relay electrode RE2 and a respective third relay electrode RE3 as shown in FIG. 6H) on a side of the inter-layer dielectric layer ILD away from the insulating layer IN; a first planarization layer PLN1 on a side of the relay electrode layer away from the inter-layer dielectric layer ILD; an anode contact pad layer (e.g., a respective second anode contact pad ACP2 and a respective third anode contact pad ACP3 as shown in FIG. 6H) on a side of the first planarization layer PLN1 away from the inter-layer dielectric layer ILD; a second planarization layer PLN2 on side of the anode contact pad layer away from the first planarization layer PLN1; a pixel definition layer PDL defining subpixel apertures and on a side of the second planarization layer PLN2 away from the base substrate BS; a spacer layer (e.g., a respective one of first spacers PS1 as shown in FIG. 6H) on a side of the pixel definition layer PDL away from the second planarization layer PLN2; an anode layer (e.g., the second anode AD2 and the third anode AD3 as shown in FIG. 6H) on a side of the second planarization layer PLN2 away from the first planarization layer PLN1; and a light emitting layer (e.g., a second light emitting layer EM2 and a third light emitting layer EM3) on a side of the anode layer away from the second planarization layer PLN2; and a cathode layer CD on a side of the light emitting layer away from the anode layer.

Figure 6I:
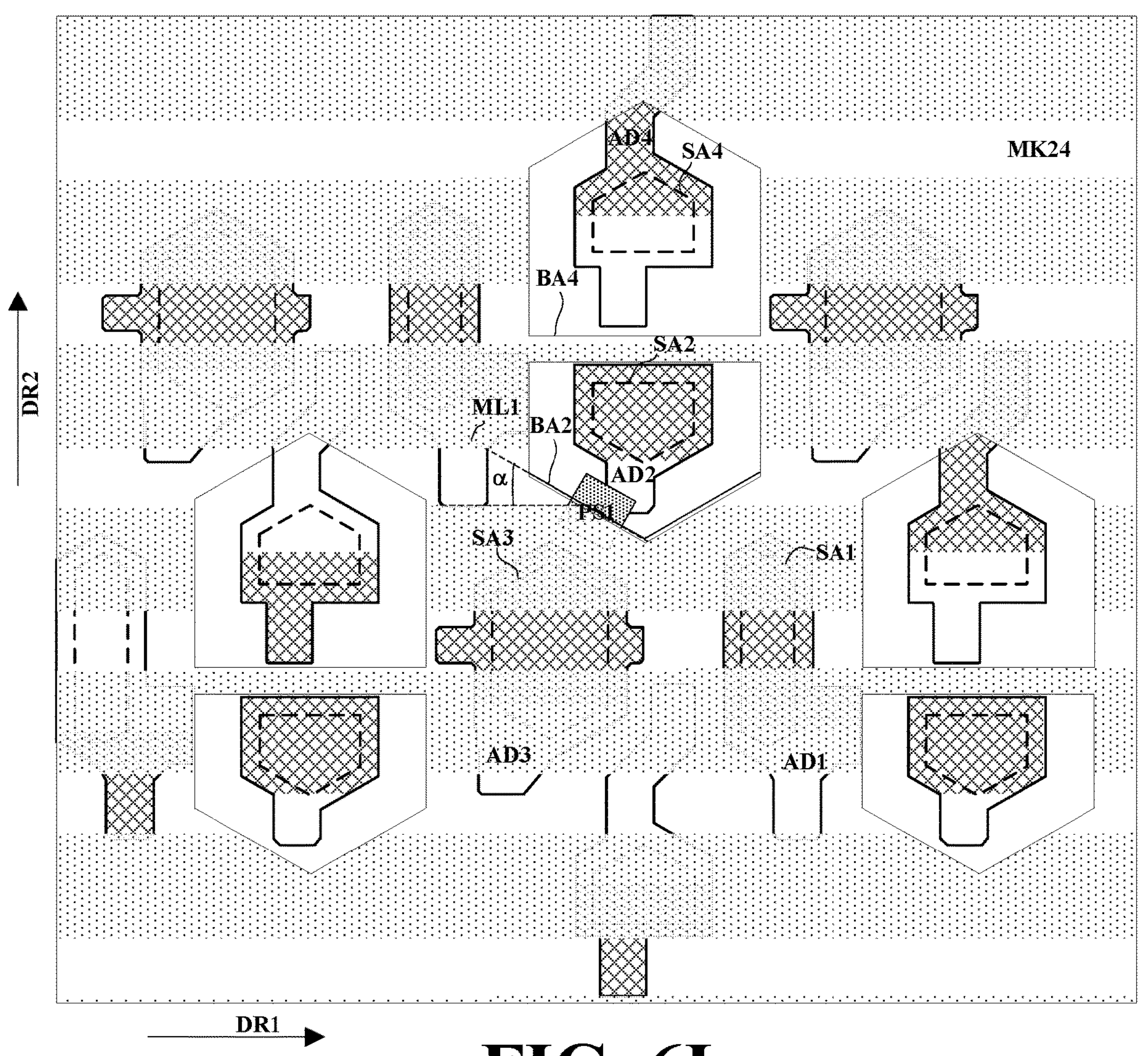
FIG. 6I illustrate formation of a second light emitting layer and a fourth light emitting layer in an array substrate using a same mask plate in some embodiments according to the present disclosure.

FIG. 6I illustrate formation of a second light emitting layer and a fourth light emitting layer in an array substrate using a same mask plate in some embodiments according to the present disclosure. Referring to FIG. 6I, in one example, a same mask plate MK24 is used for forming a second light emitting layer on the second anode AD2 of the second subpixel and a fourth light emitting layer on the fourth anode AD4 of a fourth subpixel (FIG. 6B). A second boundary of an aperture BA2 of the same mask plate MK24 and a fourth boundary of an aperture BA4 of the same mask plate MK24 is shown in FIG. 6I.

Figure 7A:
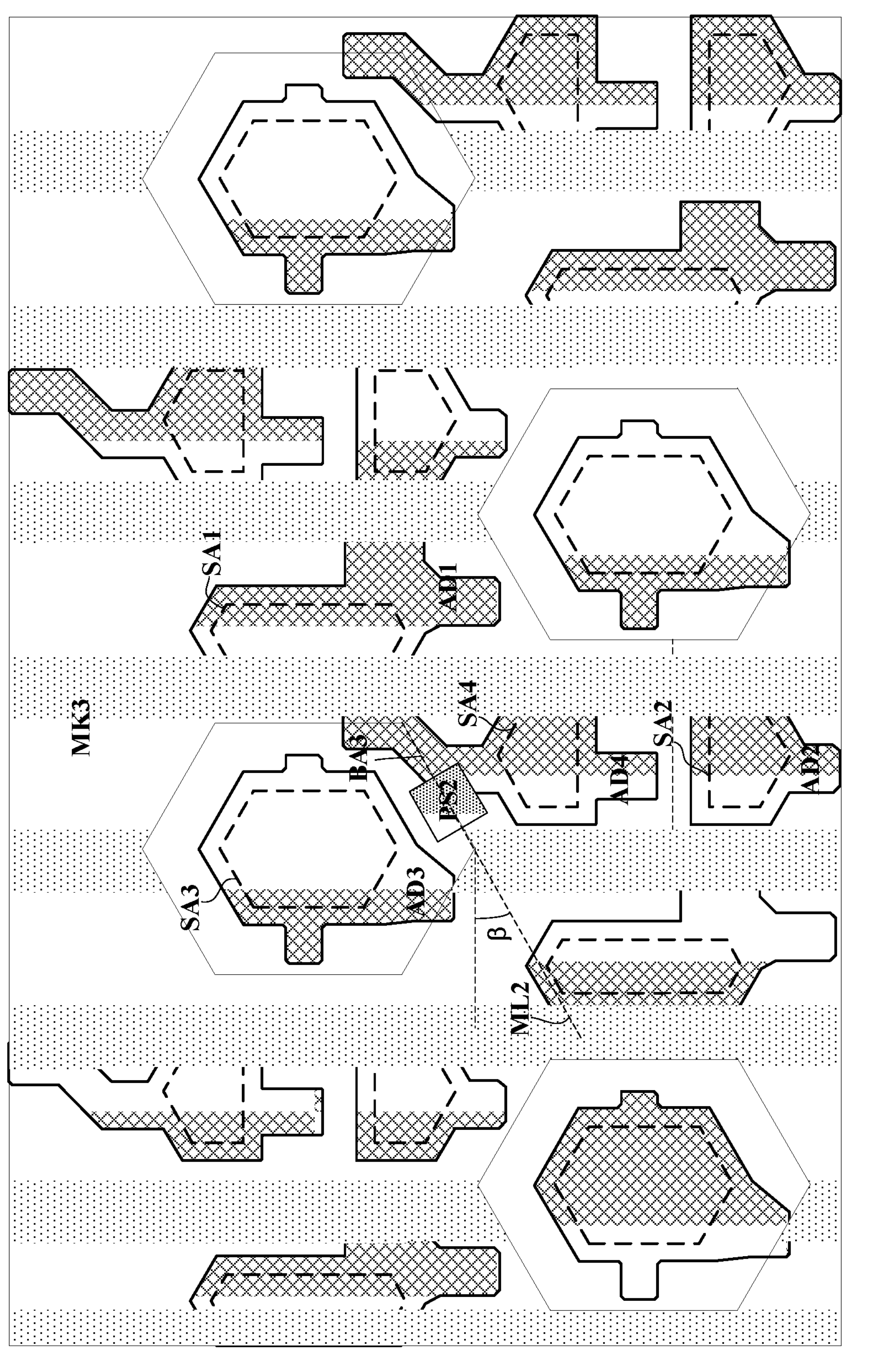
FIG. 7A illustrate formation of a third light emitting layer in an array substrate using a third mask plate in some embodiments according to the present disclosure.
Figure 7B:
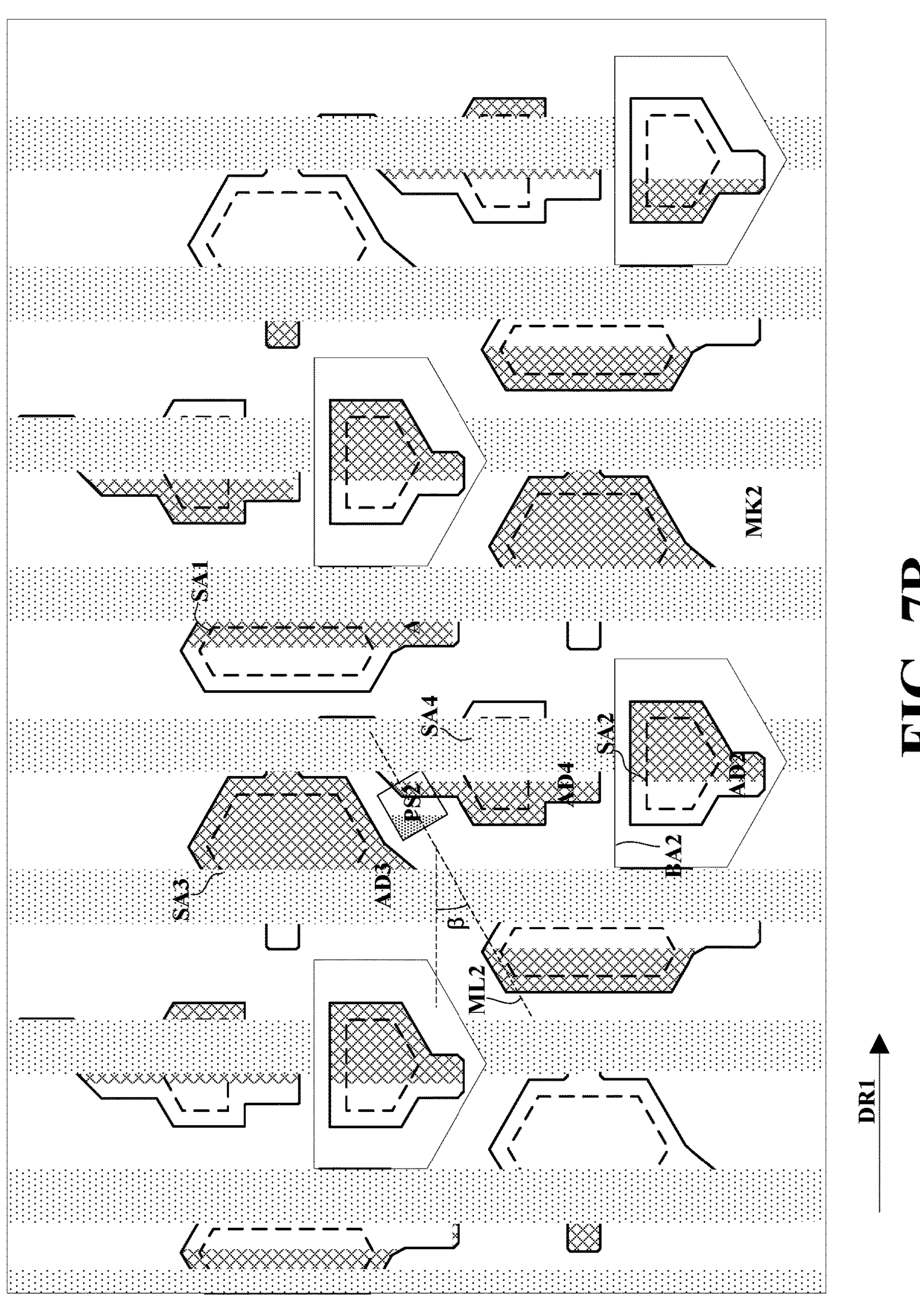
FIG. 7B illustrate formation of a second light emitting layer in an array substrate using a second mask plate in some embodiments according to the present disclosure.
Figure 7C:
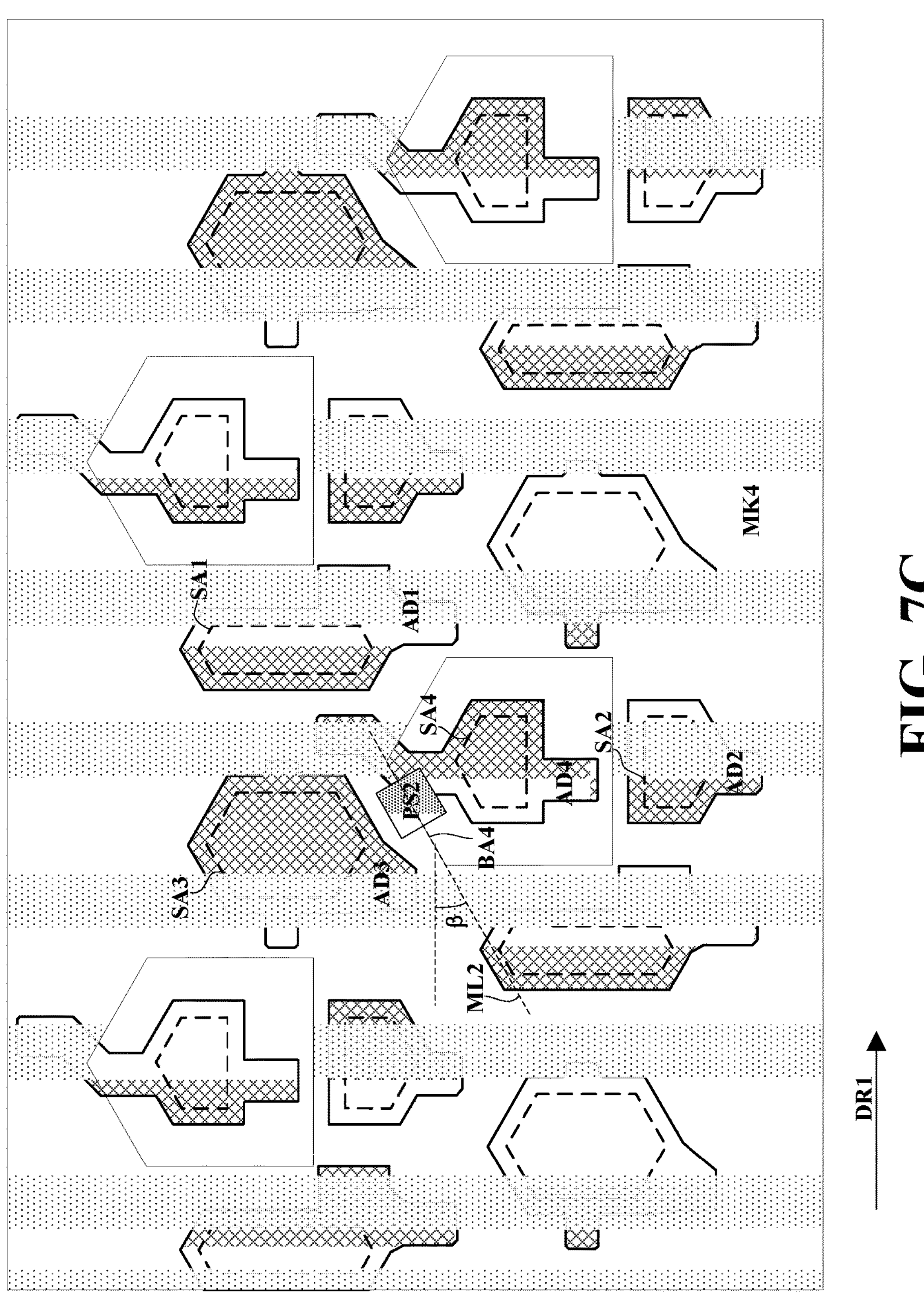
FIG. 7C illustrate formation of a fourth light emitting layer in an array substrate using a fourth mask plate in some embodiments according to the present disclosure.
Figure 7D:
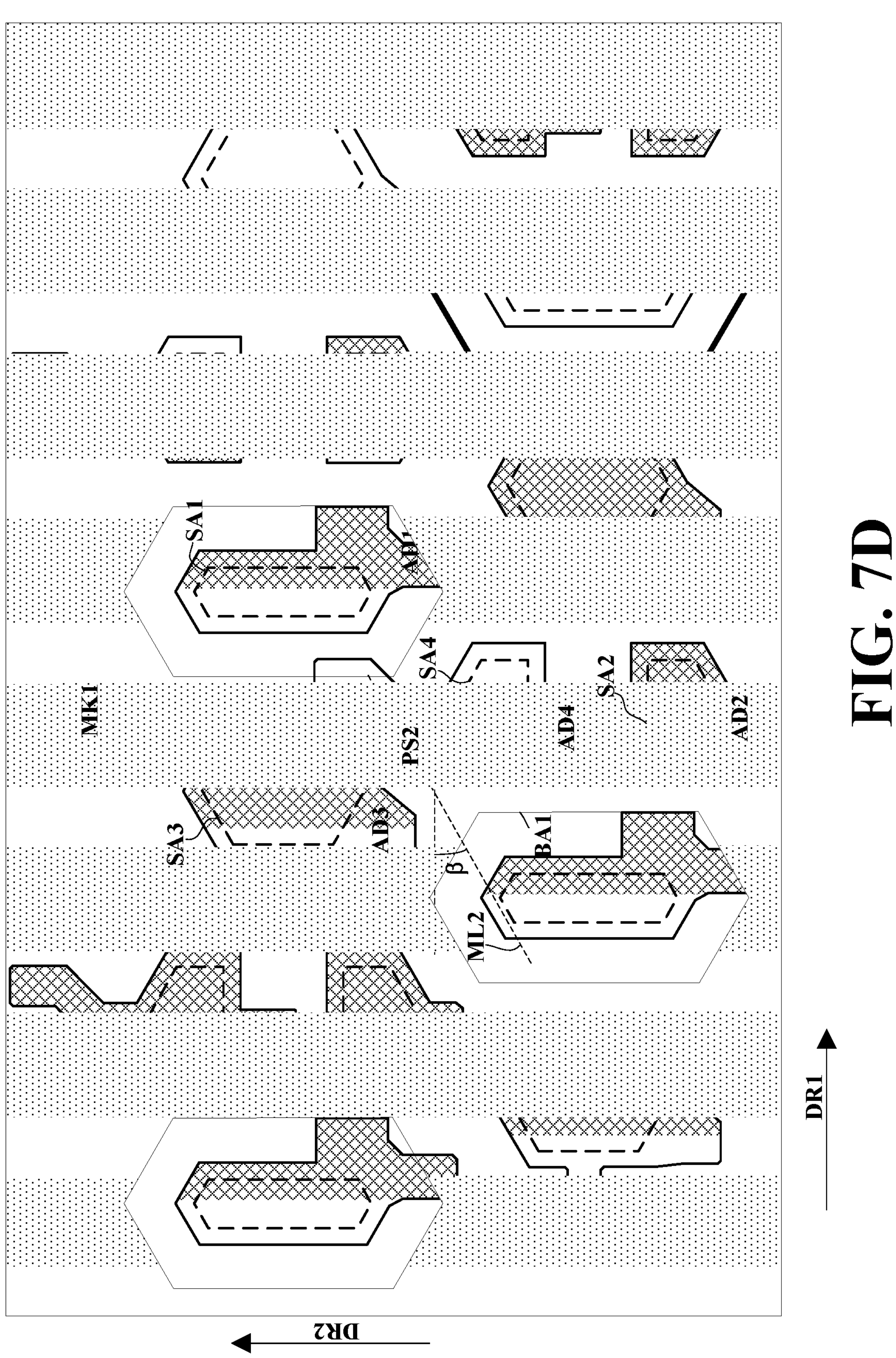
FIG. 7D illustrate formation of a first light emitting layer in an array substrate using a first mask plate in some embodiments according to the present disclosure.
Figure 7E:
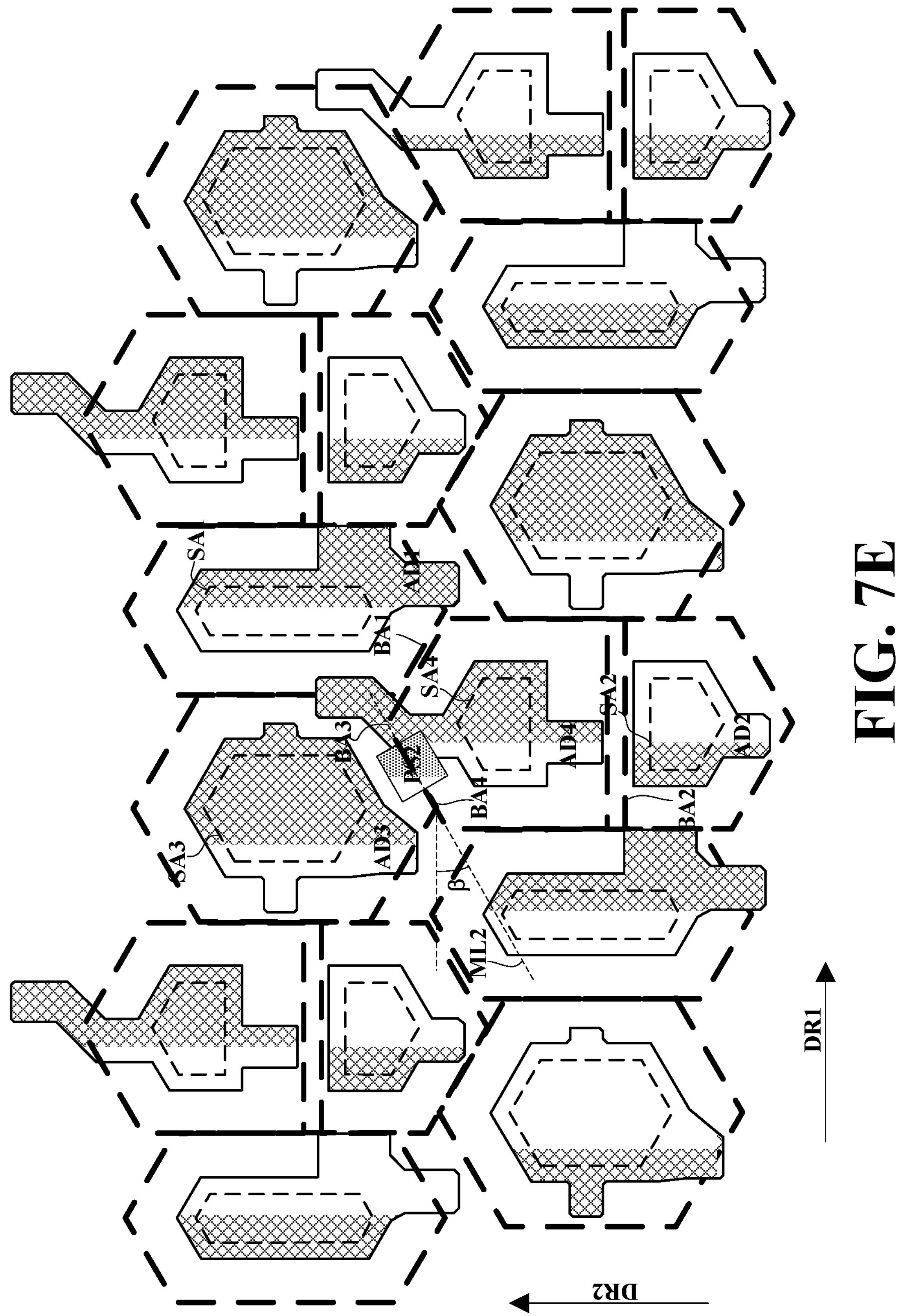
FIG. 7E illustrates relative positions of boundaries of apertures of a first mask plate, a fourth mask plate, a third mask plate, and a fourth mask plate, relative to a respective second spacer in an array substrate in some embodiments according to the present disclosure.

FIG. 7A illustrate formation of a third light emitting layer in an array substrate using a third mask plate in some embodiments according to the present disclosure. FIG. 7B illustrate formation of a second light emitting layer in an array substrate using a second mask plate in some embodiments according to the present disclosure. FIG. 7C illustrate formation of a fourth light emitting layer in an array substrate using a fourth mask plate in some embodiments according to the present disclosure. FIG. 7D illustrate formation of a first light emitting layer in an array substrate using a first mask plate in some embodiments according to the present disclosure. FIG. 7E illustrates relative positions of boundaries of apertures of a first mask plate, a fourth mask plate, a third mask plate, and a fourth mask plate, relative to a respective second spacer in an array substrate in some embodiments according to the present disclosure. Referring to FIG. 7A to FIG. 7E, subsequent to forming the spacers (first spacers PS1 and second spacers PS2), a mask plate (e.g., a fine metal mask plate) is placed on the spacers for deposition of light emitting materials on top of the anodes. In one example, a first mask plate MK1 is used for forming a first light emitting layer on the first anode AD1 of the first subpixel (FIG. 7D), a second mask plate MK2 is used for forming a second light emitting layer on the second anode AD2 of the second subpixel (FIG. 7B), a third mask plate MK3 is used for forming a third light emitting layer on the third anode AD3 of the third subpixel (FIG. 7A), and a fourth mask plate MK4 is used for forming a fourth light emitting layer on the fourth anode AD4 of the fourth subpixel (FIG. 7C). A first boundary of an aperture BA1 of the first mask plate MK1 is shown in FIG. 7D and FIG. 7E. A second boundary of an aperture BA2 of the second mask plate MK2 is shown in FIG. 7B and FIG. 7E. A fourth boundary of an aperture BA4 of the fourth mask plate MK4 is shown in FIG. 7C and FIG. 7E. A third boundary of an aperture BA3 of the third mask plate MK3 is shown in FIG. 7D and FIG. 7E.

As shown in FIG. 7A, an orthographic projection of a portion of the third boundary of an aperture BA3 of the third mask plate MK3 on a base substrate substantially overlaps with an orthographic projection of a second central line ML2 of a respective second spacer PS2. The second central line ML2 has a second inclined angle β with respect to the first direction DR1.

As shown in FIG. 7C, an orthographic projection of a portion of the fourth boundary of an aperture BA4 of the fourth mask plate MK4 on a base substrate substantially overlaps with an orthographic projection of a second central line ML2 of a respective second spacer PS2. The second central line ML2 has a second inclined angle R with respect to the first direction DR1.

Referring to FIG. 7A, FIG. 7B, and FIG. 7E, in some embodiments, an orthographic projection of a portion of the third boundary of an aperture BA3 of the third mask plate MK3 on a base substrate substantially overlaps with an orthographic projection of a second central line ML2 of a respective second spacer PS2, and an orthographic projection of a portion of the fourth boundary of an aperture BA4 of the fourth mask plate MK4 on a base substrate substantially overlaps with an orthographic projection of a second central line ML2 of the respective second spacer PS2. The second central line ML2 has a second inclined angle R with respect to the first direction DR1. Optionally, the second inclined angle R is in a range of 10 degrees to 50 degrees, e.g., 10 degrees to 20 degrees, 20 degrees to 30 degrees, 30 degrees to 40 degrees, or 40 degrees to 50 degrees. Optionally, the second inclined angle β is 30 degrees.

Figure 7F:
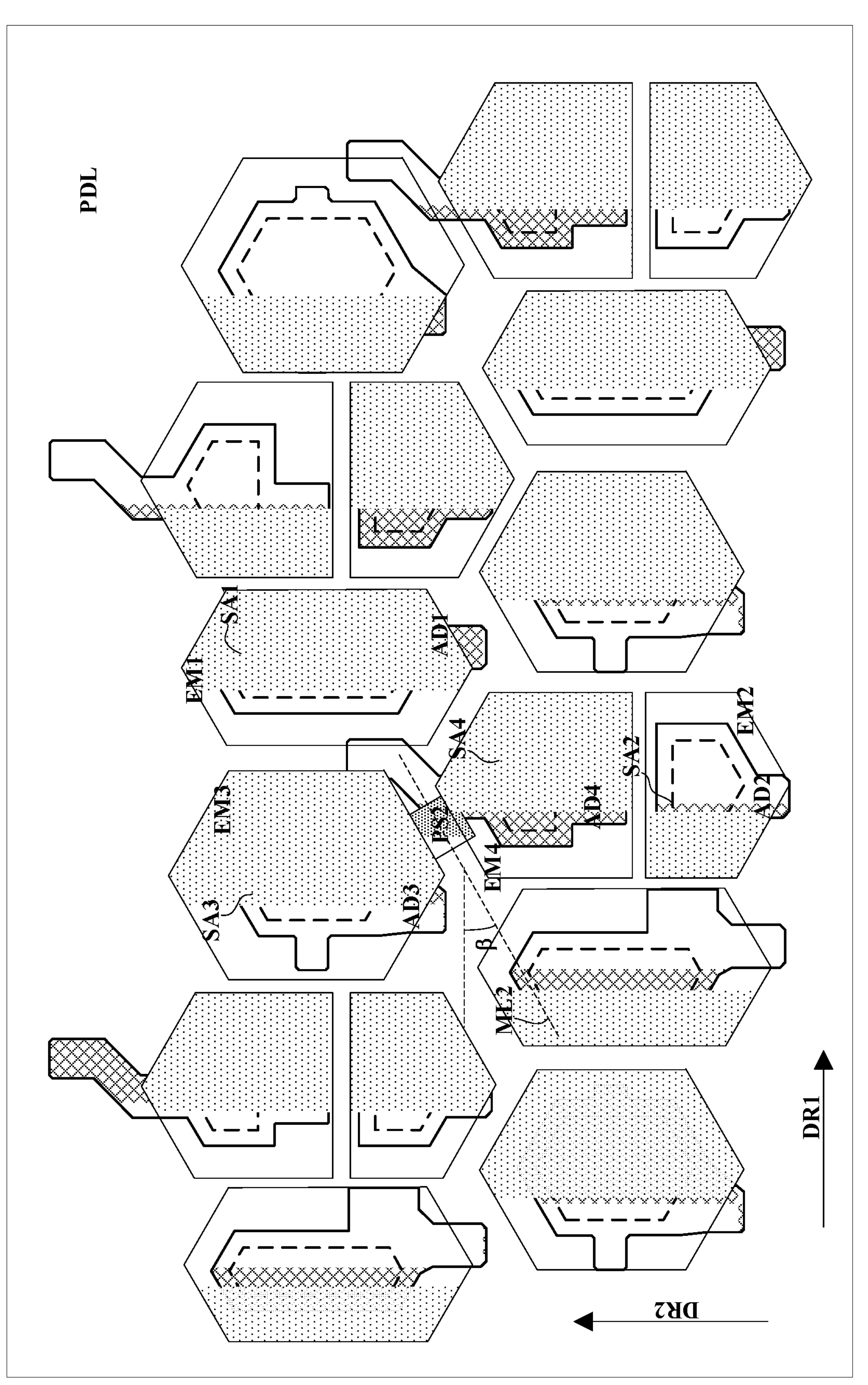
FIG. 7F illustrates relative positions of light emitting layers relative to a respective second spacer in an array substrate in some embodiments according to the present disclosure.

FIG. 7F illustrates relative positions of light emitting layers relative to a respective second spacer in an array substrate in some embodiments according to the present disclosure. Referring to FIG. 7F, the array substrate in some embodiments further includes a first light emitting layer EM1 on a side of the first anode AD1 away from a base substrate, a second light emitting layer EM2 on a side of the second anode AD2 away from the base substrate, a third light emitting layer EM3 on a side of the third anode AD3 away from the base substrate, and a fourth light emitting layer EM4 on a side of the fourth anode AD4 away from the base substrate. In one example, the first subpixel is a red subpixel, the first anode AD1 is an anode of the red subpixel, and the first light emitting layer EM1 is a red light emitting layer; the second subpixel is a first green subpixel, the second anode AD2 is an anode of the first green subpixel, and the second light emitting layer EM2 is a green light emitting layer; the third subpixel is a blue subpixel, the third anode AD3 is an anode of the blue subpixel, and the third light emitting layer EM3 is a blue light emitting layer; the fourth subpixel is a second green subpixel, the fourth anode AD4 is an anode of the second green subpixel, and the fourth light emitting layer EM4 is also a green light emitting layer.

Figure 7G:
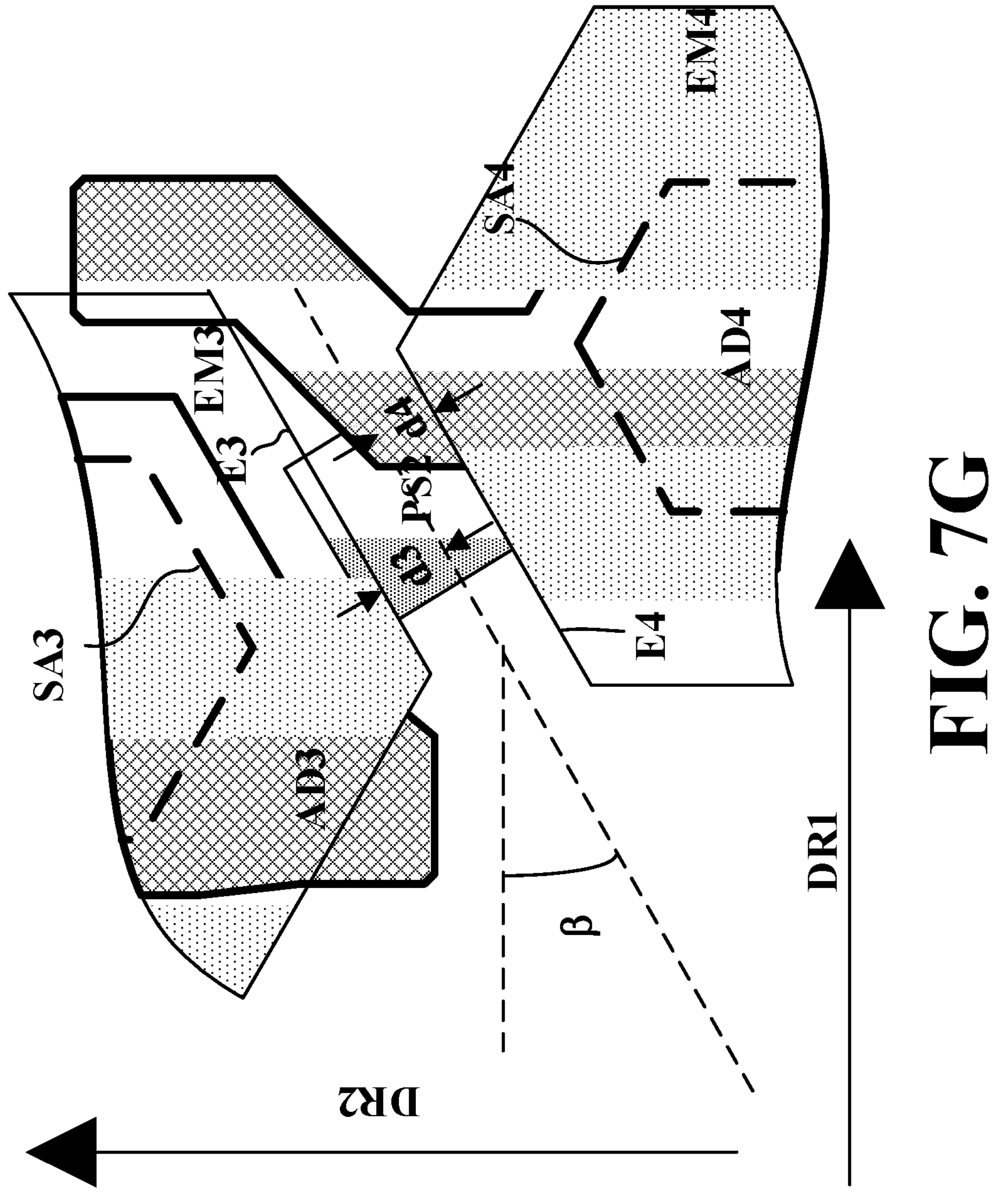
FIG. 7G is a zoom-in view of a region surrounding a respective second spacer in FIG. 7F.

FIG. 7G is a zoom-in view of a region surrounding a respective second spacer in FIG. 7F. Referring to FIG. 7F and FIG. 7G, in some embodiments, an orthographic projection of the third light emitting layer EM3 on a base substrate partially overlaps with an orthographic projection of the respective second spacer PS2 on the base substrate; and an orthographic projection of the fourth light emitting layer EM4 on the base substrate partially overlaps with the orthographic projection of the respective second spacer PS2 on the base substrate. A third edge E3 of the third light emitting layer EM3 crossing over the respective second spacer PS2 is substantially parallel to a second central line ML2 of the respective second spacer PS2; and a fourth edge E4 of the fourth light emitting layer EM4 crossing over the respective second spacer PS2 is substantially parallel to the second central line ML2 of the respective second spacer PS2.

Optionally, the third edge E3 is spaced apart from the second central line ML2 by a third distance d3 along a direction perpendicular to the second central line ML2; and the fourth edge E4 is spaced apart from the second central line ML2 by a fourth distance d4 along the direction perpendicular to the second central line ML2. Optionally, an average value of the third distance d3 along the third edge E3 is substantially same as an average value of the fourth distance d4 along the fourth edge E4. Optionally, the third edge E3 substantially overlaps with the second central line ML2. Optionally, the fourth edge E4 substantially overlaps with the second central line ML2.

Figure 7H:
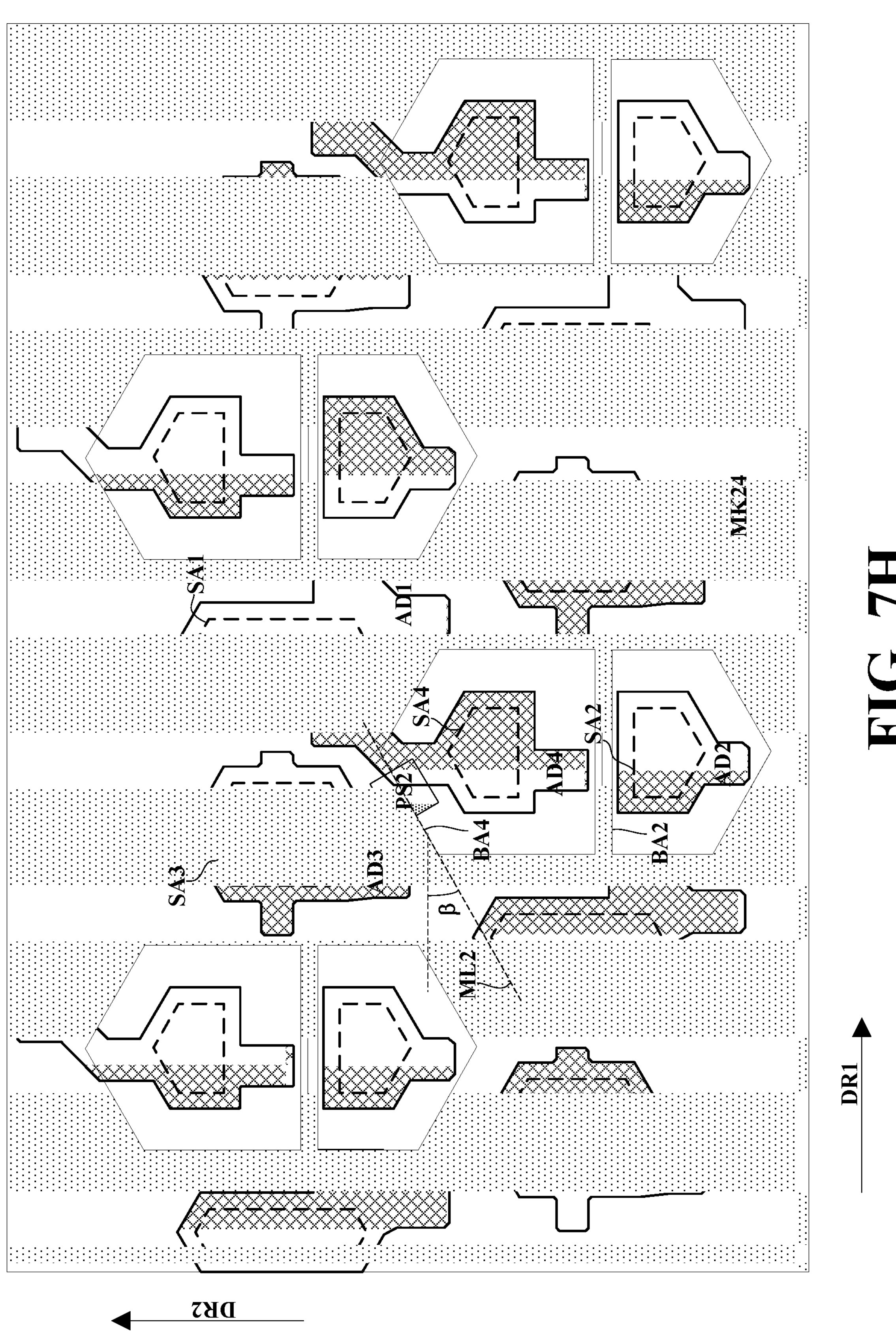
FIG. 7H illustrate formation of a second light emitting layer and a fourth light emitting layer in an array substrate using a same mask plate in some embodiments according to the present disclosure.

FIG. 7H illustrate formation of a second light emitting layer and a fourth light emitting layer in an array substrate using a same mask plate in some embodiments according to the present disclosure. Referring to FIG. 7H, in one example, a same mask plate MK24 is used for forming a second light emitting layer on the second anode AD2 of the second subpixel and a fourth light emitting layer on the fourth anode AD4 of a fourth subpixel. A second boundary of an aperture BA2 of the same mask plate MK24 and a fourth boundary of an aperture BA4 of the same mask plate MK24 is shown in FIG. 7H.

In some embodiments, an orthographic projection of a respective anode in a respective subpixel on a base substrate at least partially overlaps with an orthographic projection of the first node in the respective subpixel on the base substrate. Referring to FIG. 2A, FIG. 3A to FIG. 3H, and FIG. 4A, in some embodiments, an orthographic projection of the first anode AD1 in a respective first subpixel sp1 on the base substrate BS at least partially overlaps with an orthographic projection of the node connecting line Cln in the respective first subpixel sp1 on the base substrate BS; an orthographic projection of the second anode AD2 in a respective second subpixel sp2 on the base substrate BS at least partially overlaps with an orthographic projection of the node connecting line Cln in the respective second subpixel sp2 on the base substrate BS; an orthographic projection of the third anode AD3 in a respective third subpixel sp3 on the base substrate BS at least partially overlaps with an orthographic projection of the node connecting line Cln in the respective third subpixel sp3 on the base substrate BS; and an orthographic projection of the fourth anode AD4 in a respective fourth subpixel sp4 on the base substrate BS at least partially overlaps with an orthographic projection of the node connecting line Cln in the respective fourth subpixel sp4 on the base substrate BS.

Optionally, an orthographic projection of the first anode AD1 in a respective first subpixel sp1 on the base substrate BS at least partially overlaps with an orthographic projection of the first capacitor electrode Ce1 in the respective first subpixel sp1 on the base substrate BS; an orthographic projection of the second anode AD2 in a respective second subpixel sp2 on the base substrate BS at least partially overlaps with an orthographic projection of the first capacitor electrode Ce1 in the respective second subpixel sp2 on the base substrate BS; an orthographic projection of the third anode AD3 in a respective third subpixel sp3 on the base substrate BS at least partially overlaps with an orthographic projection of the first capacitor electrode Ce1 in the respective third subpixel sp3 on the base substrate BS; and an orthographic projection of the fourth anode AD4 in a respective fourth subpixel sp4 on the base substrate BS at least partially overlaps with an orthographic projection of the first capacitor electrode Ce1 in the respective fourth subpixel sp4 on the base substrate BS.

Optionally, an orthographic projection of the first anode AD1 in a respective first subpixel sp1 on the base substrate BS at least partially overlaps with an orthographic projection of the second capacitor electrode Ce2 in the respective first subpixel sp1 on the base substrate BS; an orthographic projection of the second anode AD2 in a respective second subpixel sp2 on the base substrate BS at least partially overlaps with an orthographic projection of the second capacitor electrode Ce2 in the respective second subpixel sp2 on the base substrate BS; an orthographic projection of the third anode AD3 in a respective third subpixel sp3 on the base substrate BS at least partially overlaps with an orthographic projection of the second capacitor electrode Ce2 in the respective third subpixel sp3 on the base substrate BS; and an orthographic projection of the fourth anode AD4 in a respective fourth subpixel sp4 on the base substrate BS at least partially overlaps with an orthographic projection of the second capacitor electrode Ce2 in the respective fourth subpixel sp4 on the base substrate BS.

Optionally, an orthographic projection of the first anode AD1 in a respective first subpixel sp1 on the base substrate BS at least partially overlaps with an orthographic projection of the active layer ACTd of the driving transistor Td in the respective first subpixel sp1 on the base substrate BS; an orthographic projection of the second anode AD2 in a respective second subpixel sp2 on the base substrate BS at least partially overlaps with an orthographic projection of the active layer ACTd of the driving transistor Td in the respective second subpixel sp2 on the base substrate BS; an orthographic projection of the third anode AD3 in a respective third subpixel sp3 on the base substrate BS at least partially overlaps with an orthographic projection of the active layer ACTd of the driving transistor Td in the respective third subpixel sp3 on the base substrate BS; and an orthographic projection of the fourth anode AD4 in a respective fourth subpixel sp4 on the base substrate BS at least partially overlaps with an orthographic projection of the active layer ACTd of the driving transistor Td in the respective fourth subpixel sp4 on the base substrate BS.

Optionally, an orthographic projection of the first anode AD1 in a respective first subpixel sp1 on the base substrate BS covers an orthographic projection of a portion of the node connecting line Cln at a position connecting to the first capacitor electrode Ce1 in the respective first subpixel sp1 on the base substrate BS; an orthographic projection of the second anode AD2 in a respective second subpixel sp2 on the base substrate BS covers an orthographic projection of a portion of the node connecting line Cln at a position connecting to the first capacitor electrode Ce1 in the respective second subpixel sp2 on the base substrate BS; an orthographic projection of the third anode AD3 in a respective third subpixel sp3 on the base substrate BS covers an orthographic projection of a portion of the node connecting line Cln at a position connecting to the first capacitor electrode Ce1 in the respective third subpixel sp3 on the base substrate BS; and an orthographic projection of the fourth anode AD4 in a respective fourth subpixel sp4 on the base substrate BS covers an orthographic projection of a portion of the node connecting line Cln at a position connecting to the first capacitor electrode Ce1 in the respective fourth subpixel sp4 on the base substrate BS.

In the present array substrate, the orthographic projections of the anodes respectively at least partially overlaps with the N1 nodes of the pixel driving circuits, loading among various anodes and loading among various pixel driving circuits in respective subpixels can be maintained consistent with respect to each other, improving image display uniformity.

Figure 8A:
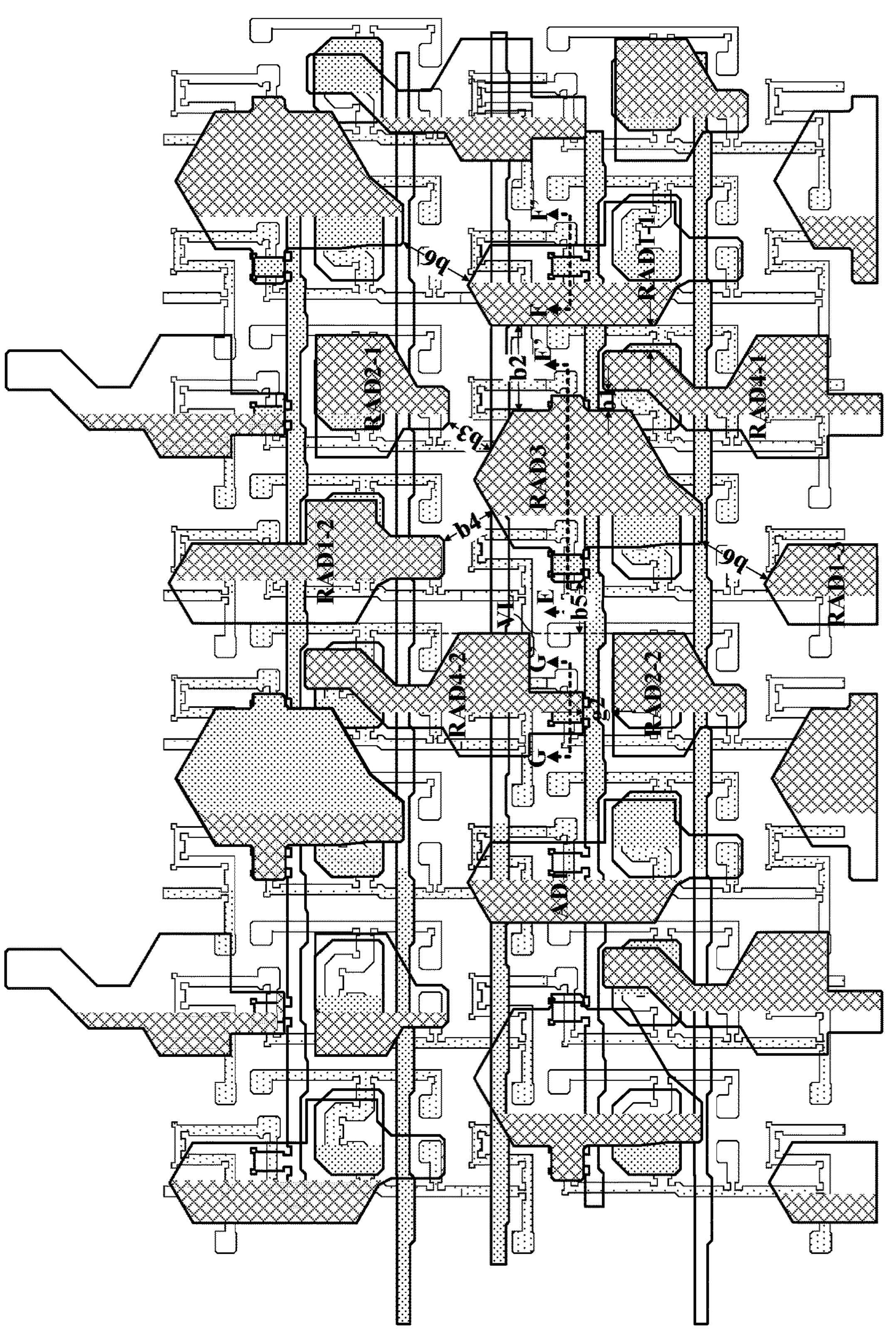
FIG. 8A is a diagram illustrating anodes, a first signal line layer, and a semiconductor material layer in an array substrate in some embodiments according to the present disclosure.

FIG. 8A is a diagram illustrating anodes, a first signal line layer, and a semiconductor material layer in an array substrate in some embodiments according to the present disclosure. FIG. 8B is a cross-sectional view along an E-E' line in FIG. 8A. Referring to FIG. 8A and FIG. 8B, in some embodiments, an orthographic projection of the third anode AD3 on the base substrate BS at least partially overlaps with an orthographic projection of a third transistor in a respective third subpixel on the base substrate BS and at least partially overlaps with an orthographic projection of a third transistor in a respective fourth subpixel adjacent to the respective third subpixel on the base substrate BS. Optionally, the orthographic projection of the third anode AD3 on the base substrate BS covers an orthographic projection of a source electrode S3 of the third transistor in the respective third subpixel on the base substrate BS, partially overlaps with an orthographic projection of an active layer ACT3 of the third transistor in the respective third subpixel on the base substrate BS, and partially overlaps with an orthographic projection of an active layer ACT3 of the third transistor in the respective fourth subpixel on the base substrate BS.

FIG. 8C is a cross-sectional view along an F-F' line in FIG. 8A. Referring to FIG. 8A and FIG. 8C, in some embodiments, an orthographic projection of the first anode AD1 on the base substrate BS at least partially overlaps with an orthographic projection of a third transistor in a respective first subpixel on the base substrate BS. Optionally, the orthographic projection of the first anode AD1 on the base substrate BS partially overlaps with an orthographic projection of a source electrode S3 of the third transistor in the respective first subpixel on the base substrate BS, and partially overlaps with an orthographic projection of an active layer ACT3 of the third transistor in the respective first subpixel on the base substrate BS.

In the present array substrate, the orthographic projections of the anodes respectively at least partially overlaps with the active layers of the third transistors. Because the anodes are typically made of a reflective material, they can prevent ultraviolet rays from irradiating on the active layer, thereby protecting the transistors.

FIG. 8D is a cross-sectional view along a G-G' line in FIG. 8A. Referring to FIG. 8A and FIG. 8D, in some embodiments, an orthographic projection of the fourth anode AD4 on the base substrate BS at least partially overlaps with an orthographic projection of a third transistor in a respective second subpixel on the base substrate BS. Optionally, the orthographic projection of the fourth anode AD4 on the base substrate BS partially overlaps with an orthographic projection of a source electrode S3 of the third transistor in the respective second subpixel on the base substrate BS, and partially overlaps with an orthographic projection of an active layer ACT3 of the third transistor in the respective second subpixel on the base substrate BS.

Referring to FIG. 8A, counter-clock wise, a respective third anode RAD3 is adjacent to a first respective fourth anode RAD4-1, a first respective first anode RAD1-1, a first respective second anode RAD2-1, a second respective first anode RAD1-2, a second respective fourth anode RAD4-2, a second respective second anode RAD2-2, and a third respective first anode RAD1-3. Optionally, clock wise, a respective third anode RAD3 is adjacent to a first respective fourth anode RAD4-1, a first respective first anode RAD1-1, a first respective second anode RAD2-1, a second respective first anode RAD1-2, a second respective fourth anode RAD4-2, a second respective second anode RAD2-2, and a third respective first anode RAD1-3. Optionally, a shortest distance between the respective third anode RAD3 and any one of the first respective fourth anode RAD4-1, the first respective first anode RAD1-1, the first respective second anode RAD2-1, the second respective first anode RAD1-2, a virtual line VL passing through co-linear edges respectively from the second respective fourth anode RAD4-2 and the second respective second anode RAD2-2, or the third respective first anode RAD1-3 is in a range of 2.0 μm to 22 μm. Optionally, a shortest distance between the respective third anode RAD3 and the first respective fourth anode RAD4-1 is less than a shortest distance between the respective third anode RAD3 and the third respective first anode RAD1-3, less than a shortest distance between the respective third anode RAD3 and the first respective first anode RAD1-1, less than a shortest distance between the respective third anode RAD3 and the second respective first anode RAD1-2, less than a shortest distance between the respective third anode RAD3 and a virtual line passing through co-linear edges respectively from the second respective fourth anode RAD4-2 and the second respective second anode RAD2-2, and less than a shortest distance between the respective third anode RAD3 and the first respective second anode RAD2-1. Optionally, a shortest distance between the respective third anode RAD3 and the third respective first anode RAD1-3 is greater than a shortest distance between the respective third anode RAD3 and the first respective first anode RAD1-1, which is greater than a shortest distance between the respective third anode RAD3 and the second respective first anode RAD1-2, which is greater than a shortest distance between the respective third anode RAD3 and a virtual line passing through co-linear edges respectively from the second respective fourth anode RAD4-2 and the second respective second anode RAD2-2, which is greater than a shortest distance between the respective third anode RAD3 and the first respective second anode RAD2-1, which is greater than a shortest distance between the respective third anode RAD3 and the first respective fourth anode RAD4-1. Optionally, a shortest distance b1 between the respective third anode RAD3 and the first respective fourth anode RAD4-1 is in a range of 2.0 μm to 5.0 μm (e.g., 2.0 μm to 2.5 μm, 2.5 μm to 3.0 μm, 3.0 μm to 3.5 μm, 3.5 μm to 4.0 μm, 4.0 μm to 4.5 μm, 4.5 μm to 5.0 μm, or optionally 4.0 μm); a shortest distance b2 between the respective third anode RAD3 and the first respective first anode RAD1-1 is in a range of 8.0 μm to 20.0 μm (e.g., 8.0 μm to 9.0 μm, 9.0 μm to 10.0 μm, 10.0 μm to 11.0 μm, 11.0 μm to 12.0 μm, 12.0 μm to 13.0 μm, 13.0 μm to 14.0 μm, 14.0 μm to 15.0 μm, 15.0 μm to 16.0 μm, 16.0 μm to 17.0 μm, 17.0 μm to 18.0 μm, 18.0 μm to 19.0 μm, 19.0 μm to 20.0 μm, or optionally 13.7 μm); a shortest distance b3 between the respective third anode RAD3 and the first respective second anode RAD2-1 is in a range of 5.0 μm to 15.0 μm (e.g., 5.0 μm to 6.0 μm, 6.0 μm to 7.0 μm, 7.0 μm to 8.0 μm, 8.0 μm to 9.0 μm, 9.0 μm to 10.0 μm, 10.0 μm to 11.0 μm, 11.0 μm to 12.0 μm, 12.0 μm to 13.0 μm, 13.0 μm to 14.0 μm, 14.0 μm to 15.0 μm, or optionally 9.5 μm); a shortest distance b4 between the respective third anode RAD3 and the second respective first anode RAD1-2 is in a range of 7.0 μm to 17.0 μm (e.g., 7.0 μm to 8.0 μm, 8.0 μm to 9.0 μm, 9.0 μm to 10.0 μm, 10.0 μm to 11.0 μm, 11.0 μm to 12.0 μm, 12.0 μm to 13.0 μm, 13.0 μm to 14.0 μm, 14.0 μm to 15.0 μm, 15.0 μm to 16.0 μm, 16.0 μm to 17.0 μm, or optionally 9.5 μm); a shortest distance b5 between the respective third anode RAD3 and a virtual line VL passing through co-linear edges respectively from the second respective fourth anode RAD4-2 and the second respective second anode RAD2-2 is in a range of 5.0 μm to 16.0 μm (e.g., 5.0 μm to 6.0 μm, 6.0 μm to 7.0 μm, 7.0 μm to 8.0 μm, 8.0 μm to 9.0 μm, 9.0 μm to 10.0 μm, 10.0 μm to 11.0 μm, 11.0 μm to 12.0 μm, 12.0 μm to 13.0 μm, 13.0 μm to 14.0 μm, 14.0 μm to 15.0 μm, 15.0 μm to 16.0 μm, or optionally 10.0 μm); and a shortest distance b6 between the respective third anode RAD3 and the third respective first anode RAD1-3 is in a range of 9.0 μm to 22.0 μm (e.g., 9.0 μm to 10.0 μm, 10.0 μm to 11.0 μm, 11.0 μm to 12.0 μm, 12.0 μm to 13.0 μm, 13.0 μm to 14.0 μm, 14.0 μm to 15.0 μm, 15.0 μm to 16.0 μm, 16.0 μm to 17.0 μm, 17.0 μm to 18.0 μm, 18.0 μm to 19.0 μm, 19.0 μm to 20.0 μm, 20.0 μm to 21.0 μm, 21.0 μm to 22.0 μm, or optionally 14.8 μm).

Figure 8E:
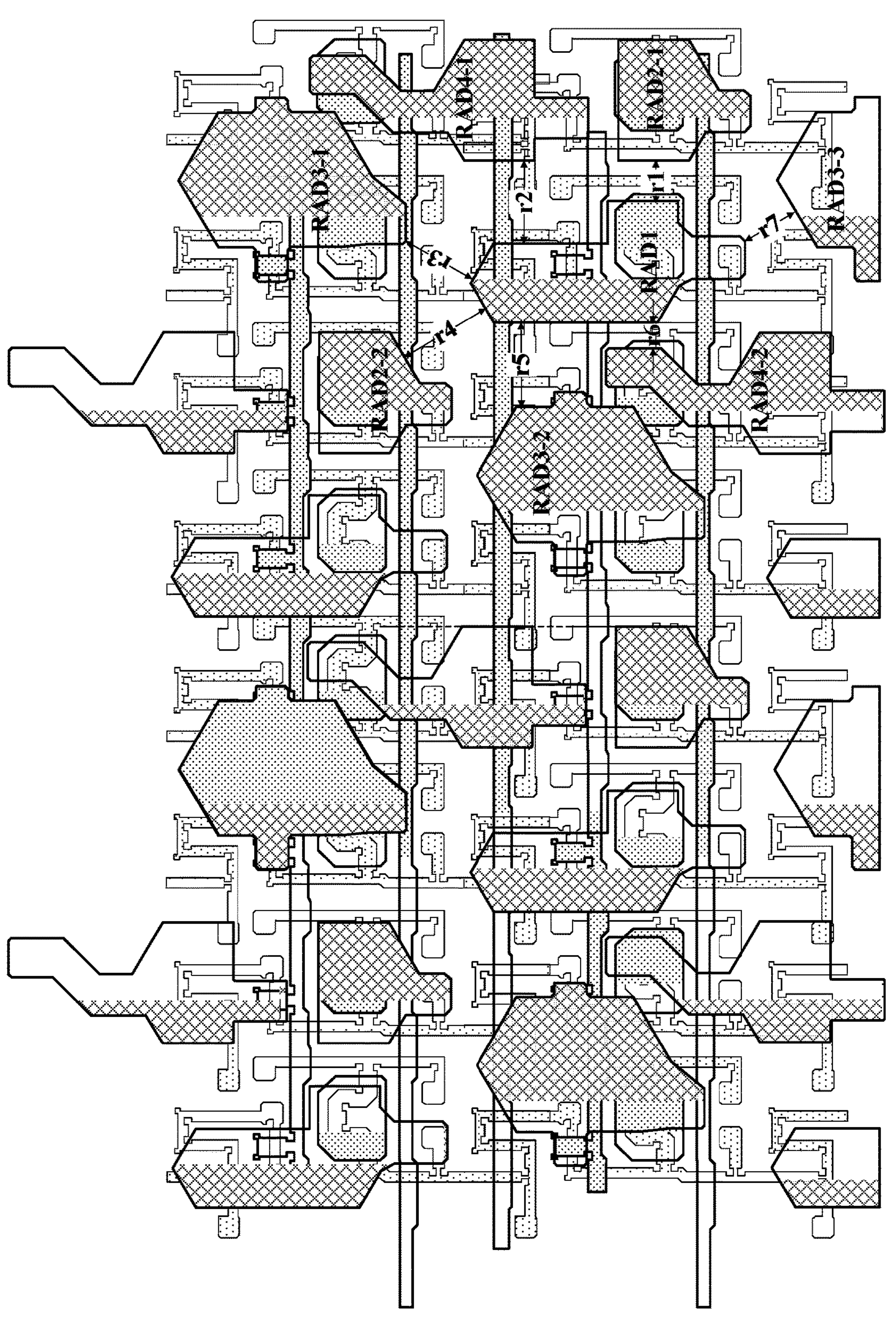
FIG. 8E is a diagram illustrating anodes, a first signal line layer, and a semiconductor material layer in an array substrate in some embodiments according to the present disclosure.

FIG. 8E is a diagram illustrating anodes, a first signal line layer, and a semiconductor material layer in an array substrate in some embodiments according to the present disclosure. Referring to FIG. 8E, counter-clock wise, a respective first anode RAD1 is adjacent to a first respective second anode RAD2-1, a first respective fourth anode RAD4-1, a first respective third anode RAD3-1, a second respective second anode RAD2-2, a second respective third anode RAD3-2, a second respective fourth anode RAD4-2, and a third respective third anode RAD3-3. Optionally, clock wise, a respective first anode RAD1 is adjacent to a first respective second anode RAD2-1, a first respective fourth anode RAD4-1, a first respective third anode RAD3-1, a second respective second anode RAD2-2, a second respective third anode RAD3-2, a second respective fourth anode RAD4-2, and a third respective third anode RAD3-3. Optionally, a shortest distance between the respective first anode RAD1 and any one of the first respective second anode RAD2-1, the first respective fourth anode RAD4-1, the first respective third anode RAD3-1, the second respective second anode RAD2-2, the second respective third anode RAD3-2, the second respective fourth anode RAD4-2, or the third respective third anode RAD3-3 in in a range of 3.0 μm to 25 μm. Optionally, a shortest distance between the respective first anode RAD1 and the second respective fourth anode RAD4-2 is less than a shortest distance between the respective first anode RAD1 and the second respective second anode RAD2-2, less than a shortest distance between the respective first anode RAD1 and the first respective fourth anode RAD4-1, less than a shortest distance between the respective first anode RAD1 and the first respective third anode RAD3-1, less than a shortest distance between the respective first anode RAD1 and the second respective third anode RAD3-2, less than a shortest distance between the respective first anode RAD1 and the third respective third anode RAD3-3, and less than a shortest distance between the respective first anode RAD1 and the first respective second anode RAD2-1. Optionally, a shortest distance between the respective first anode RAD1 and the second respective second anode RAD2-2 is greater than a shortest distance between the respective first anode RAD1 and the first respective fourth anode RAD4-1, which is greater than a shortest distance between the respective first anode RAD1 and the first respective third anode RAD3-1, which is greater than a shortest distance between the respective first anode RAD1 and the second respective third anode RAD3-2, which is greater than a shortest distance between the respective first anode RAD1 and the third respective third anode RAD3-3, which is greater than a shortest distance between the respective first anode RAD1 and the first respective second anode RAD2-1, which is greater than a shortest distance between the respective first anode RAD1 and the second respective fourth anode RAD4-2. Optionally, a shortest distance r1 between the respective first anode RAD1 and the first respective second anode RAD2-1 is in a range of 3.0 μm to 14.0 μm (e.g., 3.0 μm to 4.0 μm, 4.0 μm to 5.0 μm, 5.0 μm to 6.0 μm, 6.0 μm to 7.0 μm, 7.0 μm to 8.0 μm, 8.0 μm to 9.0 μm, 9.0 μm to 10.0 μm, 10.0 μm to 11.0 μm, 11.0 μm to 12.0 μm, 12.0 μm to 13.0 μm, 13.0 μm to 14.0 μm, or optionally 7.85 μm); a shortest distance r2 between the respective first anode RAD1 and the first respective fourth anode RAD4-1 is in a range of 10.0 μm to 24.0 μm (e.g., 10.0 μm to 10.5 μm, 10.5 μm to 11.5 μm, 11.5 μm to 12.5 μm, 12.5 μm to 13.5 μm, 13.5 μm to 14.5 μm, 14.5 μm to 15.5 μm, 15.5 μm to 16.5 μm, 16.5 μm to 17.5 μm, 17.5 μm to 18.5 μm, 18.5 μm to 19.5 μm, 19.5 μm to 20.5 μm, 20.5 μm to 21.5 μm, 21.5 μm to 22.5 μm, 22.5 μm to 23.5 μm, 23.5 μm to 24.0 μm, or optionally 16.6 μm); a shortest distance r3 (same as b6) between the respective first anode RAD1 and the first respective third anode RAD3-1 is in a range of 9.0 μm to 21.0 μm (e.g., 9.0 μm to 10.0 μm, 10.0 μm to 11.0 μm, 11.0 μm to 12.0 μm, 12.0 μm to 13.0 μm, 13.0 μm to 14.0 μm, 14.0 μm to 15.0 μm, 15.0 μm to 16.0 μm, 16.0 μm to 17.0 μm, 17.0 μm to 18.0 μm, 18.0 μm to 19.0

μm, 19.0 μm to 20.0 μm, 20.0 μm to 21.0 μm, or optionally 14.8 μm); a shortest distance r4 between the respective first anode RAD1 and the second respective second anode RAD2-2 is in a range of 11.0 μm to 25.0 μm (e.g., 11.0 μm to 12.0 μm, 12.0 μm to 13.0 μm, 13.0 μm to 14.0 μm, 14.0 μm to 15.0 μm, 15.0 μm to 16.0 μm, 16.0 μm to 17.0 μm, 17.0 μm to 18.0 μm, 18.0 μm to 19.0 μm, 19.0 μm to 20.0 μm, 20.0 μm to 21.0 μm, 21.0 μm to 22.0 μm, 22.0 μm to 23.0 μm, 23.0 μm to 24.0 μm, 24.0 μm to 25.0 μm, or optionally 18.2 μm); a shortest distance r5 (same as b2) between the respective first anode RAD1 and the second respective third anode RAD3-2 is in a range of 8.0 μm to 20.0 μm (e.g., 8.0 μm to 9.0 μm, 9.0 μm to 10.0 μm, 10.0 μm to 11.0 μm, 11.0 μm to 12.0 μm, 12.0 μm to 13.0 μm, 13.0 μm to 14.0 μm, 14.0 μm to 15.0 μm, 15.0 μm to 16.0 μm, 16.0 μm to 17.0 μm, 17.0 μm to 18.0 μm, 18.0 μm to 19.0 μm, 19.0 μm to 20.0 μm, or optionally 13.7 μm); a shortest distance r6 between the respective first anode RAD1 and the second respective fourth anode RAD4-2 is in a range of 2.5 μm to 7.5 μm (e.g., 2.5 μm to 3.5 μm, 3.5 μm to 4.5 μm, 4.5 μm to 5.5 μm, 5.5 μm to 6.5 μm, 6.5 μm to 7.5 μm, or optionally 5.0 μm); and a shortest distance r7 (same as b4) between the respective first anode RAD1 and the third respective third anode RAD3-3 is in a range of 7.0 μm to 16.0 μm (e.g., 7.0 μm to 8.0 μm, 8.0 μm to 9.0 μm, 9.0 μm to 10.0 μm, 10.0 μm to 11.0 μm, 11.0 μm to 12.0 μm, 12.0 μm to 13.0 μm, 13.0 μm to 14.0 μm, 14.0 μm to 15.0 μm, 15.0 μm to 16.0 μm, or optionally 9.5 μm).

Figure 8F:
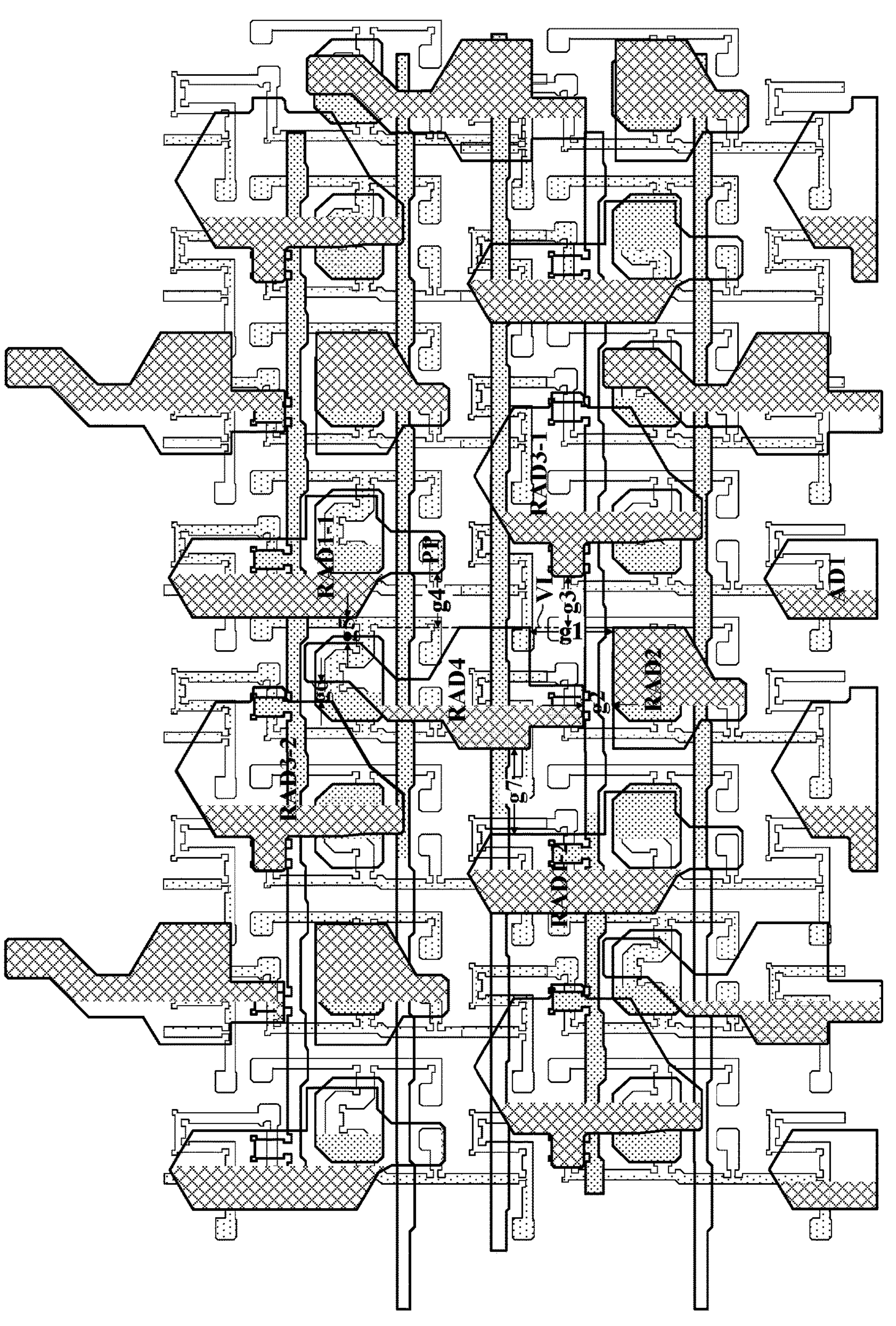
FIG. 8F is a diagram illustrating anodes, a first signal line layer, and a semiconductor material layer in an array substrate in some embodiments according to the present disclosure.

FIG. 8F is a diagram illustrating anodes, a first signal line layer, and a semiconductor material layer in an array substrate in some embodiments according to the present disclosure. Referring to FIG. 8F, counter-clock wise, a respective fourth anode RAD4 is adjacent to a respective second anode RAD2, a first respective third anode RAD3-1, a first respective first anode RAD1-1, a second respective third anode RAD3-2, and a second respective first anode RAD1-2. Optionally, clock wise, a respective fourth anode RAD4 is adjacent to a respective second anode RAD2, a first respective third anode RAD3-1, a first respective first anode RAD1-1, a second respective third anode RAD3-2, and a second respective first anode RAD1-2. Optionally, a shortest distance between the respective fourth anode RAD4 and any one of the first respective first anode RAD1-1, the second respective third anode RAD3-2, or the second respective first anode RAD1-2 is in a range of 2.0 μm to 25.0 μm. Optionally, a shortest distance between the respective fourth anode RAD4 and the second respective first anode RAD1-2 is greater than a shortest distance between the respective fourth anode RAD4 and the first respective first anode RAD1-1, and greater than a shortest distance between the respective fourth anode RAD4 and the second respective third anode RAD3-2. Optionally, a distance g1 between the respective fourth anode RAD4 and the respective second anode RAD2, and along a virtual line VL passing through co-linear edges respectively from the respective fourth anode RAD4 and the respective second anode RAD2, is in a range of 10.0 μm to 25.0 μm (e.g., 10.0 μm to 10.5 μm, 10.5 μm to 11.5 μm, 11.5 μm to 12.5 μm, 12.5 μm to 13.5 μm, 13.5 μm to 14.5 μm, 14.5 μm to 15.5 μm, 15.5 μm to 16.5 μm, 16.5 μm to 17.5 μm, 17.5 μm to 18.5 μm, 18.5 μm to 19.5 μm, 19.5 μm to 20.5 μm, 20.5 μm to 21.5 μm, 21.5 μm to 22.5 μm, 22.5 μm to 23.5 μm, 23.5 μm to 24.5 μm, 24.5 μm to 25.0 μm, or optionally 16.3 μm); a shortest distance g3 (same as b5) between the first respective third anode RAD3-1 and a virtual line VL passing through co-linear edges respectively from the respective fourth anode RAD4 and the respective second anode RAD2 is in a range of 6.0 μm to 15.0 μm (e.g., 6.0 μm to 7.0 μm, 7.0 μm to 8.0 μm, 8.0 μm to 9.0 μm, 9.0 μm to 10.0 μm, 10.0 μm to 11.0 μm, 11.0 μm to 12.0 μm, 12.0 μm to 13.0 μm, 13.0 μm to 14.0 μm, 14.0 μm to 15.0 μm, or optionally 10.0 μm); a shortest distance g4 between a protrusion portion PP of the first respective first anode RAD1-1 that is closest to the respective fourth anode, and the virtual line VL passing through the co-linear edges respectively from the respective fourth anode RAD4 and the respective second anode RAD2 is in a range of 5.0 μm to 16.0 μm (e.g., 5.0 μm to 6.0 μm, 6.0 μm to 7.0 μm, 7.0 μm to 8.0 μm, 8.0 μm to 9.0 μm, 9.0 μm to 10.0 μm, 10.0 μm to 11.0 μm, 11.0 μm to 12.0 μm, 12.0 μm to 13.0 μm, 13.0 μm to 14.0 μm, 14.0 μm to 15.0 μm, 15.0 μm to 16.0 μm, or optionally 10.7 μm); a shortest distance g5 (same as r6) between the respective fourth anode RAD4 and the first respective first anode RAD1-1 is in a range of 2.5 μm to 7.5 μm (e.g., 2.5 μm to 3.5 μm, 3.5 μm to 4.5 μm, 4.5 μm to 5.5 μm, 5.5 μm to 6.5 μm, 6.5 μm to 7.5 μm, or optionally 5.0 μm); a shortest distance g6 (same as b1) between the respective fourth anode RAD4 and the second respective third anode RAD3-2 is in a range of 2.0 μm to 5.0 μm (e.g., 2.0 μm to 2.5 μm, 2.5 μm to 3.0 μm, 3.0 μm to 3.5 μm, 3.5 μm to 4.0 μm, 4.0 μm to 4.5 μm, 4.5 μm to 5.0 μm, or optionally 4.0 μm); and a shortest distance g7 (same as r2) between the respective fourth anode RAD4 and the second respective first anode RAD1-2 is in a range of 10.0 μm to 25.0 μm (e.g., 10.0 μm to 10.5 μm, 10.5 μm to 11.5 μm, 11.5 μm to 12.5 μm, 12.5 μm to 13.5 μm, 13.5 μm to 14.5 μm, 14.5 μm to 15.5 μm, 15.5 μm to 16.5 μm, 16.5 μm to 17.5 μm, 17.5 μm to 18.5 μm, 18.5 μm to 19.5 μm, 19.5 μm to 20.5 μm, 20.5 μm to 21.5 μm, 21.5 μm to 22.5 μm, 22.5 μm to 23.5 μm, 23.5 μm to 24.5 μm, 24.5 μm to 25.0 μm, or optionally 16.6 μm).

The shortest distance g1 in the present array substrate is greater than that in a typical array substrate. By enlarging the shortest distance g1, the illuminance centers of pixels in the array substrate can have a significantly more uniform distribution.

Figure 9A:
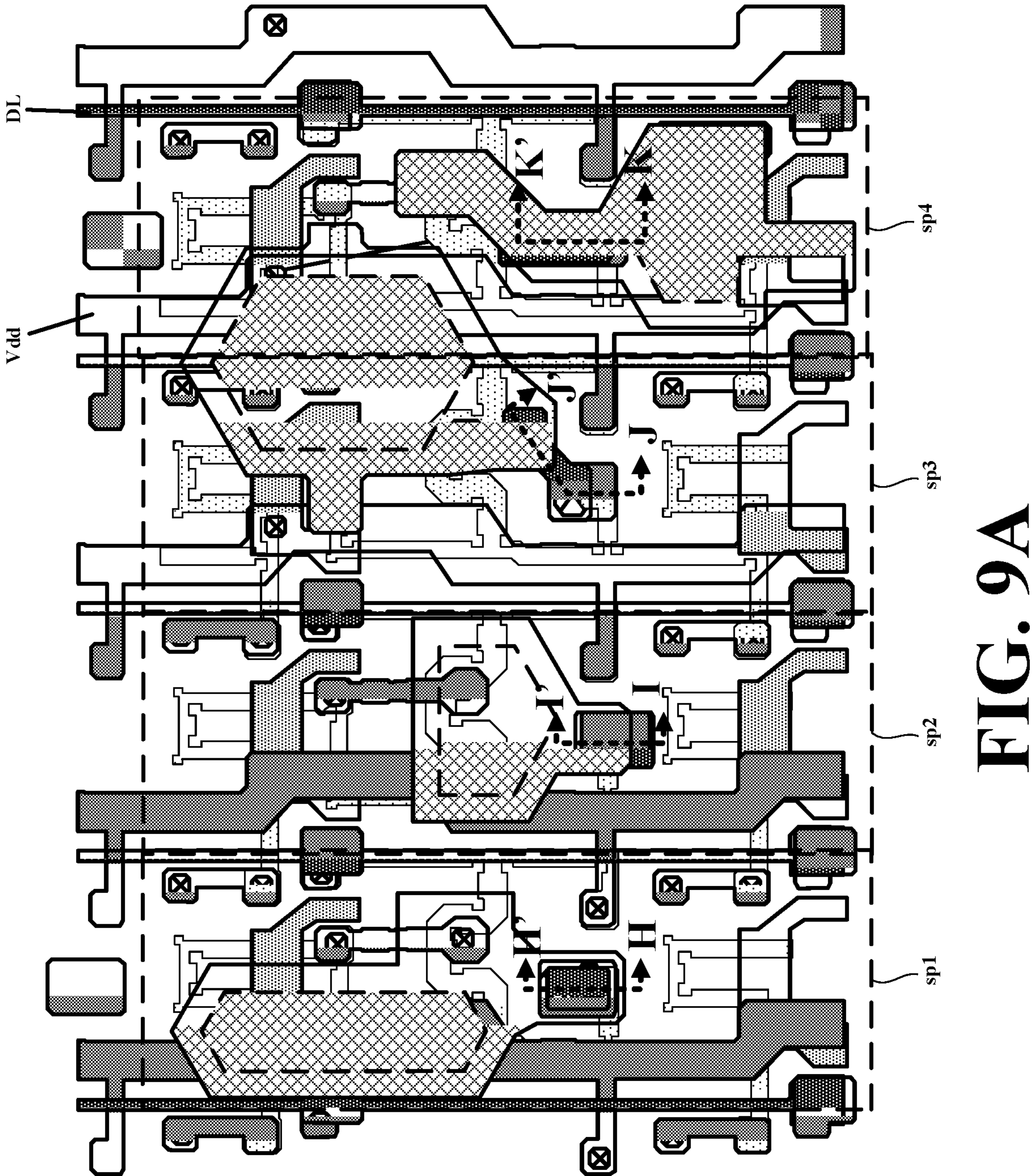
FIG. 9A is a diagram illustrating anodes, a first signal line layer, a second signal line layer, and a semiconductor material layer in an array substrate in some embodiments according to the present disclosure.
Figure 9B:
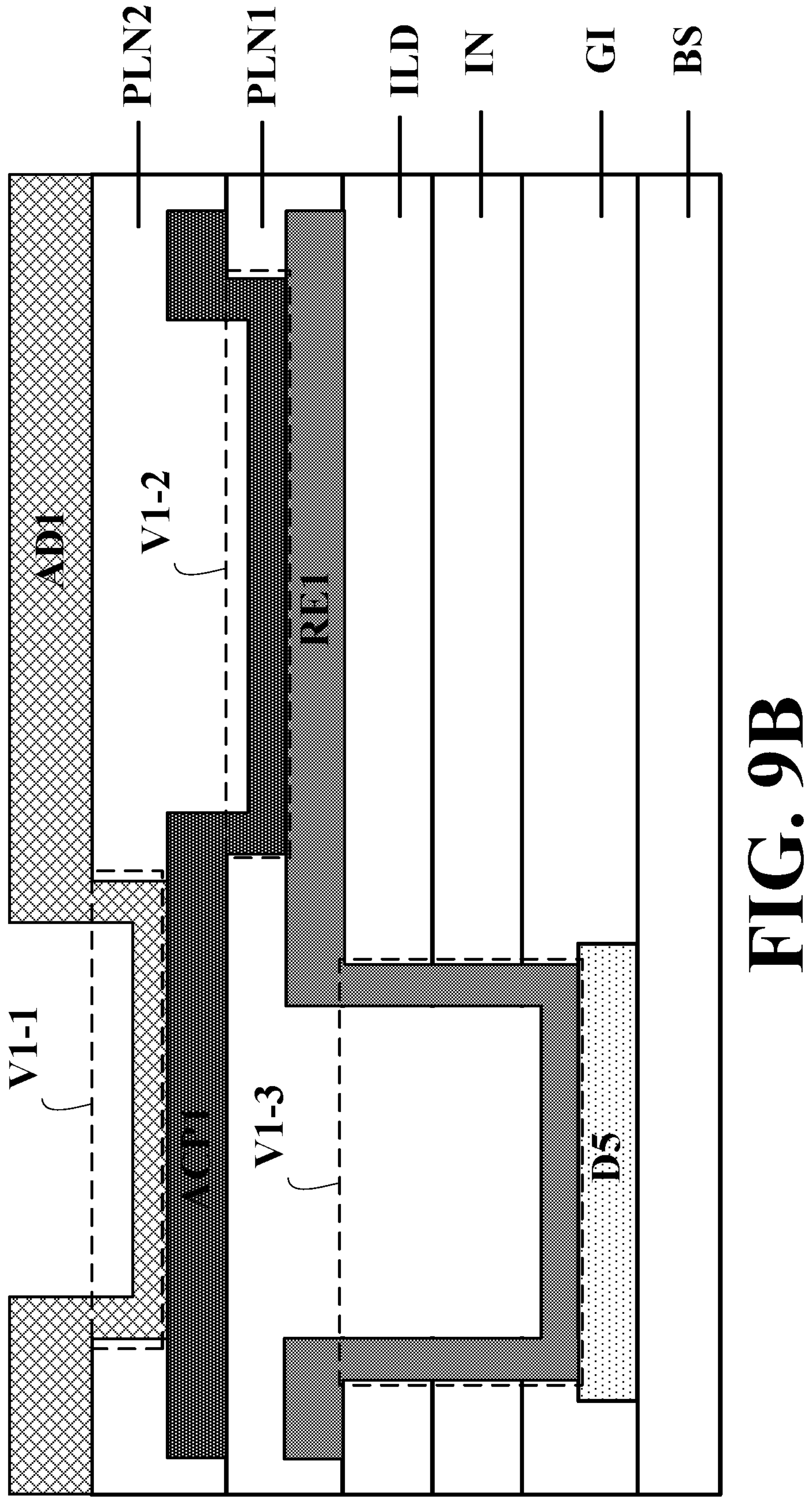
FIG. 9B is a cross-sectional view along an H-H' line in FIG. 9A.
Figure 9C:
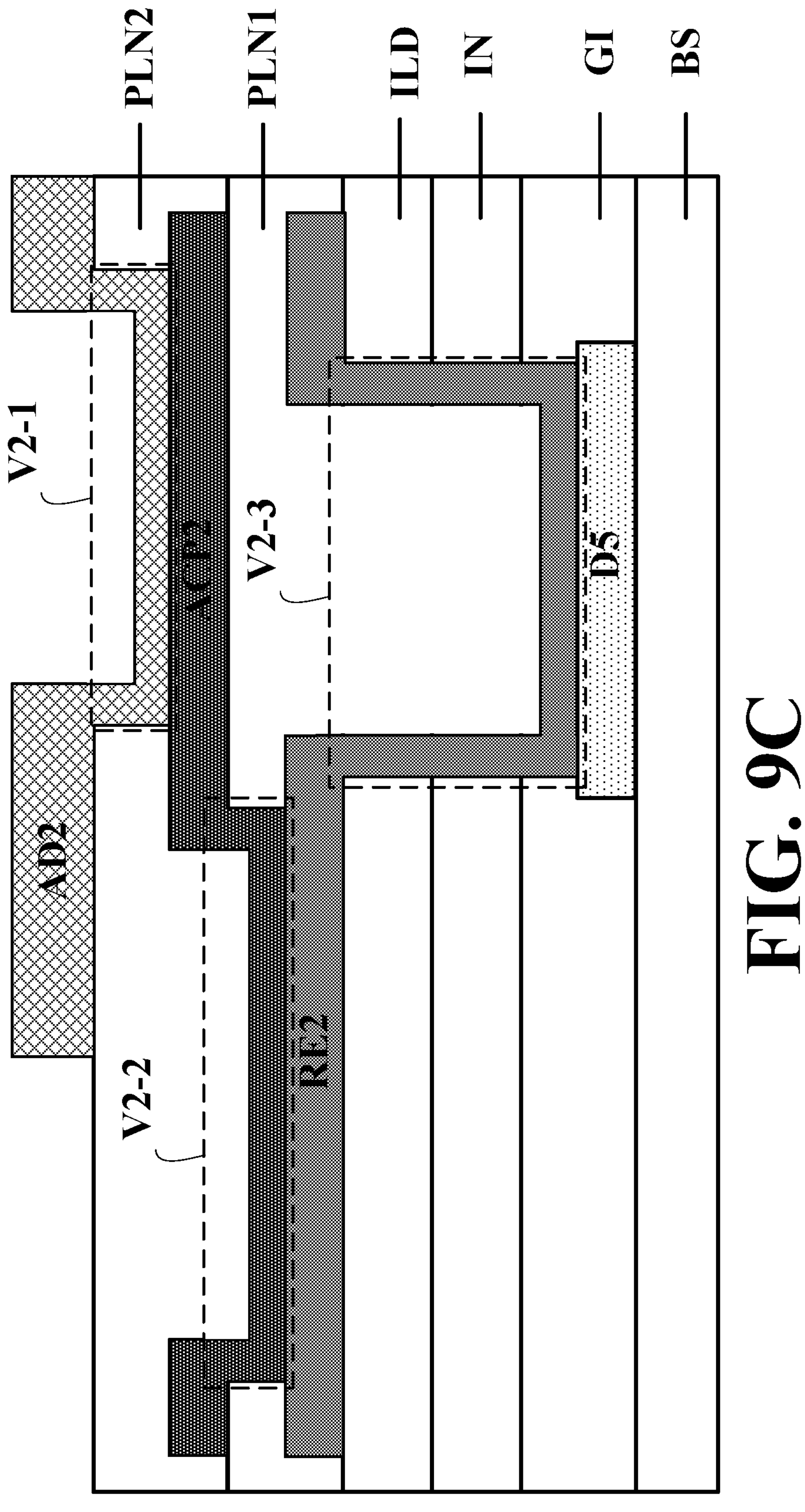
FIG. 9C is a cross-sectional view along an I-I' line in FIG. 9A.
Figure 9D:
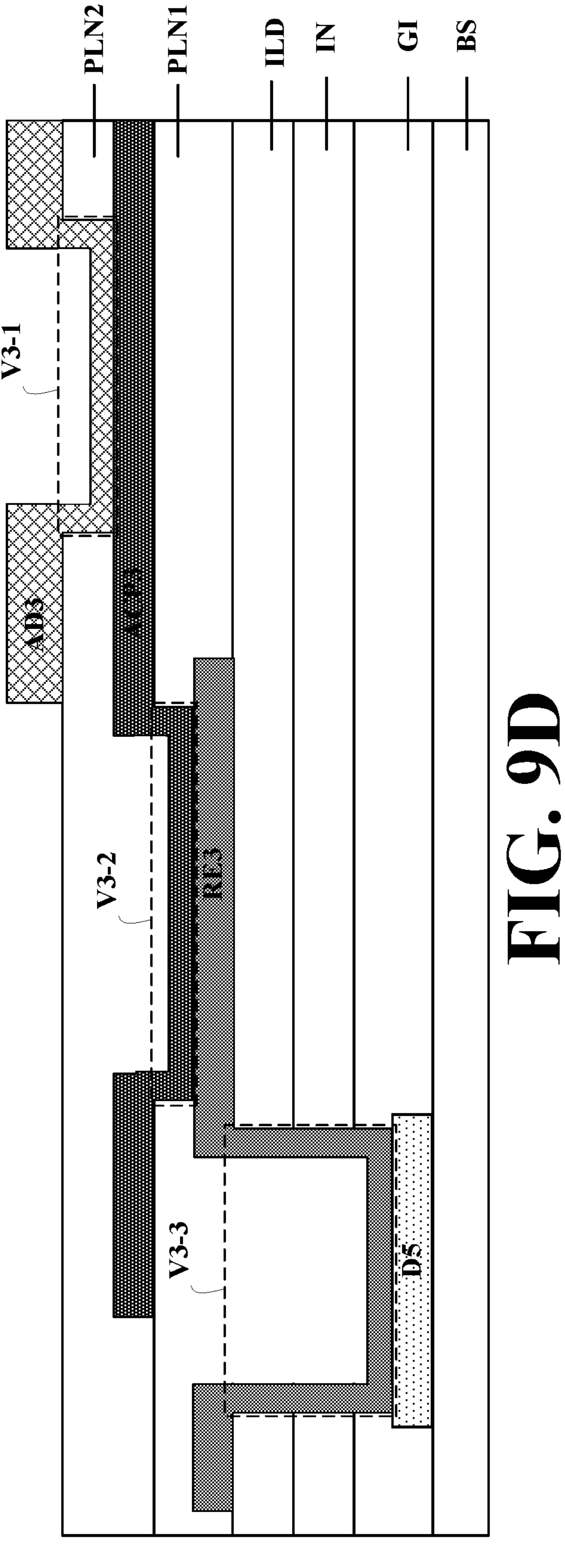
FIG. 9D is a cross-sectional view along a J-J' line in FIG. 9A.
Figure 9E:
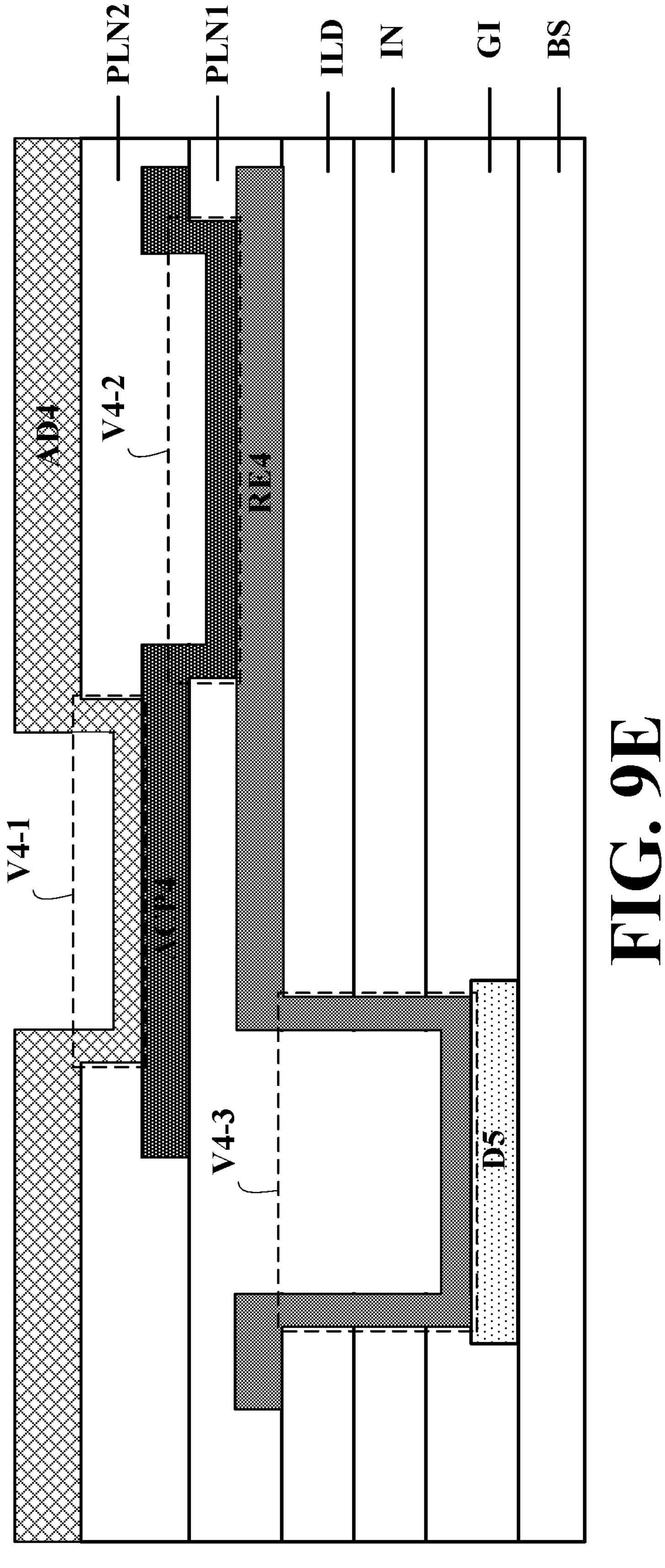
FIG. 9E is a cross-sectional view along a K-K' line in FIG. 9A.

FIG. 9A is a diagram illustrating anodes, a first signal line layer, a second signal line layer, and a semiconductor material layer in an array substrate in some embodiments according to the present disclosure. FIG. 9B is a cross-sectional view along an H-H' line in FIG. 9A. FIG. 9C is a cross-sectional view along an I-I' line in FIG. 9A. FIG. 9D is a cross-sectional view along a J-J' line in FIG. 9A. FIG. 9E is a cross-sectional view along a K-K' line in FIG. 9A. Referring to FIG. 9A to FIG. 9E, in some embodiments, in a respective first subpixel sp1, the first anode AD1 is connected to a first anode contact pad ACP1 through a first via V1-1 extending through the second planarization layer PLN-2, the first anode contact pad ACP1 is connected to a first relay electrode RE1 through a second via V1-2 extending through the first planarization layer PLN-1, and the first relay electrode RE1 is connected to a drain electrode D5 of the fifth transistor in the respective first subpixel sp1 through a third via V1-3 extending through the inter-layer dielectric layer ILD, the insulating layer IN, and the gate insulating layer GI; in a respective second subpixel sp2, the second anode AD2 is connected to a second anode contact pad ACP2 through a fourth via V2-1 extending through the second planarization layer PLN-2, the second anode contact pad ACP2 is connected to a second relay electrode RE2 through a fifth via V2-2 extending through the first planarization layer PLN-1, and the second relay electrode RE1 is connected to a drain electrode D5 of the fifth transistor in the respective second subpixel sp2 through a sixth via V2-3 extending through the inter-layer dielectric layer ILD, the insulating layer IN, and the gate insulating layer GI; in a respective third subpixel sp3, the third anode AD3 is connected to a third anode contact pad ACP3 through a seventh via V3-1 extending through the second planarization layer PLN-2, the third anode contact pad ACP3 is connected to a third relay electrode RE3 through an eighth via V3-2 extending through the first planarization layer PLN-1, and the third relay electrode RE3 is connected to a drain electrode D5 of the fifth transistor in the respective third subpixel sp3 through a ninth via V3-3 extending through the inter-layer dielectric layer ILD, the insulating layer IN, and the gate insulating layer GI; and in a respective fourth subpixel sp4, the fourth anode AD4 is connected to a fourth anode contact pad ACP4 through a tenth via V4-1 extending through the second planarization layer PLN-2, the fourth anode contact pad ACP4 is connected to a fourth relay electrode RE4 through an eleventh via V4-2 extending through the first planarization layer PLN-1, and the fourth relay electrode RE4 is connected to a drain electrode D5 of the fifth transistor in the respective fourth subpixel sp4 through a twelfth via V4-3 extending through the inter-layer dielectric layer ILD, the insulating layer IN, and the gate insulating layer GI.

As shown in FIG. 9B to FIG. 9E, in some embodiment, an orthographic projection of a portion of the first anode contact pad ACP1 in the second via V1-2 on the base substrate BS is substantially non-overlapping with an orthographic projection of a portion of the first anode AD1 in the first via V1-1 on the base substrate BS; and is substantially non-overlapping with an orthographic projection of a portion of the first relay electrode RE1 in the third via V1-3 on the base substrate BS; an orthographic projection of a portion of the second anode contact pad ACP2 in the fifth via V2-2 on the base substrate BS is substantially non-overlapping with an orthographic projection of a portion of the second anode AD2 in the fourth via V2-1 on the base substrate BS; and is substantially non-overlapping with an orthographic projection of a portion of the second relay electrode RE2 in the third via V2-3 on the base substrate BS; an orthographic projection of a portion of the third anode contact pad ACP3 in the eighth via V3-2 on the base substrate BS is substantially non-overlapping with an orthographic projection of a portion of the third anode AD3 in the seventh via V3-1 on the base substrate BS; and is substantially non-overlapping with an orthographic projection of a portion of the third relay electrode RE3 in the ninth via V3-3 on the base substrate BS; and an orthographic projection of a portion of the fourth anode contact pad ACP4 in the eleventh via V4-2 on the base substrate BS is substantially non-overlapping with an orthographic projection of a portion of the fourth anode AD4 in the tenth via V4-1 on the base substrate BS; and is substantially non-overlapping with an orthographic projection of a portion of the fourth relay electrode RE4 in the twelfth via V4-3 on the base substrate BS. As used herein, the term "substantially non-overlapping" refers to two orthographic projections being at least 90 percent (e.g., at least 92 percent, at least 94 percent, at least 96 percent, at least 98 percent, at least 99 percent, and 100 percent) non-overlapping.

Optionally, an orthographic projection of the second via V1-2 on the base substrate BS is substantially non-overlapping with an orthographic projection of the first via V1-1 on the base substrate BS; and is substantially non-overlapping with an orthographic projection of the third via V1-3 on the base substrate BS; an orthographic projection of the fifth via V2-2 on the base substrate BS is substantially non-overlapping with an orthographic projection of the fourth via V2-1 on the base substrate BS; and is substantially non-overlapping with an orthographic projection of the third via V2-3 on the base substrate BS; an orthographic projection of the eighth via V3-2 on the base substrate BS is substantially non-overlapping with an orthographic projection of the seventh via V3-1 on the base substrate BS; and is substantially non-overlapping with the ninth via V3-3 on the base substrate BS; and an orthographic projection of the eleventh via V4-2 on the base substrate BS is substantially non-overlapping with an orthographic projection of the tenth via V4-1 on the base substrate BS; and is substantially non-overlapping with an orthographic projection of the twelfth via V4-3 on the base substrate BS. By having the above non-overlapping vias, the issue of line open can be substantially obviated. Moreover, the second planarization layer PLN2 can be formed with a substantially more even surface as compared to other array substrates.

Figure 10:
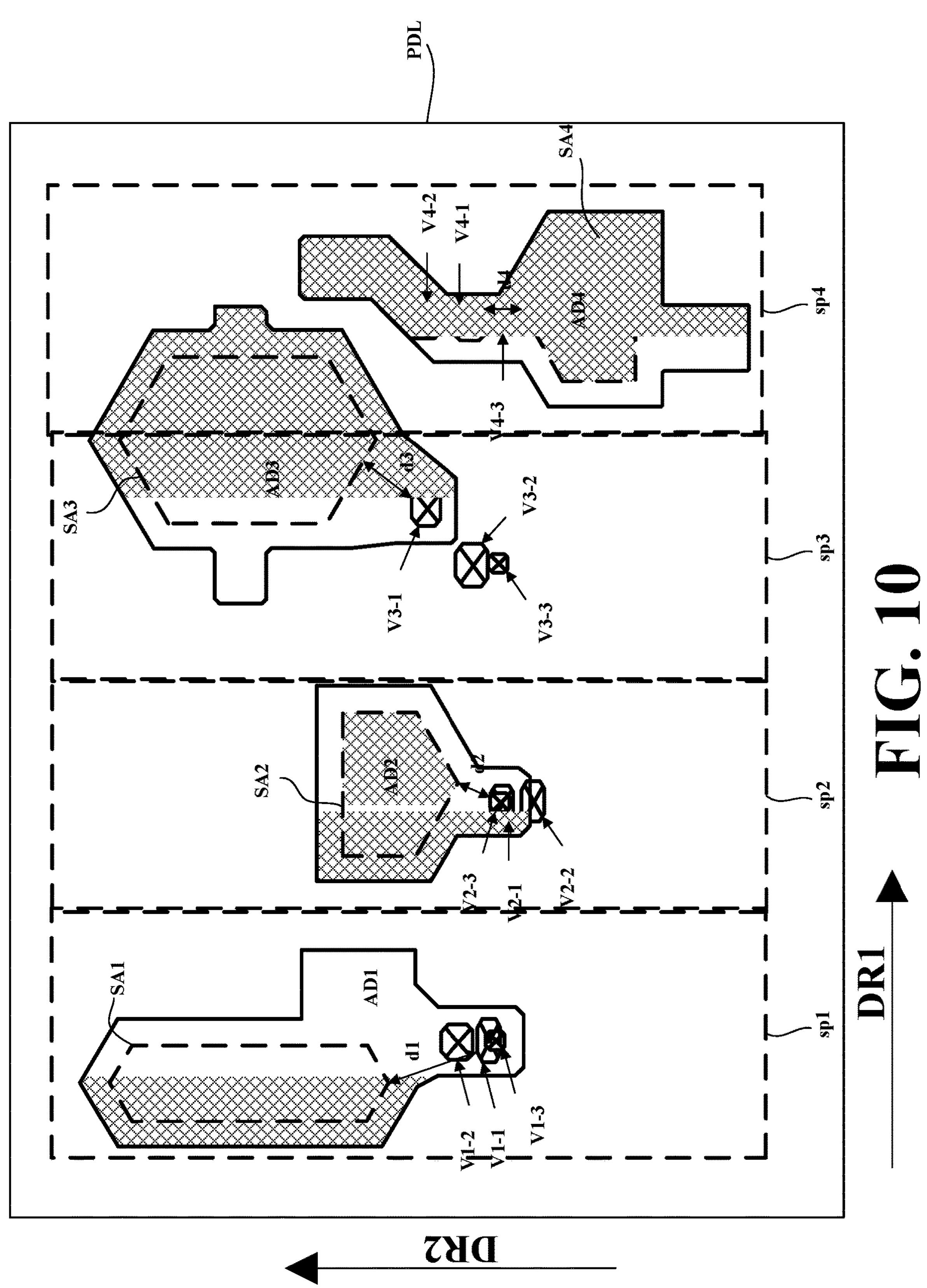
FIG. 10 illustrates relative positions between subpixel apertures and vias in an array substrate in some embodiments according to the present disclosure.

FIG. 10 illustrates relative positions between subpixel apertures and vias in an array substrate in some embodiments according to the present disclosure. Referring to FIG. 10, the array substrate in some embodiments includes a first anode AD1 in the respective first subpixel sp1, a second anode AD2 in the respective second subpixel sp2, a third anode AD3 in the respective third subpixel sp3, and a fourth anode AD4 in the respective fourth subpixel sp4. The first anode AD1, the second anode AD2, the third anode AD3, and the fourth anode AD4, are respectively anodes of a first light emitting element, a second light emitting element, a third light emitting element, and a fourth light emitting element, respectively in the respective first subpixel sp1, the respective second subpixel sp2, the respective third subpixel sp3, and the respective fourth subpixel sp4. The array substrate in some embodiments further includes a pixel definition layer PDL on a side of the first anode AD1, the second anode AD2, the third anode AD3, and the fourth anode AD4 away from the second planarization layer PLN2. The array substrate further includes a first subpixel aperture SA1, a second subpixel aperture SA2, a third subpixel aperture SA3, a fourth subpixel aperture SA4 respectively extending through the pixel definition layer PDL. Optionally, a first light emitting layer of the first light emitting element, a second light emitting layer of the second light emitting element, a third light emitting layer of the third light emitting element, and a fourth light emitting layer of the fourth light emitting element respectively connected to a first anode AD1 of the first light emitting element, a second anode AD2 of the second light emitting element, a third anode AD3 of the third light emitting element, and a fourth anode AD4 of the fourth light emitting element, respectively through the first subpixel aperture SA1, the second subpixel aperture SA2, the third subpixel aperture SA3, the fourth subpixel aperture SA4.

In some embodiments, shortest distances between edges of the first anode other than one having the first via and the first subpixel aperture are non-uniform. Optionally, shortest distances between edges of the third anode other than one having the seventh via and the third subpixel aperture are non-uniform. Optionally, shortest distances between edges of the fourth anode other than one having the tenth via and the fourth subpixel aperture are non-uniform.

In some embodiments, a shortest distance d1 between the first via V1-1 and the first subpixel aperture SA1 is in a range of 9.0 μm to 15.0 μm, e.g., 9.0 μm to 10.0 μm, 10.0 μm to 11.0 μm, 11.0 μm to 12.0 μm, 12.0 μm to 13.0 μm, 13.0 μm to 14.0 μm, or 14.0 μm to 15.0 μm. Optionally, the shortest distance d1 is 11.7 μm. In some embodiments, a shortest distance d2 between the fourth via V2-1 and the second subpixel aperture SA2 is in a range of 2.0 μm to 6.0 μm, e.g., 2.0 μm to 3.0 μm, 3.0 μm to 4.0 μm, 4.0 μm to 5.0 μm, or 5.0 μm to 6.0 μm. Optionally, the shortest distance d2 is 3.7 μm. In some embodiments, a shortest distance d3 between the seventh via V3-1 and the third subpixel aperture SA3 is in a range of 4.5 μm to 10.5 μm, e.g., 4.5 μm to 5.5 μm, 5.5 μm to 6.5 μm, 6.5 μm to 7.5 μm, 7.5 μm to 8.5 μm, 8.5 μm to 9.5 μm, or 9.5 μm to 10.5 μm. Optionally, the shortest distance d3 is 7.4 μm. In some embodiments, a shortest distance d4 between the tenth via V4-1 and the fourth subpixel aperture SA4 is in a range of in a range of 2.0 μm to 6.0 μm, e.g., 2.0 μm to 3.0 μm, 3.0 μm to 4.0 μm, 4.0 μm to 5.0 μm, or 5.0 μm to 6.0 μm. Optionally, the shortest distance d4 is 3.4 μm. By spacing apart the respective via and the respective subpixel aperture, an enhanced surface evenness of the respective anode can be achieved.

Referring to FIG. 10, in some embodiments, the first via V1-1, the second via V1-2, and the third via V1-3 are arranged along a direction substantially parallel to the second direction DR2; the fourth via V2-1, the fifth via V2-2, and the sixth via V2-3 are arranged along a direction substantially parallel to the second direction DR2; the eighth via V3-2 and the ninth via V3-3 are arranged along a direction substantially parallel to the second direction DR2; the tenth via V4-1, the eleventh via V4-2, and the twelfth via V4-3 are arranged along a direction substantially parallel to the second direction DR2. However, the seventh via V3-1 and the eighth via V3-2 are arranged along a direction at an inclined angle greater than 15 degree with respect to the second direction DR2.

Referring to FIG. 10, FIG. 3G, and FIG. 9A to FIG. 9E, in some embodiments, the first anode contact pad ACP1 has a first portion connected to the first anode AD1 through the first via V1-1, a second portion connected to the first relay electrode RE1 through the second via V1-2; the first anode contact pad ACP1 has a substantially rectangular shape with the first portion and the second portion arranged along a direction substantially parallel to the second direction DR2. Optionally, the second anode contact pad ACP2 has a third portion connected to the second anode AD2 through the fourth via V2-1, a fourth portion connected to the second relay electrode RE2 through the fifth via V2-2; the second anode contact pad ACP2 has a substantially rectangular shape with the third portion and the fourth portion arranged along a direction substantially parallel to the second direction DR2. Optionally, the third anode contact pad ACP3 has a fifth portion connected to the third anode AD3 through the seventh via V3-1, a sixth portion connected to the third relay electrode RE3 through the eighth via V3-2; the third anode contact pad ACP3 has a substantially dumbbell shape with the fifth portion and the sixth portion arranged along a direction at an inclined angle greater than 15 degree with respect to the second direction DR2. Optionally, the fourth anode contact pad ACP4 has a seventh portion connected to the fourth anode AD4 through the tenth via V4-1, an eighth portion connected to the fourth relay electrode RE4 through the eleventh via V4-2; the fourth anode contact pad ACP4 has a substantially rectangular shape with the seventh portion and the eighth portion arranged along a direction substantially parallel to the second direction DR2.

Figure 11:
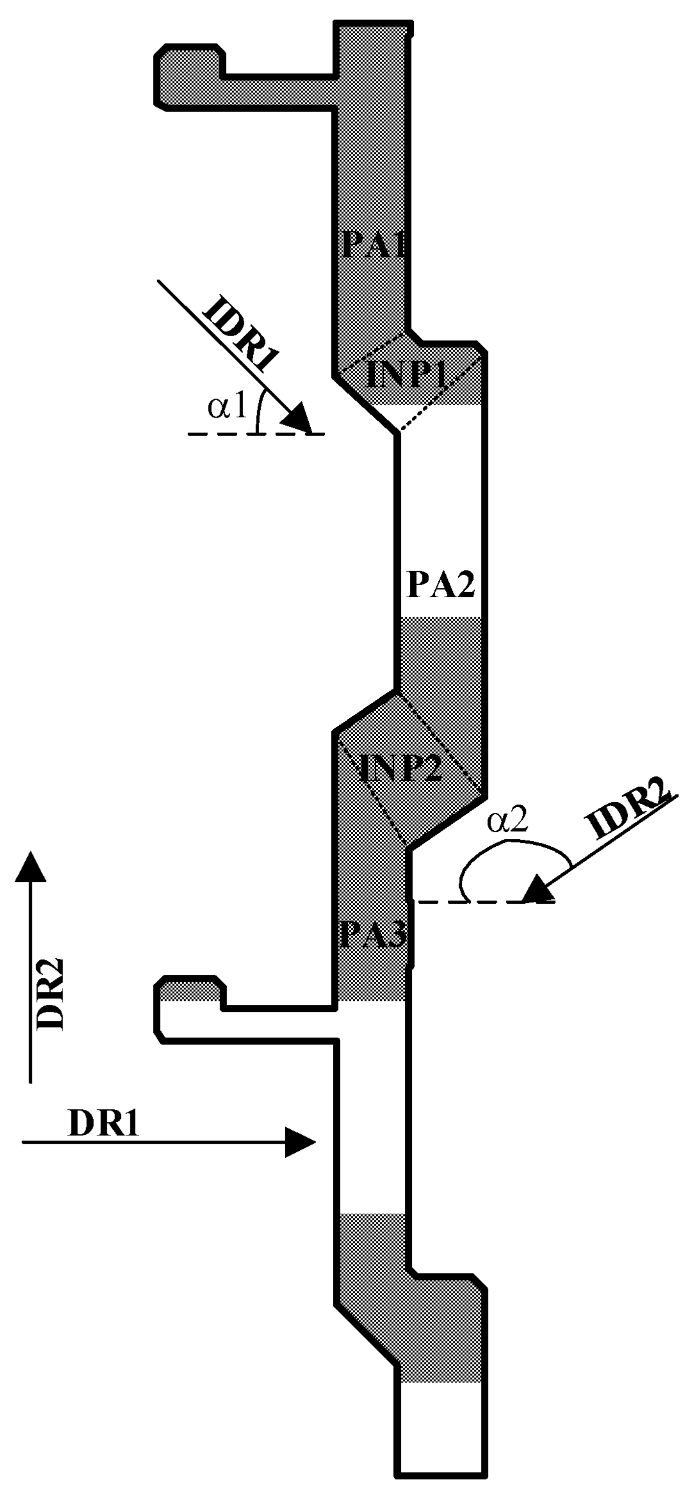
FIG. 11 illustrates a partial structure of a voltage supply line in some embodiments according to the present disclosure.

FIG. 11 illustrates a partial structure of a voltage supply line in some embodiments according to the present disclosure. Referring to FIG. 11, the voltage supply lines Vdd in some embodiments includes a first parallel portion PA1, a second parallel portion PA2, a third parallel portion PA3, a first inclined portion INP1 connecting the first parallel portion PA1 and the second parallel portion PA2 along a first inclined direction IDR1, and a second inclined portion INP2 connecting the second parallel portion PA2 and the third parallel portion PA3 along a second inclined direction IDR2. The first parallel portion PA1, the second parallel portion PA2, and the third parallel portion PA3, respectively extend along a direction substantially parallel to the second direction DR2. The first inclined portion INP1 extends along a first inclined angle α1 with respect to the first direction DR1. The second inclined portion INP2 extends along a second inclined angle α2 with respect to the first direction DR2. Optionally, the first inclined angle α1 and the second inclined angle α2 are supplementary angles, e.g., α1+α2=180 degrees. The first connecting portion INP1 extends along a direction substantially parallel to the first inclined direction IDR1. The second connecting portion INP2 extends along a direction substantially parallel to the second inclined direction IDR2. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees. Optionally, the first parallel portion PA1 and the third parallel portion PA3 are substantially aligned, e.g., along the second direction DR2.

Referring to FIG. 11, FIG. 3A, FIG. 4B, the first connecting portion INP1, the second parallel portion PA2, and the second connecting portion INP2 in combination surround one side of the connecting portion CP, which is connected to a respective one of the plurality of data lines DL through a via v4-1 extending through the first planarization layer PLN-1, and connected to a source electrode S2 of the second transistor through a via v4-2 extending through the inter-layer dielectric layer ILD, the insulating layer IN, and the gate insulating layer GI.

Figure 12:
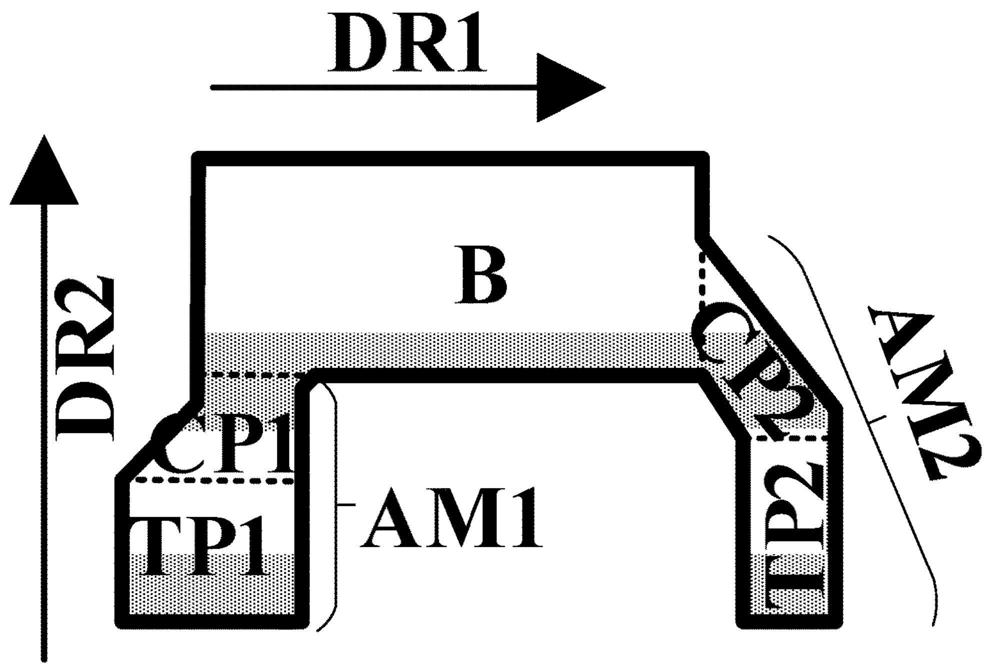
FIG. 12 illustrates a detailed structure of an interference preventing block in some embodiments according to the present disclosure.

FIG. 12 illustrates a detailed structure of an interference preventing block in some embodiments according to the present disclosure. Referring to FIG. 3A, FIG. 4B, and FIG. 12, the interference preventing block IPB in some embodiments further includes a base B, a first arm AM1, and a second arm AM2. The voltage supply line Vdd is connected to the base B through the third main via v3. Optionally, the first arm AM1 includes a first tip portion TP1 and a first connecting bridge portion CP1 connecting the base B and the first tip portion TP1. Optionally, the second arm AM2 includes a second tip portion TP2, and a second connecting bridge portion CP2 connecting the base B and the second tip portion TP2.

Optionally, the first tip portion TP1 and the first connecting bridge portion CP1 are arranged along a direction substantially parallel to the second direction DR2. Optionally, the second tip portion TP2 and the second connecting bridge portion CP2 are arranged along a direction substantially parallel to the second direction DR2. Optionally, a longitudinal side of the base B is along a direction substantially parallel to the first direction DR1, and a lateral side of the base B is along a direction substantially parallel to the second direction DR2.

Optionally, the base B has a substantially rectangular shape. Optionally, the first tip portion TP1 has a substantially rectangular shape. Optionally, the second tip portion TP2 has a substantially rectangular shape. Optionally, the first connecting bridge portion CP1 has a pseudo half trapezoidal shape. Optionally, the second connecting bridge portion CP2 has a pseudo trapezoidal shape.

Figure 13:
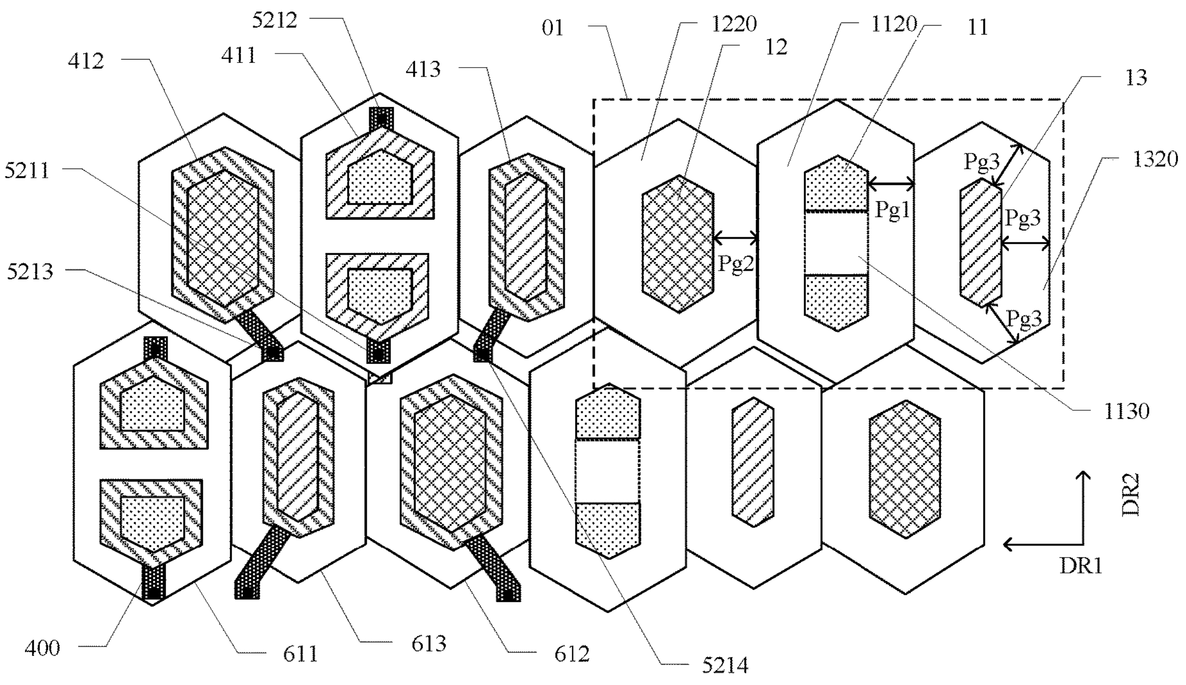
FIG. 13 schematically illustrates several repeating units respectively arranged in two repeating unit groups.

In order to more clearly describe a shape and size relationship of the subpixel aperture, the anode electrode and the light emitting functional layer, a plan structure view is illustrated in FIG. 13 below. FIG. 13 schematically illustrates several repeating units respectively arranged in two repeating unit groups. For clarity of illustration, two second subpixels, two third subpixels and four first subpixels in the left of FIG. 13 schematically illustrate the structures of the subpixel aperture, the anode electrode and the light emitting functional layer; and two second subpixels, two third subpixels and four first subpixels in the right of FIG. 13 only illustrate the light emitting functional layer and the subpixel aperture. As illustrated in FIG. 13, the first subpixel comprises the corresponding subpixel aperture, the anode electrode 411, and the light emitting functional layer 611; the second subpixel comprises the corresponding subpixel aperture, the anode electrode 412, and the light emitting functional layer 612; and the third subpixel comprises the corresponding subpixel aperture, the anode electrode 413 and the light emitting functional layer 613. In each subpixel (the first subpixel, the second subpixel and the third subpixel), an area of the light emitting functional layer is the largest, an area of the anode electrode is less than that of the light emitting functional layer, and an area of the subpixel aperture is the smallest. An orthographic projection of the subpixel aperture on a plane defined by the first direction DR1 and the second direction DR2 falls within an orthographic projection of the anode electrode on the plane. The orthographic projections of the anode electrodes of the first subpixel, the second subpixel and the third subpixel on the plane falls within orthographic projections of the light emitting functional layers in the corresponding first subpixel, the corresponding second subpixel and the corresponding third subpixel on the plane.

As illustrated in FIG. 13, two opposite edges of the apertures of the pixel definition layer of the two first subpixels in the first subpixel pair extend in the first direction DR1, that is the two opposite edges are parallel to each other, and distances between the two edges are equal at different positions, so that the maximum light emitting area can be ensured.

For example, as shown in FIG. 13, the subpixel apertures of any adjacent two of the first subpixel, the second subpixel and the third subpixel have approximately parallel opposite edges, and a perpendicular bisector of one edge of the opposite edges passes through the other edge. In some examples, the length of the connection line of centers of the two opposite edges is the minimum distance between the two opposite edges. At both sides of the centers, the space between the two opposite edges can be gradually increased. For example, the largest space between the two opposite edges can be 1.5 times of the minimum distance between the two opposite edges.

As illustrated in subpixels of which the anode electrode is not shown in the right portion of FIG. 13, in each of the second subpixel 12 and the third subpixel 13, the light emitting functional layer comprises an annular portion 1220 and 1320 located on the pixel definition layer surrounding the corresponding subpixel aperture; and in the first subpixel pair (the two first subpixels 11), the light emitting functional layer 611 comprises an annual portion 1120 located on the pixel definition layer surrounding the corresponding subpixel aperture of the two first subpixels and a connection portion 1130 (see the dotted line frame between the two first subpixels in FIG. 13) located on the pixel definition layer between the two subpixel apertures. In each of the first subpixel pair, the second subpixel and the third subpixel, the annular portion of the light emitting functional layer has an equal width (i.e., Pg1, Pg2 and Pg3) at different location. For example, the width Pg1 is equal to the width Pg2 and the width Pg3, respectively.

Furthermore, it should be noted that, in one repeating unit, the two first subpixels 11 form a subpixel pair, and the light emitting functional layers of the two first subpixels 11 can be formed by one mask opening. In a case that the light emitting functional layers of the two first subpixels 11 are formed by one opening, the difficulty in manufacturing FMM is reduced, and the manufacturing efficiency is improved. In this case, at least the annular portion and the connection portion of the light emitting functional layer of the first subpixel pair are a continuous layer structure. As shown in FIG. 13, the annular portion 1120 and the connection portion 1130 of the light emitting functional layer of the first subpixel pair can have a planar shape of "θ". In some embodiments, the light emitting functional layers of the two first subpixels are integrally formed, and distributed on the pixel definition layer and in the subpixel aperture, and the light emitting functional layer on the pixel definition layer and the light emitting functional layer in the subpixel aperture of the pixel definition layer are also connected to each other. However, the embodiments according to the present disclosure are not limited thereto, the light emitting functional layer on the pixel definition layer and the light emitting functional layer in the subpixel aperture of the pixel definition layer can also be disconnected from each other.

Furthermore, the anode electrodes of the two first subpixels in the first subpixel pair are spaced apart from each other; therefore, the two first subpixels can be independently driven.

In addition, as illustrated in FIG. 13, the anode electrode needs to connect to the driving circuit below through a via hole; therefore, an anode via hole needs to be provided in the planarization layer. In the repeating unit in the upper left corner in FIG. 13, the anode electrode of the lower one first subpixel of the first subpixel pair is connected to a first anode via hole 5211 through a connection pattern 400, the anode electrode of the second subpixel 12 is connected to a third anode via hole 5213 through the connection pattern 400, and the anode electrode of the third subpixel 13 is connected to a fourth anode via hole 5214 through the connection pattern 400. The three anode via holes (5211, 5213 and 5214) are substantially in a straight line parallel to the first direction DR1. That is, the three anode via holes are all formed on the lower side of the upper repeating unit group and are arranged in the straight line parallel to the first direction DR1. Furthermore, for the upper one first subpixel 11 in the first subpixel pair, its anode electrode is connected to a second anode via hole 5212 located above through the connection electrode 400. For example, the connection situation of the upper first subpixel of the first subpixel pair in the lower left corner in FIG. 13 can be referred to. That is, for each repeating unit group, the anode via holes of the second subpixel, the third subpixel and one first subpixel located on the lower side of the first subpixel pair are located on the lower side of the repeating unit group and are located on substantially the same straight line. The anode via hole of one first subpixel located on the upper side of the first subpixel pair in the repeating unit group is located above the repeating unit group, and is located on the same straight line with the anode via holes of the second subpixel and the third subpixel of a repeating unit group adjacent to the upper side of the repeating unit group.

For example, as shown in FIG. 13, the space between the anode via hole 5213 and the anode via hole 5214 of the adjacent second and third subpixels is larger than the space between the adjacent anode via hole 5211 and anode via hole 5213. In this case, the anode via hole 5212 of the first subpixel in the next repeating unit group can be placed between the anode via hole 5213 and the anode via hole 5214.

For example, the anode via holes arranged along one straight line are repeatedly arranged in sequence according to an order of the anode via hole 5211, the anode via hole 5213, the anode via hole 5212 and the anode via hole 5214.

Although the anode electrodes 411, 412, 413 and the connection electrode 400 use different shadow pattern in FIG. 13, the anode electrodes 411, 412, 413 can be integrally formed with the corresponding connection electrodes, respectively, i.e., formed into an integral structure. For example, each of the connection electrodes can be formed simultaneously with the corresponding connection electrode by depositing a conductive layer (e.g., metal layer) and patterning it.

Furthermore, as can be seen from FIG. 13, the connection electrode (connection electrode) 400 of each subpixel electrically connected to the anode electrode can overlap with the light emitting functional layer, or can protrude beyond the region of the light emitting functional layer, which can be arbitrarily adjusted according to the position of the via hole.

In some embodiments, the light emitting functional layer 60 can comprise a hole transport layer, a light emitting layer and an electron transport layer, but are not limited thereto. For different subpixels, for example, the hole transport layers can have different thicknesses. For example, the hole transport layer of the second subpixel has the smallest thickness, the hole transport layer of the third subpixel has the largest thickness, and the thickness of the hole transport layer of the first subpixel is between the two. For example, different hole transport layers of different subpixels can adopt the same material but have different thicknesses; therefore, an entire thin layer of the hole transport layer can be firstly evaporated by using an open mask, and then fine metal mask (FMM) of the third subpixel and the first subpixel are respectively used for evaporation to reach respective hole transport layer thicknesses. For the light emitting layer, evaporation is respectively performed by using respective evaporation masks to obtain respective light-emitting layers. For the electron transport layer, the open mask can also be used to evaporate. Therefore, in a process of manufacturing a light emitting diode pixel, five FMM evaporation mask processes can be adopted. For example, for some layers of the light emitting functional layer, the layers can be integrally formed for the plurality of subpixels, for example, the layers can be evaporated by using the abovementioned open mask. However, in order to clearly describe, the shape and size of the light emitting functional layer described in the present application are all parts of the patterned light emitting functional layer of each subpixel or subpixel pair formed by FMM.

In some embodiments, a cathode, a lithium fluoride layer, a light extraction layer and a lithium fluoride layer can be further provided above the light emitting functional layer 60. For example, the cathode can be formed by a transparent conductive material such as ITO. The introduction of lithium fluoride can better modify the ITO surface, reduce the formation of the interface defect state, and enhance the stability of the device. The light extraction layer can improve the light extraction efficiency of the light emitting diode.

Furthermore, as can be seen from FIG. 13, in the same repeating unit group, the light emitting functional layers of adjacent subpixels in the first direction DR1 are adjacent to each other. That is, there can be no space between two adjacent light emitting functional layers in the first direction DR1. For example, in order to ensure that the light emitting functional layer in the subpixel aperture manufactured by FMM process is uniform as possible, and considering the process margin, the FMM opening for manufacturing the light emitting functional layer is as large as possible, but the light emitting functional layers of adjacent subpixels with different colors is better not to overlap as much as possible to avoid color mixing, thus, the FMM opening can be designed according to a case that the light emitting functional layers of adjacent subpixels abut with each other. But in actual process, because of process errors and other reasons, a shadow region of layers formed by FMM may have certain overlap or spacing, the formed light emitting functional layers of adjacent subpixels may have overlapping parts with each other. However, through process control, the size of the overlapping parts can be smaller than 1/10 or even smaller than 1/20 of the size of the light emitting functional layer. In addition, as described above, the edge of the subpixel aperture of each pixel has an equal distance with the edge of the light emitting functional layer, for example, Pg1=Pg2=Pg3. Therefore, in the first direction DR1, a boundary line of the light emitting functional layers of adjacent two subpixels is located in the middle of the interval between the subpixel apertures of the adjacent two subpixels. In this case, the shape of the light emitting functional layer of each subpixel can be calculated. For example, the area of the light emitting functional layer of the first subpixel pair is greater than the area of the light emitting functional layer of the second subpixel, and the area of the light emitting functional layer of the second subpixel is greater than the area of the light emitting functional layer of the third subpixel. For example, the first subpixel is a green subpixel, the second subpixel is a blue subpixel, and the third subpixel is a red subpixel. In addition, the light emitting functional layers of the first subpixel pair and the second subpixel adjacent in the second direction DR2 abut with each other, the light emitting functional layers of the third subpixel and the first subpixel pair adjacent in the second direction DR2 are spaced apart from each other, and the light emitting functional layers of the third subpixel and the second subpixel adjacent in the second direction DR2 are spaced apart from each other. In addition, as can be seen from FIG. 13, the interval between the light emitting functional layers of the third subpixel and the second subpixel adjacent in the second direction DR2 is greater than the interval between the light emitting functional layers of the third subpixel and the first subpixel pair adjacent in the second direction DR2. In the second direction DR2, the size of the light emitting functional layer of one first subpixel pair is greater than the size of the light emitting functional layer of one second subpixel and greater than the size of the light emitting functional layer of one third subpixel; in the first direction DR1, both of the size of the light emitting functional layer of one first subpixel pair and the size of the light emitting functional layer of one second subpixel are greater than the size of the light emitting functional layer of one third subpixel. For the shape and area of the light emitting functional layer designed according to the above rules, the process can be simplified and light emitting area can be maximized.

For example, as illustrated in FIG. 13, a minimum distance between the subpixel apertures of the two first subpixels of the first subpixel pair is smaller than a minimum distance between any two of the subpixel aperture of the first subpixel pair, the subpixel aperture of the second subpixel and the subpixel aperture of the third subpixel. For example, a minimum distance between the subpixel aperture of the first subpixel pair and the subpixel aperture of the second subpixel is a first distance, a minimum distance between the subpixel aperture of the first subpixel pair and the subpixel aperture of the third subpixel is a second distance, a minimum distance between the subpixel aperture of the second subpixel and the subpixel aperture of the third subpixel is a third distance, a minimum distance between the subpixel apertures of the two first subpixels in the first subpixel pair is a fourth distance, the first distance, the second distance and the third distance are all greater than the fourth distance. For example, a difference between the first distance and the second distance is less than 20% of the first distance, and the difference between the first distance and the third distance is less than 20% of the first distance. In a case of full high definition (FHD) resolution, a distance between the subpixel apertures of adjacent subpixels can be 22~25 km; in a case of a quarter full definition (QHD) resolution, a distance between the subpixel apertures of adjacent subpixels can be 19.7~21.5 μm. For example, the abovementioned distance can be in a range of 18~26 μm. The distance between the adjacent subpixels as mentioned above refer to a distance between subpixels of different colors. For the two subpixels in the first subpixel pair, the distance between the subpixel apertures can be 15 μm in the case of full high definition (FHD) resolution, and 14 μm in the case of a quarter full definition (QHD) resolution. For example, the distance between the subpixel apertures of the two first subpixels can be in the range of 13-16 μm. Furthermore, for the size of the subpixel aperture of each subpixel, the minimum size is 8 μm. That is, the size of the subpixel apertures of each subpixel is greater than or equal to 8 μm.

For the subpixel apertures of subpixels having different colors, the area of the subpixel aperture of the second subpixel is the maximum, the area of the subpixel aperture of the first subpixel is the minimum, and the area of the subpixel aperture of the third subpixel is between the two. Optionally, the first subpixel is the green subpixel, the second subpixel is the blue subpixel, and the third subpixel is the red subpixel.

In addition, for example, the minimum distance between the anode electrodes of the two first subpixel in the first subpixel pair can be in the range of 8~15 μm. In this case, a wire having a line width of about 5 μm can be disposed between the anode electrodes of the two first subpixels.

The design structure of the abovementioned light emitting functional layer and the subpixel aperture can take into consideration the display effect of subpixels of various colors, and realize the most compact arrangement.

In some embodiments, two subpixels of the respective first subpixel, the respective second subpixel, the respective third subpixel, and the respective fourth subpixel are subpixels of a same color (e.g., green color). In one example, the respective second subpixel sp2 and the respective fourth subpixel sp4 are subpixels of a same color (e.g., green color). In some embodiments, two light emitting elements of the first light emitting element, the second light emitting element, the third light emitting element, and the fourth light emitting element are light emitting elements of a same color (e.g., green color). In one example, the second light emitting element and the fourth light emitting element are light emitting elements of a same color (e.g., green color). In some embodiments, anodes of the two light emitting elements of the same color have different areas or different shapes. In one example, the second anode AD2 and the fourth anode AD4 have different areas or different shapes.

Figure 14:
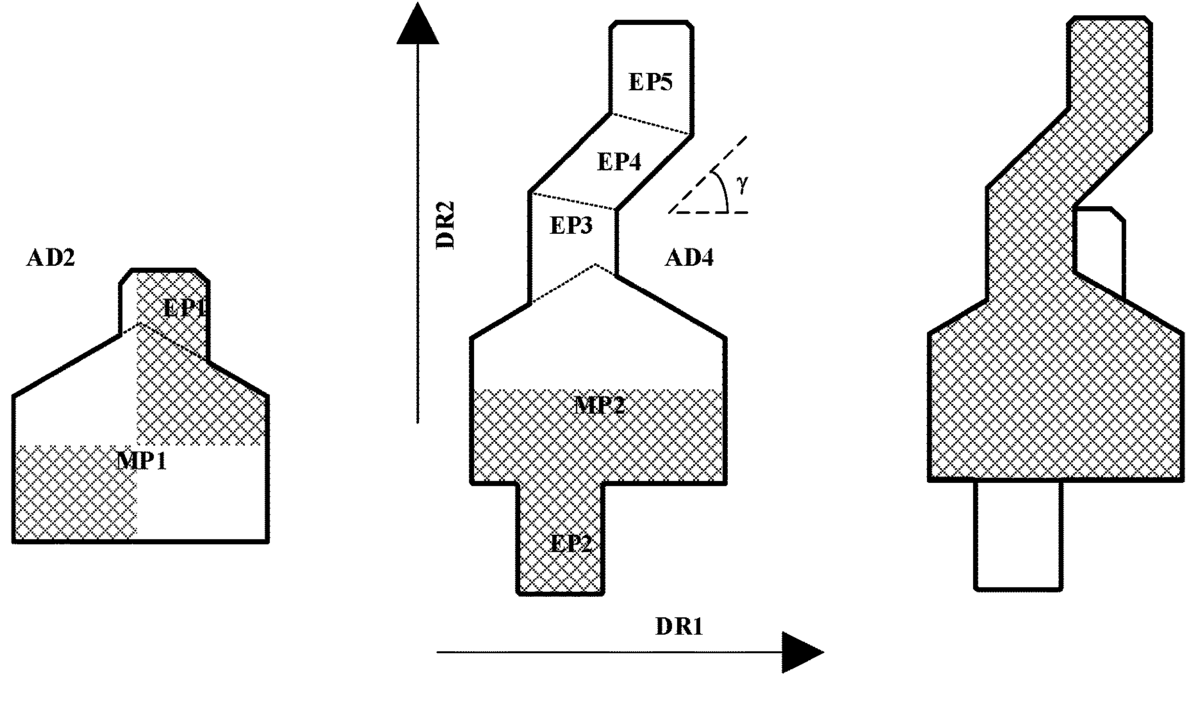
FIG. 14 illustrates structural difference between a second anode and a fourth anode in some embodiments according to the present disclosure.

FIG. 14 illustrates structural difference between a second anode and a fourth anode in some embodiments according to the present disclosure. FIG. 14 illustrates a second anode AD2, a fourth anode AD4, and a superimposition of the second anode AD2 and the fourth anode AD4. In some embodiments, the second anode AD2 includes a first main portion MP1 and a first extra portion EP1; the fourth anode AD4 includes a second main portion MP2, a second extra portion EP2, a third extra portion EP3, a fourth extra portion EP4, and a fifth extra portion EP5.

In some embodiments, the first main portion MP1 is a combination of a rectangle part and a triangle part, and the second main portion MP2 is a combination of a rectangle part and a triangle part. Optionally, the first main portion MP1 and the second main portion MP2 have substantially same shape (and dimensions). Optionally, the first extra portion EP1 abuts the triangle part of the first main portion MP1. Optionally, the second extra portion EP2 abuts a side of the rectangle part of the second main portion MP2 away from the triangle part of the second main portion MP2. Optionally, the third extra portion EP3 abuts the triangle part of the second main portion MP2. Optionally, the third extra portion EP3 connects the fourth extra portion EP4 to the second main portion MP2, and the fourth extra portion EP4 connects the fifth extra portion EP5 to the third extra portion EP3.

Optionally, the second extra portion EP2, the second main portion MP2, the third extra portion EP3, the fourth extra portion EP4, and the fifth extra portion EP5 are sequentially arranged along a direction substantially parallel to the second direction DR2. Optionally, the fourth extra portion EP4 extends along a direction at a third inclined angle γ greater than zero with respect to the second direction DR2.

In another aspect, the present disclosure provides a display panel including the array substrate described herein or fabricated by a method described herein, and a counter substrate facing the array substrate. Optionally, the display panel is an organic light emitting diode display panel. Optionally, the display panel is micro light emitting diode display panel.

In another aspect, the present invention provides a display apparatus, including the array substrate described herein or fabricated by a method described herein, and one or more integrated circuits connected to the array substrate.

In another aspect, the present disclosure provides a method of fabricating an array substrate. In some embodiments, the method includes forming a plurality of light emitting elements respectively in a plurality of subpixels; and forming a plurality of pixel driving circuits respectively in the plurality of subpixels configured to respectively drive the plurality of light emitting elements. Optionally, forming the plurality of light emitting elements includes forming a first light emitting element in a respective first subpixel, forming a second light emitting element in a respective second subpixel, forming a third light emitting element in a respective third subpixel, and forming a fourth light emitting element in a respective fourth subpixel. Optionally, forming a respective one of the plurality of pixel driving circuits includes forming a plurality of transistors, and forming a storage capacitor. Optionally, forming the storage capacitor includes forming a first capacitor electrode, forming a second capacitor electrode electrically connected to a respective voltage supply line, and forming an insulating layer. The insulating layer is formed between the first capacitor electrode and the second capacitor electrode. Optionally, forming the array substrate includes forming a semiconductor material layer on the base substrate; and forming a node connecting line in a same layer as the respective voltage supply line. The node connecting line is formed to be connected to the first capacitor electrode through a first main via, and formed to be connected to the semiconductor material layer through a second main via. Optionally, an orthographic projection of a first anode of the first light emitting element in the respective first subpixel on the base substrate at least partially overlaps with an orthographic projection of a node connecting line in the respective first subpixel on the base substrate; an orthographic projection of the second anode in the respective second subpixel on the base substrate at least partially overlaps with an orthographic projection of the node connecting line in the respective second subpixel on the base substrate; an orthographic projection of the third anode in the respective third subpixel on the base substrate at least partially overlaps with an orthographic projection of the node connecting line in the respective third subpixel on the base substrate; and an orthographic projection of the fourth anode in the respective fourth subpixel sp4 on the base substrate at least partially overlaps with an orthographic projection of the node connecting line in the respective fourth subpixel on the base substrate.

In some embodiments, forming the plurality of transistors includes forming a driving transistor. Optionally, the orthographic projection of the first anode in the respective first subpixel on the base substrate covers an orthographic projection of a portion of the node connecting line at a position connecting to a first capacitor electrode in the respective first subpixel on the base substrate; the orthographic projection of the second anode in the respective second subpixel on the base substrate covers an orthographic projection of a portion of the node connecting line at a position connecting to a first capacitor electrode Ce1 in the respective second subpixel on the base substrate; the orthographic projection of the third anode in the respective third subpixel on the base substrate covers an orthographic projection of a portion of the node connecting line at a position connecting to a first capacitor electrode Ce1 in the respective third subpixel on the base substrate; and the orthographic projection of the fourth anode in the respective fourth subpixel on the base substrate covers an orthographic projection of a portion of the node connecting line at a position connecting to a first capacitor electrode Ce1 in the respective fourth subpixel on the base substrate.

In some embodiments, the orthographic projection of the third anode on the base substrate at least partially overlaps with an orthographic projection of a third transistor in the respective third subpixel on the base substrate and at least partially overlaps with an orthographic projection of a third transistor in the respective fourth subpixel adjacent to the respective third subpixel on the base substrate.

In some embodiments, the orthographic projection of the third anode on the base substrate covers an orthographic projection of a source electrode of a third transistor in the respective third subpixel on the base substrate, partially overlaps with an orthographic projection of an active layer of the third transistor in the respective third subpixel on the base substrate, and partially overlaps with an orthographic projection of an active layer of the third transistor in the respective fourth subpixel on the base substrate.

In some embodiments, the orthographic projection of the first anode on the base substrate at least partially overlaps with an orthographic projection of a third transistor in the respective first subpixel on the base substrate.

In some embodiments, the orthographic projection of the first anode on the base substrate partially overlaps with an orthographic projection of a source electrode of the third transistor in the respective first subpixel on the base substrate, and partially overlaps with an orthographic projection of an active layer of the third transistor in the respective first subpixel on the base substrate.

In some embodiments, the orthographic projection of the fourth anode on the base substrate at least partially overlaps with an orthographic projection of a third transistor in the respective second subpixel on the base substrate.

In some embodiments, the orthographic projection of the fourth anode on the base substrate partially overlaps with an orthographic projection of a source electrode of the third transistor in the respective second subpixel on the base substrate, and partially overlaps with an orthographic projection of an active layer of the third transistor in the respective second subpixel on the base substrate.

In some embodiments, the method further includes forming a gate insulating layer on a side of the semiconductor material layer away from the base substrate; forming an insulating layer on a side of the gate insulating layer away from the base substrate; forming an inter-layer dielectric layer on a side of the insulating layer away from the gate insulating layer; forming a relay electrode layer on a side of the inter-layer dielectric layer away from the insulating layer; forming a first planarization layer on a side of the relay electrode layer away from the inter-layer dielectric layer; forming an anode contact pad layer on a side of the first planarization layer away from the inter-layer dielectric layer; and forming a second planarization layer on side of the anode contact pad layer away from the first planarization layer. Optionally, the pixel definition layer is formed on a side of the second planarization layer away from the base substrate; the spacer layer is formed on a side of the pixel definition layer away from the second planarization layer; and respective anodes are formed on a side of the second planarization layer away from the first planarization layer; and respective light emitting layers are on a side of the respective anodes away from the second planarization layer. Optionally, in the respective first subpixel, the first anode is formed to be connected to a first anode contact pad through a first via extending through the second planarization layer, the first anode contact pad is connected to a first relay electrode through a second via extending through the first planarization layer, and the first relay electrode is connected to a drain electrode of a fifth transistor in the respective first subpixel through a third via extending through the inter-layer dielectric layer, the insulating layer, and the gate insulating layer. Optionally, in the respective second subpixel, the second anode is formed to be connected to a second anode contact pad through a fourth via extending through the second planarization layer, the second anode contact pad is connected to a second relay electrode through a fifth via extending through the first planarization layer, and the second relay electrode is connected to a drain electrode of the fifth transistor in the respective second subpixel through a sixth via extending through the inter-layer dielectric layer, the insulating layer, and the gate insulating layer. Optionally, in the respective third subpixel, the third anode is formed to be connected to a third anode contact pad through a seventh via extending through the second planarization layer, the third anode contact pad is connected to a third relay electrode through an eighth via extending through the first planarization layer, and the third relay electrode is connected to a drain electrode of the fifth transistor in the respective third subpixel through a ninth via extending through the inter-layer dielectric layer, the insulating layer, and the gate insulating layer. Optionally, in a respective fourth subpixel, the fourth anode is formed to be connected to a fourth anode contact pad through a tenth via extending through the second planarization layer, the fourth anode contact pad is connected to a fourth relay electrode through an eleventh via extending through the first planarization layer, and the fourth relay electrode is connected to a drain electrode of the fifth transistor in the respective fourth subpixel through a twelfth via extending through the inter-layer dielectric layer, the insulating layer, and the gate insulating layer.

In some embodiments, an orthographic projection of a portion of the first anode contact pad in the second via on the base substrate is substantially non-overlapping with an orthographic projection of a portion of the first anode in the first via on the base substrate, and is substantially non-overlapping with an orthographic projection of a portion of the first relay electrode in the third via on the base substrate; an orthographic projection of a portion of the second anode contact pad in the fifth via on the base substrate is substantially non-overlapping with an orthographic projection of a portion of the second anode in the fourth via on the base substrate, and is substantially non-overlapping with an orthographic projection of a portion of the second relay electrode in the third via on the base substrate; an orthographic projection of a portion of the third anode contact pad in the eighth via on the base substrate is substantially non-overlapping with an orthographic projection of a portion of the third anode in the seventh via on the base substrate, and is substantially non-overlapping with an orthographic projection of a portion of the third relay electrode in the ninth via on the base substrate; and an orthographic projection of a portion of the fourth anode contact pad in the eleventh via on the base substrate is substantially non-overlapping with an orthographic projection of a portion of the fourth anode in the tenth via on the base substrate, and is substantially non-overlapping with an orthographic projection of a portion of the fourth relay electrode in the twelfth via on the base substrate.

In some embodiments, counter-clock wise, a respective third anode is adjacent to a first respective fourth anode, a first respective first anode, a first respective second anode, a second respective first anode, a second respective fourth anode, a second respective second anode, and a third respective first anode. Optionally, clock wise, a respective third anode is adjacent to a first respective fourth anode, a first respective first anode, a first respective second anode, a second respective first anode, a second respective fourth anode, a second respective second anode, and a third respective first anode. Optionally, a shortest distance between the respective third anode and any one of the first respective fourth anode, the first respective first anode, the first respective second anode, the second respective first anode, a virtual line passing through co-linear edges respectively from the second respective fourth anode and the second respective second anode, or the third respective first anode is in a range of 2.0 μm to 22 μm. Optionally, a shortest distance between the respective third anode and the first respective fourth anode is less than a shortest distance between the respective third anode and the third respective first anode, less than a shortest distance between the respective third anode and the first respective first anode, less than a shortest distance between the respective third anode and the second respective first anode, less than a shortest distance between the respective third anode and a virtual line passing through co-linear edges respectively from the second respective fourth anode and the second respective second anode, and less than a shortest distance between the respective third anode and the first respective second anode. Optionally, a shortest distance between the respective third anode and the third respective first anode is greater than a shortest distance between the respective third anode and the first respective first anode, which is greater than a shortest distance between the respective third anode and the second respective first anode, which is greater than a shortest distance between the respective third anode and a virtual line passing through co-linear edges respectively from the second respective fourth anode and the second respective second anode, which is greater than a shortest distance between the respective third anode and the first respective second anode, which is greater than a shortest distance between the respective third anode and the first respective fourth anode. Optionally, a shortest distance between the respective third anode and the first respective fourth anode is in a range of 2.0 μm to 5.0 μm; a shortest distance between the respective third anode and the first respective first anode is in a range of 8.0 μm to 20.0 μm; a shortest distance between the respective third anode and the first respective second anode is in a range of 5.0 μm to 15.0 μm; a shortest distance between the respective third anode and the second respective first anode is in a range of 7.0 μm to 17.0 μm; a shortest distance between the respective third anode and a virtual line passing through co-linear edges respectively from the second respective fourth anode and the second respective second anode is in a range of 5.0 μm to 16.0 μm; and a shortest distance between the respective third anode and the third respective first anode is in a range of 9.0 μm to 22.0 μm.

In some embodiments, counter-clock wise, a respective first anode is adjacent to a first respective second anode, a first respective fourth anode, a first respective third anode, a second respective second anode, a second respective third anode, a second respective fourth anode, and a third respective third anode. Optionally, clock wise, a respective first anode is adjacent to a first respective second anode, a first respective fourth anode, a first respective third anode, a second respective second anode, a second respective third anode, a second respective fourth anode, and a third respective third anode. Optionally, a shortest distance between the respective first anode and any one of the first respective second anode, the first respective fourth anode, the first respective third anode, the second respective second anode, the second respective third anode, the second respective fourth anode, or the third respective third anode in in a range of 3.0 μm to 25 μm. Optionally, a shortest distance between the respective first anode and the second respective fourth anode is less than a shortest distance between the respective first anode and the second respective second anode, less than a shortest distance between the respective first anode and the first respective fourth anode, less than a shortest distance between the respective first anode and the first respective third anode, less than a shortest distance between the respective first anode and the second respective third anode, less than a shortest distance between the respective first anode and the third respective third anode, and less than a shortest distance between the respective first anode and the first respective second anode. Optionally, a shortest distance between the respective first anode and the second respective second anode is greater than a shortest distance between the respective first anode and the first respective fourth anode, which is greater than a shortest distance between the respective first anode and the first respective third anode, which is greater than a shortest distance between the respective first anode and the second respective third anode, which is greater than a shortest distance between the respective first anode and the third respective third anode, which is greater than a shortest distance between the respective first anode and the first respective second anode, which is greater than a shortest distance between the respective first anode and the second respective fourth anode. Optionally, a shortest distance between the respective first anode and the first respective second anode is in a range of 3.0 μm to 14.0 μm; a shortest distance between the respective first anode and the first respective fourth anode is in a range of 10.0 μm to 24.0 μm; a shortest distance between the respective first anode and the first respective third anode is in a range of 9.0 μm to 21.0 μm; a shortest distance between the respective first anode and the second respective second anode is in a range of 11.0 μm to 25.0 μm; a shortest distance between the respective first anode and the second respective third anode is in a range of 8.0 μm to 20.0 μm; a shortest distance between the respective first anode and the second respective fourth anode is in a range of 2.5 μm to 7.5 μm; and a shortest distance between the respective first anode and the third respective third anode is in a range of 7.0 μm to 16.0 μm.

In some embodiments, counter-clock wise, a respective fourth anode is adjacent to a respective second anode, a first respective third anode, a first respective first anode, a second respective third anode, and a second respective first anode. Optionally, clock wise, a respective fourth anode is adjacent to a respective second anode, a first respective third anode, a first respective first anode, a second respective third anode, and a second respective first anode. Optionally, a shortest distance between the respective fourth anode and any one of the first respective first anode, the second respective third anode, or the second respective first anode is in a range of 2.0 μm to 25.0 μm. Optionally, a shortest distance between the respective fourth anode and the second respective first anode is greater than a shortest distance between the respective fourth anode and the first respective first anode, and greater than a shortest distance between the respective fourth anode and the second respective third anode. Optionally, a distance between the respective fourth anode and the respective second anode, and along a virtual line passing through co-linear edges respectively from the respective fourth anode and the respective second anode, is in a range of 10.0 μm to 25.0 μm; a shortest distance between the first respective third anode and a virtual line passing through co-linear edges respectively from the respective fourth anode and the respective second anode is in a range of 6.0 μm to 15.0 μm; a shortest distance between a protrusion portion of the first respective first anode that is closest to the respective fourth anode, and the virtual line passing through the co-linear edges respectively from the respective fourth anode and the respective second anode is in a range of 5.0 μm to 16.0 μm; a shortest distance between the respective fourth anode and the first respective first anode is in a range of 2.5 μm to 7.5 μm; a shortest distance between the respective fourth anode and the second respective third anode is in a range of 2.0 μm to 5.0 μm; and a shortest distance between the respective fourth anode and the second respective first anode is in a range of 10.0 μm to 25.0 μm.

In some embodiments, the method further includes forming a first subpixel aperture, a second subpixel aperture, a third subpixel aperture, a fourth subpixel aperture respectively extending through the pixel definition layer. A first light emitting layer of the first light emitting element, a second light emitting layer of the second light emitting element, a third light emitting layer of the third light emitting element, and a fourth light emitting layer of the fourth light emitting element are formed to be respectively connected to a first anode of the first light emitting element, a second anode of the second light emitting element, a third anode of the third light emitting element, and a fourth anode of the fourth light emitting element, respectively through the first subpixel aperture, the second subpixel aperture, the third subpixel aperture, the fourth subpixel aperture. Optionally, a shortest distance between the first via and the first subpixel aperture is in a range of 9.0 μm to 15.0 μm; a shortest distance between the fourth via and the second subpixel aperture is in a range of 2.0 μm to 6.0 μm; a shortest distance between the seventh via and the third subpixel aperture is in a range of 4.5 μm to 10.5 μm; and a shortest distance between the tenth via and the fourth subpixel aperture is in a range of in a range of 2.0 μm to 6.0 μm.

In some embodiments, the orthographic projection of the first anode in the respective first subpixel on the base substrate at least partially overlaps with an orthographic projection of the first capacitor electrode in the respective first subpixel on the base substrate; the orthographic projection of the second anode in the respective second subpixel on the base substrate at least partially overlaps with an orthographic projection of the first capacitor electrode in the respective second subpixel on the base substrate; an orthographic projection of the third anode in a respective third subpixel on the base substrate at least partially overlaps with an orthographic projection of the first capacitor electrode in the respective third subpixel on the base substrate; and an orthographic projection of the fourth anode in a respective fourth subpixel on the base substrate at least partially overlaps with an orthographic projection of the first capacitor electrode in the respective fourth subpixel on the base substrate; the orthographic projection of the first anode in a respective first subpixel on the base substrate at least partially overlaps with an orthographic projection of the second capacitor electrode in the respective first subpixel on the base substrate; an orthographic projection of the second anode in a respective second subpixel on the base substrate at least partially overlaps with an orthographic projection of the second capacitor electrode in the respective second subpixel on the base substrate; an orthographic projection of the third anode in a respective third subpixel on the base substrate at least partially overlaps with an orthographic projection of the second capacitor electrode in the respective third subpixel on the base substrate; and an orthographic projection of the fourth anode in a respective fourth subpixel sp4 on the base substrate at least partially overlaps with an orthographic projection of the second capacitor electrode in the respective fourth subpixel on the base substrate; and the orthographic projection of the first anode in a respective first subpixel on the base substrate at least partially overlaps with an orthographic projection of the active layer of the driving transistor in the respective first subpixel on the base substrate; an orthographic projection of the second anode in a respective second subpixel on the base substrate at least partially overlaps with an orthographic projection of the active layer of the driving transistor in the respective second subpixel on the base substrate; an orthographic projection of the third anode in a respective third subpixel on the base substrate at least partially overlaps with an orthographic projection of the active layer of the driving transistor in the respective third subpixel on the base substrate; and an orthographic projection of the fourth anode in a respective fourth subpixel sp4 on the base substrate at least partially overlaps with an orthographic projection of the active layer of the driving transistor in the respective fourth subpixel on the base substrate.

In some embodiments, the method further includes forming a spacer layer on a side of the pixel definition layer away from the base substrate. Optionally, forming the spacer layer includes forming first spacers arranged in a first array and forming second spacers arranged in a second array, the first array and the second array formed to interlace with each other. Optionally, a respective row of second spacers in the second array is formed between two respective rows of first spacers in the first array; a respective column of second spacers in the second array is formed between two respective columns of first spacers in the first array; a respective row of first spacers in the first array is formed between two respective rows of second spacers in the second array; a respective column of first spacers in the first array is formed between two respective columns of second spacers in the second array; a respective one of the first spacers is formed between a second anode of the second light emitting element and a third anode of the third light emitting element; and a respective one of the second spacers is formed between the third anode and a fourth anode of the fourth light emitting element.

In some embodiments, two adjacent first spacers in the respective row of first spacers are spaced apart by eight subpixels; two adjacent second spacers in the respective row of second spacers are spaced apart by eight subpixels; two adjacent first spacers in the respective column of first spacers are spaced apart by six subpixels; and two adjacent second spacers in the respective column of second spacers are spaced apart by six subpixels.

In some embodiments, the plurality of subpixels are formed to be arranged in an array of a plurality of rows along a first direction and a plurality of columns along a second direction; the respective row of first spacers is along the first direction; the respective row of second spacers is along the first direction; the respective column of first spacers is along the second direction; and the respective column of second spacers is along the second direction.

In some embodiments, the method further includes forming a first light emitting layer on a side of a first anode of the first light emitting element away from the base substrate; forming a second light emitting layer on a side of the second anode away from the base substrate; forming a third light emitting layer on a side of the third anode away from the base substrate; and forming a fourth light emitting layer on a side of the fourth anode away from the base substrate. Optionally, an orthographic projection of the third light emitting layer on the base substrate partially overlaps with an orthographic projection of a respective first spacer on the base substrate; an orthographic projection of the second light emitting layer on the base substrate partially overlaps with the orthographic projection of the respective first spacer on the base substrate; a first edge of the third light emitting layer crossing over the respective first spacer is substantially parallel to a first central line of the respective first spacer; and a second edge of the second light emitting layer crossing over the respective first spacer is substantially parallel to the first central line of the respective first spacer.

In some embodiments, the first edge is spaced apart from the first central line by a first distance along a direction perpendicular to the first central line; the second edge is spaced apart from the first central line by a second distance along the direction perpendicular to the first central line; and an average value of the first distance along the first edge is substantially same as an average value of the second distance along the second edge. Optionally, the first edge substantially overlaps with the first central line. Optionally, the second edge substantially overlaps with the first central line.

In some embodiments, an orthographic projection of the third light emitting layer on the base substrate partially overlaps with an orthographic projection of a respective second spacer on the base substrate; an orthographic projection of the fourth light emitting layer on the base substrate partially overlaps with the orthographic projection of the respective second spacer on the base substrate; a third edge of the third light emitting layer crossing over the respective second spacer is substantially parallel to a second central line of the respective second spacer; and a fourth edge of the fourth light emitting layer crossing over the respective second spacer is substantially parallel to the second central line of the respective second spacer.

In some embodiments, the third edge is spaced apart from the second central line by a third distance along a direction perpendicular to the second central line; the fourth edge is spaced apart from the second central line by a fourth distance along the direction perpendicular to the second central line; and an average value of the third distance along the third edge is substantially same as an average value of the fourth distance along the fourth edge. Optionally, the third edge substantially overlaps with the second central line. Optionally, the fourth edge substantially overlaps with the second central line.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:

a plurality of light emitting elements respectively in a plurality of subpixels; and a plurality of pixel driving circuits respectively in the plurality of subpixels configured to respectively drive the plurality of light emitting elements;

wherein multiple pixel driving circuits of the plurality of pixel driving circuits are arranged along a first direction;

a respective one of the pixel driving circuits comprises a third transistor;

a width, along the first direction, of a third anode of a third light emitting element in a respective third subpixel is no less than a distance, along the first direction, between two adjacent third transistors in two adjacent pixel driving circuits of the multiple pixel driving circuits;

wherein the third anode comprises a main portion, a first protrusion portion, and a second protrusion portion;

wherein the first protrusion portion and the second protrusion portion can be intersected by a virtual straight line extending along the first direction.

2. The array substrate of claim 1, wherein the width, along the first direction of the third anode of the third light emitting element in the respective third subpixel is no less than a minimum distance, along the first direction, between gate electrodes of the two adjacent third transistors in the two adjacent pixel driving circuits.

3. The array substrate of claim 1, wherein a width, along the first direction, of a first anode of a first light emitting element in a respective first subpixel is less than the distance, along the first direction, between the two adjacent third transistors in the two adjacent pixel driving circuits; and a width, along the first direction, of a second anode of a second light emitting element in a respective second subpixel is less than the distance, along the first direction, between the two adjacent third transistors in the two adjacent pixel driving circuits.

4. The array substrate of claim 1, wherein the virtual straight line intersects a main portion of a first anode of a first light emitting element in a respective first subpixel, and intersects a protrusion portion of a fourth anode of a fourth light emitting element in a respective fourth subpixel.

5. The array substrate of claim 1, further comprising a first anode of a first light emitting element adjacent to the third anode in a first direction, the first anode comprising a main portion, and a protrusion portion protruding along the first direction from a side of the main portion toward one side away from an adjacent third anode in the first direction.

6. The array substrate of claim 5, wherein a ratio of a dimension along the first direction of a portion of the first anode having the protrusion portion and a maximum dimension along the first direction of a portion of the first anode not having the protrusion portion and other than a portion wherein the first anode connects to an anode contact pad is in a range of 1.1 to 1.8.

7. The array substrate of claim 5, wherein an orthographic projection of the protrusion portion on a base substrate at least partially overlap with an orthographic projection of a node connecting line on the base substrate, the node connecting line connected to a gate electrode of a driving transistor through a via.

8. The array substrate of claim 1, further comprising a fourth anode of a fourth light emitting element adjacent to the third anode in a first direction, the fourth anode comprising a main portion, and a protrusion portion protruding along a second direction from a side of the main portion away from a portion wherein the fourth anode connects to an anode contact pad.

9. The array substrate of claim 8, wherein a ratio of a dimension along the second direction of the protrusion portion and the maximum dimension along the second direction of the main portion other than the portion wherein the fourth anode connects to an anode contact pad is in a range of 0.2 to 0.9.

10. The array substrate of claim 8, wherein an orthographic projection of the protrusion portion on a base substrate at least partially overlaps with an orthographic projection of a gate electrode of a third transistor on the base substrate.

11. The array substrate of claim 1, wherein the third anode comprises a main portion, a first protrusion portion protruding along a first direction from a side of the main portion toward an adjacent fourth anode, and a second protrusion portion protruding along a first direction from a side of the main portion toward an adjacent first anode.

12. The array substrate of claim 11, wherein a ratio of a dimension along the first direction of a portion of the third anode having the first protrusion portion or the second protrusion portion and a maximum dimension along the first direction of a portion of the third anode not having the first protrusion portion or the second protrusion portion, and other than a portion wherein the third anode connects to an anode contact pad is in a range of 1.2 to 1.8.

13. The array substrate of claim 11, wherein the first protrusion portion and the second protrusion portion are on a same side of a gate line controlling a third transistor.

14. The array substrate of claim 11, wherein an orthographic projection of the first protrusion portion on a base substrate at least partially overlap with an orthographic projection of a gate electrode of one third transistor of the two third transistors on the base substrate, and an orthographic projection of the second protrusion portion on the base substrate at least partially overlap with an orthographic projection of a gate electrode of the other third transistor of the two third transistors on the base substrate.

15. The array substrate of claim 1, wherein the plurality of light emitting elements comprise a first light emitting element in a respective first subpixel, a second light emitting element in a respective second subpixel, a third light emitting element in a respective third subpixel, and a fourth light emitting element in a respective fourth subpixel;

wherein a respective one of the plurality of pixel driving circuits comprises a plurality of transistors, and a storage capacitor comprising a first capacitor electrode, a second capacitor electrode electrically connected to a respective voltage supply line, and an insulating layer between the first capacitor electrode and the second capacitor electrode;

wherein the array substrate comprises:

a base substrate;

a semiconductor material layer on the base substrate; and a node connecting line in a same layer as the respective voltage supply line, connected to the first capacitor electrode through a first main via, and connected to the semiconductor material layer through a second main via;

wherein an orthographic projection of a first anode of the first light emitting element in the respective first subpixel on the base substrate at least partially overlaps with an orthographic projection of a node connecting line in the respective first subpixel on the base substrate;

an orthographic projection of a second anode of the second light emitting element in the respective second subpixel on the base substrate at least partially overlaps with an orthographic projection of the node connecting line in the respective second subpixel on the base substrate;

an orthographic projection of a third anode of the third light emitting element in the respective third subpixel on the base substrate at least partially overlaps with an orthographic projection of the node connecting line in the respective third subpixel on the base substrate; and an orthographic projection of a fourth anode of the fourth light emitting element in the respective fourth subpixel on the base substrate at least partially overlaps with an orthographic projection of the node connecting line in the respective fourth subpixel on the base substrate.

16. A display apparatus, comprising the array substrate of claim 1, and an integrated circuit connected to the array substrate.

17. An array substrate, comprising:

a plurality of light emitting elements respectively in a plurality of subpixels; and a plurality of pixel driving circuits respectively in the plurality of subpixels configured to respectively drive the plurality of light emitting elements;

wherein multiple pixel driving circuits of the plurality of pixel driving circuits are arranged along a first direction;

a respective one of the pixel driving circuits comprises a third transistor;

a width, along the first direction, of a third anode of a third light emitting element in a respective third subpixel is no less than a distance, along the first direction, between two adjacent third transistors in two adjacent pixel driving circuits of the multiple pixel driving circuits;

wherein third transistors respectively in subpixels in a same row are controlled by a same gate line, and having gate electrodes of a substantially same shape; and an orthographic projection of the third anode of the third light emitting element in the respective third subpixel on a base substrate at least partially overlaps with orthographic projections of two third transistors respectively in two adjacent subpixels on the base substrate.

18. The array substrate of claim 17, wherein the orthographic projection of the third anode on the base substrate at least partially overlaps with orthographic projections of active layers or gate electrodes of the two third transistors respectively in two adjacent subpixels on the base substrate.

19. An array substrate, comprising:

a plurality of light emitting elements respectively in a plurality of subpixels; and a plurality of pixel driving circuits respectively in the plurality of subpixels configured to respectively drive the plurality of light emitting elements;

wherein multiple pixel driving circuits of the plurality of pixel driving circuits are arranged along a first direction;

a respective one of the pixel driving circuits comprises a third transistor;

a width, along the first direction, of a third anode of a third light emitting element in a respective third subpixel is no less than a distance, along the first direction, between two adjacent third transistors in two adjacent pixel driving circuits of the multiple pixel driving circuits;

wherein shortest distances between a subpixel aperture and edges of an anode other than an edge wherein the anode connects to an anode contact pad are non-uniform; and wherein a light emitting layer connects to the anode through the subpixel aperture extending through a pixel definition layer.

* * * * *